US012615980B2

(12) United States Patent
Routzahn et al.

(10) Patent No.: US 12,615,980 B2
(45) Date of Patent: Apr. 28, 2026

(54) ETCHING OF INDIUM GALLIUM ZINC OXIDE

(71) Applicant: Lam Research Corporation, Fremont, CA (US)

(72) Inventors: Aaron Lynn Routzahn, Fremont, CA (US); Andreas Fischer, Castro Valley, CA (US); Thorsten Bernd Lill, Kalaheo, HI (US)

(73) Assignee: Lam Research Corporation, Fremont, CA (US)

( * ) Notice: Subject to any disclaimer, the term of this patent is extended or adjusted under 35 U.S.C. 154(b) by 318 days.

(21) Appl. No.: 18/003,257

(22) PCT Filed: Mar. 15, 2022

(86) PCT No.: PCT/US2022/020421
§ 371 (c)(1),
(2) Date: Dec. 23, 2022

(87) PCT Pub. No.: WO2022/197728
PCT Pub. Date: Sep. 22, 2022

(65) Prior Publication Data
US 2023/0274949 A1 Aug. 31, 2023

Related U.S. Application Data

(60) Provisional application No. 63/200,618, filed on Mar. 18, 2021.

(51) Int. Cl.
| | |
|---|---|
| *H01L 21/465* | (2006.01) |
| *H01J 37/32* | (2006.01) |
| *H01L 21/67* | (2006.01) |

(52) U.S. Cl.
CPC ...... *H01L 21/465* (2013.01); *H01J 37/32449* (2013.01); *H01J 37/32724* (2013.01); *H01L 21/67069* (2013.01)

(58) Field of Classification Search
None
See application file for complete search history.

(56) References Cited

U.S. PATENT DOCUMENTS

| | | | |
|---|---|---|---|
| 4,313,782 A | 2/1982 | Sokoloski |
| 4,414,069 A | 11/1983 | Cuomo |

(Continued)

FOREIGN PATENT DOCUMENTS

| | | |
|---|---|---|
| CN | 101631894 A | 1/2010 |
| CN | 102934208 A | 2/2013 |

(Continued)

OTHER PUBLICATIONS

Cano, A.M. et al., "Thermal Atomic Layer Etching of Al$_2$O$_3$ Using Sequential HF and BCl$_3$ Exposures: Evidence for Combined Ligand-Exchange and Conversion Mechanisms", Chemistry of Materials, 2022, vol. 34, No. 14, pp. 6440-6449.

(Continued)

*Primary Examiner* — Shamim Ahmed
(74) *Attorney, Agent, or Firm* — Weaver Austin Villeneuve & Sampson LLP

(57) ABSTRACT

Indium gallium zinc oxide can be etched by providing a wafer having a layer of indium gallium zinc oxide to a processing chamber, heating the wafer to a first temperature, flowing a first chemical species comprising a fluoride to create a layer of indium gallium zinc oxyfluoride, and removing the layer of indium gallium zinc oxyfluoride by flowing a second chemical species comprising an alkyl aluminum halide, an aluminum alkalide, an organoaluminium compound, a diketone, silicon halide, silane, halogenated silane, or alkyl silicon halide.

23 Claims, 16 Drawing Sheets

101

Provide a wafer having a layer of indium gallium zinc oxide ("IGZO") to a processing chamber

103

Heat the wafer to a first temperature

105

Etch the IGZO by modifying a surface of the IGZO with a first chemical species and thereby creating a layer of indium gallium zinc oxyfluoride, and removing the layer of indium gallium zinc oxyfluoride with a second chemical species

(56)  References Cited

U.S. PATENT DOCUMENTS

| | | | |
|---|---|---|---|
| 4,695,327 A | 9/1987 | Grebinski | |
| 4,756,794 A | 7/1988 | Yoder | |
| 5,030,319 A | 7/1991 | Nishino et al. | |
| 5,078,832 A | 1/1992 | Tanaka | |
| 5,234,540 A | 8/1993 | Grant et al. | |
| 5,268,069 A | 12/1993 | Chapple-Sokol et al. | |
| 5,271,800 A | 12/1993 | Koontz et al. | |
| 5,282,925 A | 2/1994 | Jeng et al. | |
| 5,431,772 A | 7/1995 | Babie et al. | |
| 5,439,553 A | 8/1995 | Grant et al. | |
| 5,474,641 A | 12/1995 | Otsuki et al. | |
| 5,482,802 A | 1/1996 | Celler et al. | |
| 5,505,816 A | 4/1996 | Barnes et al. | |
| 5,527,425 A | 6/1996 | Hobson et al. | |
| 5,620,559 A | 4/1997 | Kikuchi | |
| 5,635,102 A | 6/1997 | Mehta | |
| 5,636,320 A | 6/1997 | Yu et al. | |
| 5,766,971 A | 6/1998 | Ahlgren et al. | |
| 5,789,265 A | 8/1998 | Nitta et al. | |
| 5,792,275 A | 8/1998 | Natzle et al. | |
| 5,814,239 A | 9/1998 | Kaneko et al. | |
| 5,838,055 A | 11/1998 | Kleinhenz et al. | |
| 5,858,830 A | 1/1999 | Yoo et al. | |
| 5,876,879 A | 3/1999 | Kleinhenz et al. | |
| 5,880,032 A | 3/1999 | Doi et al. | |
| 5,913,140 A | 6/1999 | Roche et al. | |
| 5,922,624 A | 7/1999 | Verhaverbeke et al. | |
| 5,968,279 A | 10/1999 | MacLeish et al. | |
| 5,976,973 A | 11/1999 | Ohira et al. | |
| 5,990,019 A | 11/1999 | Torek et al. | |
| 5,994,240 A | 11/1999 | Thakur | |
| 6,030,881 A | 2/2000 | Papasouliotis et al. | |
| 6,069,092 A | 5/2000 | Imai et al. | |
| 6,071,815 A | 6/2000 | Kleinhenz et al. | |
| 6,074,951 A | 6/2000 | Kleinhenz et al. | |
| 6,146,970 A | 11/2000 | Witek et al. | |
| 6,204,198 B1 | 3/2001 | Banerjee et al. | |
| 6,265,302 B1 | 7/2001 | Lim et al. | |
| 6,335,261 B1 | 1/2002 | Natzle et al. | |
| 6,483,154 B1 | 11/2002 | Ngo et al. | |
| 6,573,181 B1 | 6/2003 | Srinivas et al. | |
| 6,635,965 B1 | 10/2003 | Lee et al. | |
| 6,652,713 B2 | 11/2003 | Brown et al. | |
| 6,693,050 B1 | 2/2004 | Cui et al. | |
| 6,706,334 B1 | 3/2004 | Kobayashi et al. | |
| 6,716,691 B1 | 4/2004 | Evans et al. | |
| 6,726,805 B2 | 4/2004 | Brown et al. | |
| 6,740,247 B1 | 5/2004 | Han et al. | |
| 6,774,000 B2 | 8/2004 | Natzle et al. | |
| 6,776,874 B2 | 8/2004 | Kobayashi et al. | |
| 6,790,733 B1 | 9/2004 | Natzle et al. | |
| 6,803,309 B2 | 10/2004 | Chou et al. | |
| 6,817,776 B2 | 11/2004 | Colgan et al. | |
| 6,837,968 B2 | 1/2005 | Brown et al. | |
| 6,844,258 B1 | 1/2005 | Fair et al. | |
| 6,852,584 B1 | 2/2005 | Chen et al. | |
| 6,858,532 B2 | 2/2005 | Natzle et al. | |
| 6,905,965 B2 | 6/2005 | Subrahmanyan et al. | |
| 6,926,843 B2 | 8/2005 | Cantell et al. | |
| 6,933,242 B1 | 8/2005 | Srinivasan et al. | |
| 6,949,481 B1 | 9/2005 | Halliyal et al. | |
| 6,951,821 B2 | 10/2005 | Hamelin et al. | |
| 6,967,167 B2 | 11/2005 | Geiss et al. | |
| 6,992,011 B2 | 1/2006 | Nemoto et al. | |
| 7,005,372 B2 | 2/2006 | Levy et al. | |
| 7,029,536 B2 | 4/2006 | Hamelin et al. | |
| 7,033,909 B2 | 4/2006 | Kim et al. | |
| 7,052,941 B2 | 5/2006 | Lee | |
| 7,079,760 B2 | 7/2006 | Hamelin et al. | |
| 7,141,494 B2 | 11/2006 | Lee et al. | |
| 7,163,899 B1 | 1/2007 | Cho et al. | |
| 7,416,989 B1 | 8/2008 | Liu et al. | |
| 7,435,661 B2 | 10/2008 | Miller et al. | |
| 7,589,017 B2 | 9/2009 | Chan et al. | |
| 7,651,922 B2 | 1/2010 | Matsuda | |
| 7,772,114 B2 | 8/2010 | Chan et al. | |
| 7,955,972 B2 | 6/2011 | Chan et al. | |
| 7,977,249 B1 | 7/2011 | Liu et al. | |
| 7,981,763 B1 | 7/2011 | Van Schravendijk et al. | |
| 8,043,972 B1 | 10/2011 | Liu et al. | |
| 8,048,805 B2 | 11/2011 | Chan et al. | |
| 8,058,170 B2 | 11/2011 | Chandrashekar et al. | |
| 8,058,179 B1 | 11/2011 | Draeger et al. | |
| 8,124,505 B1 | 2/2012 | Burnham et al. | |
| 8,124,531 B2 | 2/2012 | Chandrashekar et al. | |
| 8,187,486 B1 | 5/2012 | Liu et al. | |
| 8,551,885 B2 | 10/2013 | Chen et al. | |
| 8,617,348 B1 | 12/2013 | Liu et al. | |
| 8,617,411 B2 | 12/2013 | Singh | |
| 8,808,561 B2 | 8/2014 | Kanarik | |
| 8,883,028 B2 | 11/2014 | Kanarik | |
| 8,993,352 B2 | 3/2015 | Nishimura et al. | |
| 9,230,818 B2 | 1/2016 | Moustakas et al. | |
| 9,362,163 B2 | 6/2016 | Danek et al. | |
| 9,378,970 B2 | 6/2016 | Joubert et al. | |
| 9,425,041 B2 | 8/2016 | Berry, III et al. | |
| 9,431,268 B2 | 8/2016 | Lill et al. | |
| 9,443,701 B2 | 9/2016 | Watanabe | |
| 9,570,317 B2 | 2/2017 | Posseme et al. | |
| 9,570,600 B2 | 2/2017 | Lu et al. | |
| 9,576,811 B2 | 2/2017 | Kanarik et al. | |
| 9,647,206 B2 | 5/2017 | Hashimoto et al. | |
| 9,773,683 B2 | 9/2017 | Gupta et al. | |
| 9,806,252 B2 | 10/2017 | Tan et al. | |
| 9,837,312 B1 | 12/2017 | Tan et al. | |
| 9,991,128 B2 | 6/2018 | Tan et al. | |
| 10,056,264 B2 | 8/2018 | Yang et al. | |
| 10,096,487 B2 | 10/2018 | Yang et al. | |
| 10,381,227 B2 | 8/2019 | George et al. | |
| 10,566,212 B2 | 2/2020 | Kanarik | |
| 10,566,213 B2 | 2/2020 | Kanarik et al. | |
| 10,679,868 B2 | 6/2020 | Berry, III et al. | |
| 10,818,506 B2 | 10/2020 | Kobayashi et al. | |
| 11,239,094 B2 | 2/2022 | Kanarik | |
| 11,380,556 B2 | 7/2022 | Panagopoulos et al. | |
| 11,637,022 B2 | 4/2023 | Berry, III et al. | |
| 11,721,558 B2 | 8/2023 | Kanarik | |
| 11,935,758 B2 | 3/2024 | Yang et al. | |
| 12,280,091 B2 | 4/2025 | Fischer et al. | |
| 2001/0016226 A1 | 8/2001 | Natzle et al. | |
| 2002/0106908 A1 | 8/2002 | Cohen et al. | |
| 2003/0015704 A1 | 1/2003 | Curless | |
| 2003/0029568 A1 | 2/2003 | Brown et al. | |
| 2003/0037879 A1 | 2/2003 | Askarinam et al. | |
| 2003/0047691 A1 | 3/2003 | Musil et al. | |
| 2003/0134038 A1 | 7/2003 | Paranjpe | |
| 2003/0183952 A1 | 10/2003 | Farrar | |
| 2004/0018740 A1 | 1/2004 | Brown et al. | |
| 2004/0083977 A1 | 5/2004 | Brown et al. | |
| 2004/0110354 A1 | 6/2004 | Natzle et al. | |
| 2004/0112885 A1 | 6/2004 | Shigeoka et al. | |
| 2004/0182324 A1 | 9/2004 | Wallace et al. | |
| 2004/0184792 A1 | 9/2004 | Hamelin et al. | |
| 2004/0185670 A1 | 9/2004 | Hamelin et al. | |
| 2004/0200244 A1 | 10/2004 | Hong et al. | |
| 2004/0212035 A1 | 10/2004 | Yeo et al. | |
| 2004/0226814 A1 | 11/2004 | Stewart et al. | |
| 2004/0259367 A1 | 12/2004 | Constantine et al. | |
| 2005/0056370 A1 | 3/2005 | Brown et al. | |
| 2005/0101130 A1 | 5/2005 | Lopatin et al. | |
| 2005/0106877 A1 | 5/2005 | Elers et al. | |
| 2005/0116300 A1 | 6/2005 | Hieda et al. | |
| 2005/0153519 A1 | 7/2005 | Lu et al. | |
| 2005/0205110 A1 | 9/2005 | Kao et al. | |
| 2005/0218113 A1 | 10/2005 | Yue | |
| 2005/0218507 A1 | 10/2005 | Kao et al. | |
| 2005/0221552 A1 | 10/2005 | Kao et al. | |
| 2005/0230350 A1 | 10/2005 | Kao et al. | |
| 2005/0241933 A1 | 11/2005 | Branton et al. | |
| 2005/0266684 A1 | 12/2005 | Lee et al. | |
| 2005/0270895 A1 | 12/2005 | Strang | |
| 2006/0003596 A1 | 1/2006 | Fucsko et al. | |
| 2006/0051959 A1 | 3/2006 | Iwatake et al. | |
| 2006/0051966 A1 | 3/2006 | Or et al. | |

(56) References Cited

U.S. PATENT DOCUMENTS

| | | |
|---|---|---|
| 2006/0115937 A1 | 6/2006 | Barnett et al. |
| 2006/0207968 A1 | 9/2006 | Mumbauer et al. |
| 2006/0270239 A1 | 11/2006 | Triyoso et al. |
| 2007/0063277 A1 | 3/2007 | Belyansky et al. |
| 2007/0082508 A1 | 4/2007 | Chiang et al. |
| 2007/0215975 A1 | 9/2007 | Idani et al. |
| 2008/0038894 A1 | 2/2008 | Rueger et al. |
| 2008/0076263 A1 | 3/2008 | Daycock et al. |
| 2008/0233709 A1 | 9/2008 | Conti et al. |
| 2009/0181553 A1 | 7/2009 | Koelmel et al. |
| 2009/0236693 A1 | 9/2009 | Moustakas et al. |
| 2009/0289263 A1 | 11/2009 | Duong et al. |
| 2009/0308840 A1 | 12/2009 | Kohno et al. |
| 2010/0062602 A1 | 3/2010 | Sakamoto et al. |
| 2010/0291751 A1 | 11/2010 | Lee et al. |
| 2011/0056625 A1 | 3/2011 | Rueger et al. |
| 2011/0109530 A1 | 5/2011 | Nonomura |
| 2011/0139748 A1 | 6/2011 | Donnelly et al. |
| 2011/0151635 A1 | 6/2011 | Liu et al. |
| 2011/0192820 A1 | 8/2011 | Yeom et al. |
| 2011/0244688 A1 | 10/2011 | Ohsawa et al. |
| 2011/0277933 A1 | 11/2011 | Nonomura et al. |
| 2012/0009785 A1 | 1/2012 | Chandrashekar et al. |
| 2012/0211486 A1 | 8/2012 | Kasai et al. |
| 2013/0099277 A1 | 4/2013 | Speck et al. |
| 2013/0149834 A1 | 6/2013 | Liu et al. |
| 2013/0168354 A1 | 7/2013 | Kanarik |
| 2013/0200391 A1 | 8/2013 | Bedair et al. |
| 2013/0313561 A1 | 11/2013 | Suh |
| 2014/0061861 A1 | 3/2014 | Moustakas et al. |
| 2014/0330422 A1 | 11/2014 | Ranish |
| 2014/0335666 A1 | 11/2014 | Koehler et al. |
| 2015/0020971 A1 | 1/2015 | Kanarik |
| 2015/0037972 A1 | 2/2015 | Danek et al. |
| 2015/0118848 A1 | 4/2015 | Draeger et al. |
| 2015/0132961 A1 | 5/2015 | Chang et al. |
| 2015/0162168 A1 | 6/2015 | Oehrlein et al. |
| 2015/0228495 A1 | 8/2015 | Joubert et al. |
| 2015/0270140 A1 | 9/2015 | Gupta et al. |
| 2015/0340593 A1 | 11/2015 | Lu et al. |
| 2016/0013063 A1 | 1/2016 | Ranjan et al. |
| 2016/0035619 A1 | 2/2016 | Yu et al. |
| 2016/0064244 A1 | 3/2016 | Agarwal et al. |
| 2016/0196969 A1 | 7/2016 | Berry, III et al. |
| 2016/0196984 A1 | 7/2016 | Lill et al. |
| 2016/0203995 A1 | 7/2016 | Kanarik et al. |
| 2016/0293437 A1 | 10/2016 | Zhou et al. |
| 2016/0308112 A1 | 10/2016 | Tan et al. |
| 2016/0329221 A1 | 11/2016 | Berry, III et al. |
| 2016/0358782 A1 | 12/2016 | Yang et al. |
| 2016/0379824 A1 | 12/2016 | Wise et al. |
| 2017/0053810 A1 | 2/2017 | Yang et al. |
| 2017/0069462 A1 | 3/2017 | Kanarik et al. |
| 2017/0221781 A1 | 8/2017 | Theisen et al. |
| 2017/0229311 A1 | 8/2017 | Tan et al. |
| 2017/0229314 A1 | 8/2017 | Tan et al. |
| 2017/0243755 A1* | 8/2017 | Tapily ............... H01L 21/67207 |
| 2017/0256416 A1 | 9/2017 | Fischer et al. |
| 2017/0345665 A1 | 11/2017 | Faguet et al. |
| 2017/0365478 A1 | 12/2017 | George et al. |
| 2018/0114700 A1 | 4/2018 | Woo et al. |
| 2018/0138405 A1 | 5/2018 | McKerrow et al. |
| 2018/0174860 A1 | 6/2018 | Kanarik |
| 2018/0182597 A1 | 6/2018 | Blomberg et al. |
| 2018/0342403 A1 | 11/2018 | Anthis et al. |
| 2018/0350624 A1 | 12/2018 | Kanarik et al. |
| 2018/0358548 A1 | 12/2018 | Yang |
| 2019/0044009 A1 | 2/2019 | Yeom et al. |
| 2019/0108982 A1 | 4/2019 | Yang et al. |
| 2019/0122902 A1 | 4/2019 | Ko et al. |
| 2019/0131120 A1 | 5/2019 | Yamaguchi |
| 2019/0131130 A1 | 5/2019 | Smith et al. |
| 2019/0198345 A1 | 6/2019 | Fischer et al. |
| 2019/0267249 A1 | 8/2019 | Clark et al. |
| 2019/0312194 A1 | 10/2019 | Tan et al. |
| 2020/0027740 A1 | 1/2020 | Vervuurt et al. |
| 2020/0035493 A1 | 1/2020 | Clark et al. |
| 2020/0118835 A1 | 4/2020 | Kanarik |
| 2020/0273705 A1* | 8/2020 | Singh .................. H01L 21/0332 |
| 2021/0028266 A1* | 1/2021 | Wu ......................... H10K 71/16 |
| 2021/0104414 A1 | 4/2021 | Panagopoulos et al. |
| 2021/0234097 A1 | 7/2021 | Gotti et al. |
| 2021/0280433 A1 | 9/2021 | Berry, III et al. |
| 2022/0089953 A1 | 3/2022 | Kim et al. |
| 2022/0093413 A1 | 3/2022 | Kanarik |
| 2022/0293431 A1 | 9/2022 | Panagopoulos et al. |
| 2023/0274939 A1 | 8/2023 | Lill et al. |
| 2023/0298904 A1 | 9/2023 | Berry, III et al. |
| 2023/0326761 A1 | 10/2023 | Fischer et al. |
| 2024/0381790 A1 | 11/2024 | Hoang et al. |
| 2025/0125155 A1 | 4/2025 | Fischer et al. |
| 2025/0213650 A1 | 7/2025 | Fischer et al. |

FOREIGN PATENT DOCUMENTS

| | | |
|---|---|---|
| CN | 103117216 A | 5/2013 |
| CN | 103748658 A | 4/2014 |
| CN | 104040021 A | 9/2014 |
| CN | 107146755 A | 9/2017 |
| CN | 110326085 A | 10/2019 |
| EP | 0298879 A1 | 1/1989 |
| JP | 74041461 B | 11/1974 |
| JP | H03263827 A | 11/1991 |
| JP | H04223329 A | 8/1992 |
| JP | H0529266 A | 2/1993 |
| JP | H0590230 A | 4/1993 |
| JP | H05190517 A | 7/1993 |
| JP | H06295889 A | 10/1994 |
| JP | H06326060 A | 11/1994 |
| JP | H07335602 A | 12/1995 |
| JP | H08306671 A | 11/1996 |
| JP | H0917774 A | 1/1997 |
| JP | H09102490 A | 4/1997 |
| JP | 2000063826 A | 2/2000 |
| JP | 2000150489 A | 5/2000 |
| JP | 2006261451 A | 9/2006 |
| JP | 2012529777 A | 11/2012 |
| JP | 2014007432 A | 1/2014 |
| JP | 2016028424 A | 2/2016 |
| JP | 2016208031 A | 12/2016 |
| JP | 2017157836 A | 9/2017 |
| JP | 2020508579 A | 3/2020 |
| KR | 20050074965 A | 7/2005 |
| KR | 20050110751 A | 11/2005 |
| KR | 20060000876 A | 1/2006 |
| KR | 100606532 B1 | 7/2006 |
| KR | 20070029851 A | 3/2007 |
| KR | 20070086312 A | 8/2007 |
| KR | 20080071891 A | 8/2008 |
| KR | 20090053823 A | 5/2009 |
| KR | 100905993 B1 | 7/2009 |
| KR | 100925210 B1 | 11/2009 |
| KR | 20100002130 A | 1/2010 |
| KR | 20100059213 A | 6/2010 |
| KR | 20110092485 A | 8/2011 |
| KR | 20120024544 A | 3/2012 |
| KR | 20130011922 A | 1/2013 |
| KR | 20140051962 A | 5/2014 |
| KR | 20160124689 A | 10/2016 |
| KR | 20170017789 A | 2/2017 |
| KR | 20180045104 A | 5/2018 |
| KR | 20180073459 A | 7/2018 |
| KR | 20200001603 A | 1/2020 |
| KR | 20200053623 A | 5/2020 |
| KR | 20210056240 A | 5/2021 |
| KR | 102303153 B1 | 9/2021 |
| TW | 201027595 A | 7/2010 |
| TW | 201140687 A | 11/2011 |
| TW | I430334 B | 3/2014 |
| TW | 201643958 A | 12/2016 |
| TW | 201705185 A | 2/2017 |
| TW | 201738952 A | 11/2017 |
| TW | 201738954 A | 11/2017 |
| TW | 201801175 A | 1/2018 |

(56)  References Cited

FOREIGN PATENT DOCUMENTS

| TW | 201901795 A | 1/2019 |
| TW | 202011480 A | 3/2020 |
| WO | WO-2004001808 A2 | 12/2003 |
| WO | WO-2004001809 A2 | 12/2003 |
| WO | WO-2006004693 A2 | 1/2006 |
| WO | WO-2010044558 A2 | 4/2010 |
| WO | WO-2011081921 A2 | 7/2011 |
| WO | WO-2017205658 A1 | 11/2017 |
| WO | WO-2019226341 A1 | 11/2019 |
| WO | WO-2020014065 A1 | 1/2020 |
| WO | WO-2021158482 A1 | 8/2021 |
| WO | WO-2021202171 A1 | 10/2021 |
| WO | WO-2022197728 A1 | 9/2022 |

OTHER PUBLICATIONS

CN Office Action dated Jan. 16, 2025 in CN Application No. 201980046595.5, with English Translation.
CN Office Action dated Jun. 17, 2024 in CN Application No. 201980046595.5, with English Translation.
CN Office Action dated Mar. 10, 2023, in Application No. CN201780086828.5 with English translation.
CN Office Action dated Oct. 31, 2023 in CN Application No. CN201780086828.5 with English translation.
International Preliminary Report on Patentability and Written Opinion dated Mar. 21, 2024 in PCT Application No. PCT/US2022/042570.
International Preliminary Report on Patentability and Written Opinion dated Mar. 21, 2024 in PCT Application No. PCT/US2022/075996.
International Preliminary Report on Patentability dated Aug. 17, 2023, in Application No. PCT/US2021/062793.
International Preliminary Report on Patentability dated Mar. 16, 2023 in PCT Application No. PCT/US2021/046878.
International Preliminary Report on Patentability dated Sep. 28, 2023, in PCT Application No. PCT/US2022/020421.
International Search Report and Written Opinion dated Dec. 13, 2021, in PCT Application No. PCT/US2021/046878.
International Search Report and Written Opinion dated Dec. 13, 2022 in PCT Application No. PCT/US2022/042570.
International Search Report and Written Opinion dated Dec. 27, 2023 in PCT Application No. PCT/US2023/031035.
International Search Report and Written Opinion dated Jan. 6, 2023 in PCT Application No. PCT/US2022/075996.
Johnson, N.R. et al., "WO$_3$ and W Thermal Atomic Layer Etching Using "Conversion-Fluorination" and "Oxidation-Conversion-Fluorination" Mechanisms", ACS Applied Materials & Interfaces, 2017, vol. 9, pp. 34435-34447.
JP Office Action dated Aug. 1, 2023, in Application No. JP2021-500614 with English translation.
KR Notice of Allowance dated Feb. 21, 2025 in KR Application No. 10-2017-0014362, with English Translation.
KR Notice of Allowances dated Sep. 5, 2024 in KR Application No. 10-2023-7034721 with English Translation.
KR Office Action dated Apr. 9, 2024 in KR Application No. 10-2021-7003963 with English translation.
KR Office Action dated Apr. 30, 2024 in KR Application No. 10-2017-0014362 with English translation.
KR Office Action dated Aug. 11, 2023, in Application No. KR10-2016-0000420 with English translation.
KR Office Action dated Dec. 6, 2023, in application No. 10-2023-7034721, with English Translation.
KR Office Action dated Dec. 27, 2024 in KR Application No. 10-2021-7003963, with English Translation.
KR Office Action dated Dec. 27, 2024 in KR Application No. 10-2024-0041161, with English Translation.
KR Office Action dated Feb. 28, 2023, in Application No. KR10-2019-7020687 with English translation.

KR Office Action dated Jul. 16, 2023, in application No. KR 10-2016-0104869 with English translation.
KR Office Action dated Jul. 20, 2024 in KR Application No. 10-2024-0056777, with English Translation.
KR Office Action dated Jun. 20, 2023 in Application No. KR10-2022-0059043 with English translation.
KR Office Action dated Mar. 3, 2023, in Application No. KR10-2019-7021389 with English translation.
KR Office Action dated Oct. 25, 2022, in Application No. KR10-2016-0000444 with English translation.
TW Notice of Allowances dated Aug. 23, 2024 in TW Application No. 108123893 with English translation.
TW Office Action dated Apr. 19, 2023 in Application No. TW108123893 with English Translation.
TW Office Action dated Aug. 2, 2024 in TW Application No. 112121365 with English translation.
TW Office Action dated Jul. 26, 2023 in Application No. TW108123893 with English Translation.
U.S. Corrected Notice of Allowance dated Dec. 20, 2024 in U.S. Appl. No. 18/003,246.
U.S. Non-Final Office Action dated Feb. 12, 2025 in U.S. Appl. No. 17/805,081.
U.S. Notice of Allowance dated Apr. 3, 2023 in U.S. Appl. No. 17/457,909.
U.S. Notice of Allowance dated Apr. 10, 2023 in U.S. Appl. No. 17/457,909.
U.S. Notice of Allowance dated Dec. 19, 2024 in U.S. Appl. No. 18/003,246.
U.S. Appl. No. 18/688,739, inventors Fischer A et al., filed on Mar. 1, 2024.
U.S. Appl. No. 19/106,145, inventors Routzahn A.L et al., filed on Feb. 24, 2025.
U.S. Restriction Requirement dated Feb. 6, 2025 in U.S. Appl. No. 18/002,788.
U.S. Restriction Requirement dated Sep. 10, 2024 in U.S. Appl. No. 17/805,081.
Wu, F., et al., "Patterning of Cu Films by a Two-Step Plasma Etching Process at Low Temperature," Journal of The Electrochemical Society, 2010, vol. 157 (4), pp. H474-H478.
Zywotko, D.R. et al., "Thermal Atomic Layer Etching of ZnO by a "Conversion-Etch" Mechanism Using Sequential Exposures of Hydrogen Fluoride and Trimethylaluminum", Chemistry of Materials, 2017, vol. 29, pp. 1183-1191.
Athavale et al. (1995) "Molecular dynamics simulation of atomic layer etching of silicon," J. Vac. Sci. Technol. A, 13(3):966-971.
Byun et al. (2001) "The Effects of Reactive Precleaning (RPC+) on the Formation of Titanium Silicide By PECVD TiCl4—Ti Deposition, and Its Thermal Stability," IEEE, pp. 222-224.
Carver, C.T. et al., "Atomic Layer Etching: An Industry Perspective," ECS Journal of Solid State Science and Technology, vol. 4, No. 6, Feb. 20, 2015, pp. N5005-N5009.
Chang et al. (1997) "Interface Characteristics of Selective Tungsten on Silicon Using a New Pretreatment Technology for ULSI Application," IEEE, pp. 738 743.
Chen et al., "Directional etch of magnetic and noble metals. II. Organic chemical vapor etch" Journal of Vacuum Science & Technology A: Vacuum, Surfaces, and Films, vol. 35, 05C305 (2017) pp. 1-8. doi:10.1116/1.4983830.
Chinese Decision of Final Rejection Action dated Feb. 11, 2019 issued in Application No. CN 201511027151.7.
Chinese Decision of Final Rejection dated Apr. 25, 2019 issued in Application No. CN 201511021815.9.
Chinese First Office Action dated Aug. 28, 2019 issued in Application No. CN 201710066218.0.
Chinese First Office Action dated Dec. 22, 2017 issued in Application No. CN 201511027151.7.
Chinese First Office Action dated Dec. 5, 2017 issued in Application No. CN 201511021815.9.
Chinese First Office Action dated Jan. 9, 2019 issued in Application No. CN 201610694927.9.
Chinese First Office Action dated Jul. 23, 2018 issued in Application No. CN 201610393976.9.

(56) References Cited

OTHER PUBLICATIONS

Chinese Fourth Office Action dated Sep. 27, 2019 issued in Application No. CN 201511021815.9.
Chinese Fourth Office Action dated Sep. 27, 2019 issued in Application No. CN 201511027151.7.
Chinese Fourth Office Action dated Sep. 8, 2020 issued in Application No. CN 201610694927.9.
Chinese Notice of Allowance, dated Nov. 26, 2019 issued in Application No. CN 201511021815.9.
Chinese Reexamination Decision dated Mar. 2, 2021 issued in Application No. CN 201610694927.9.
Chinese Second Office Action dated Apr. 28, 2019 issued in Application No. CN 201610393976.9.
Chinese Second Office Action dated Aug. 16, 2018 issued in Application No. CN 201511027151.7.
Chinese Second Office Action dated Jul. 31, 2018 issued in Application No. CN 201511021815.9.
Chinese Second Office Action dated Jun. 17, 2019 issued in Application No. CN 201610694927.9.
Chinese Third Office Action dated Dec. 20, 2019 issued in Application No. CN 201610694927.9.
Chinese Third Office Action dated Jan. 22, 2019 issued in Application No. CN 201511021815.9.
Chinese Third Office Action dated Sep. 3, 2019 issued in Application No. CN 201610393976.9.
Chinese Third Office Action [Reinstated] dated Jul. 15, 2019 issued in Application No. CN 201511027151.7.
CN Office Action dated Mar. 10, 2023, in Application No. CN201780086828.5.
DeSalvo, G. et al., (1996) "Controlled Digital Etching of GaAs for Precise Gate Recess Formation in MESFET, HEMT and pHEMT Device Fabrication," [http://csmantech.pairserver.com/newsite/gaasmantech/Digests/1996/papers/1996%202.2%20controlled%20digital%20etching%20gaas.pdf], pp. 29-31.
European Extended Search Report dated May 30, 2016 issued in Application No. EP 15200663.1.
Extended European Search Report dated Mar. 14, 2022, in Application No. 19833221.5..
George, et al., "Prospects for Thermal Atomic Layer Etching Using Sequential, Self-Limiting Fluorination and Ligand-Exchange Reactions" ACS Nano (2016) vol. 10, 4889-4894.
Higham, Eric, (2016) "The Compound Semiconductor Industry; How Did It Get Here and Where Is It Going?," SemiCon WEST Jul. 12-14, 2016 [http://www.semiconwest.org/sites/semiconwest.org/files/data15/docs/2_Eric%20Higham_Strategy%20Analytics.pdf], 27pp.
Honda et al. (2005) "Chemical Dry Cleaning Technology for Reliable 65nm CMOS contact to NiSix," IITC, paper 9.4.
International Preliminary Report on Patentability dated Dec. 10, 2020 issued in Application No. PCT/US2019/031165.
International Preliminary Report on Patentability dated Jan. 21, 2021 issued in Application No. PCT/US2019/040490.
International Preliminary Report on Patentability dated Jul. 4, 2019 issued in Application No. PCT/US2017/066470.
International Search Report and Written Opinion dated Apr. 6, 2022, for International Application No. PCT/US2021/062793.
International Search Report and Written Opinion dated Apr. 5, 2018 issued in Application No. PCT/US2017/066470.
International Search Report and Written Opinion dated Aug. 22, 2019 issued in Application No. PCT/US2019/031165.
International Search Report and Written Opinion dated Jul. 4, 2022, in PCT Application No. PCT/US2022/020421.
International Search Report and Written Opinion dated Oct. 31, 2019 issued in Application No. PCT/US2019/040490.
Jang et al. (2002) "Fabrication of MEMS devices by using anhydrous HF gas-phase etching with alcoholic vapor," Journal of Micromechanics and Microengineering, 12:297-306.
Japanese First Office Action dated Jan. 28, 2020 issued in Application No. JP 2015-250922.
JP Office Action dated Jan. 5, 2022, in Application No. JP2019-533041 with English translation.

JP Office Action dated May 31, 2022, in Application No. JP20190533041 with English Translation.
Kanarik et al. (Aug. 2018) "Atomic Layer Etching: Rethinking the Art of Etch" The Journal of Physical Chemistry Letters, vol. 9, pp. 4814-4821. doi:10.1021/acs.jpclett.8b00997.
Kanarik et al. (Mar./Apr. 2015) "Overview of atomic layer etching in the semiconductor industry," J. Vac. Sci. Technol. A, 33(2):020802-1-020802-14.
Kanarik et al. (Nov. 2016) "Tech Brief: All About ALE" [webpage] pp. 1-3. URL:https://blog.lamresearch.com/tech-brief-all-about-ale/.
Kim et al. (2003) "New Contact Cleaning in HF & N2/H2 Microwave Plasma," Solid State Phenomena, 92:239-242.
Kim, Jong Kyu, et al., (Nov./Dec. 2013) "Atomic layer etching removal of damaged layers in a contact hole for low sheet resistance," Journal of Vacuum Science & Technology, 31(6):8.
Korean Decision for Grant dated Jun. 11, 2021 issued in Application No. KR 10-2014-0097663.
Korean First Office Action dated Jan. 13, 2021 issued in Application No. KR 10-2014-0097663.
Korean Office Action dated Apr. 8, 2014, issued in KR 10-2008-0063247.
KR Office Action dated Dec. 7, 2022, in Application No. KR10-2022-0110480 with English translation.
KR Office Action dated Aug. 25, 2022, in Application No. KR10-2019-7020687 with English translation.
KR office action dated Dec. 24, 2021, in application No. KR1020210121005 with English translation.
KR Office Action dated Feb. 15, 2022, in Application No. KR1020160069175 with English translation.
KR Office Action dated Jan. 25, 2023 in Application No. KR10-2022-0059043 with English translation.
KR Office Action dated Jun. 1, 2022, in Application No. KR10-2021-0121005 with English translation.
KR Office Action dated Mar. 3, 2023, in Application No. KR10-2016-0124689.
KR Office action dated Nov. 14, 2021, in KR Application No. KR1020160069175 with English translation.
KR Office Action dated Oct. 25, 2022, in Application No. KR10-2016-0000444.
KR Office Action dated Sep. 13, 2022, in Application No. KR10-2019-7021389 With English Translation.
KR Office Action dated Sep. 28, 2022 in Application No. KR10-2016-0000420 with English translation.
Matsuo et al. (Sep/Oct. 1999) "Silicon etching in NF3/O2 remote microwave plasmas," J. Vac. Sci. Technol. A, 17(5):2431-2437.
Meguro et al. (1990) "Digital etching of GaAs: New approach of dry etching to atomic ordered processing," American Institute of Physics pp. 1552-1554.
Metzler et al., (Mar./Apr. 2014) "Fluorocarbon assisted atomic layer etching of SiO2 using cyclic Ar/C4F8 plasma," Journal of Vacuum Science & Technology A, 32(2):5.
Natzle et al. (2004) "Trimming of hard-masks by Gaseous Chemical Oxide Removal (COR) for Sub-10nm Gates/Fins, for Gate Length Control and for Embedded Logic," 2004 IEEE/SEMI Advanced Semiconductor Manufacturing Conference, pp. 61-65.
Nishino et al. (1993) "Damage-free selective etching of Si native oxides using NH3/NF3 and SF6/H2O down-flow etching," J. Appl. Phys. 74(2):1345-1348.
Oehrlein, Gottlieb S., "Atomic Layer Etching of SiO2: Challenges And Opportunities*," University of Maryland, Atomic Layer Etch and Atomic Layer Clean Technology Workshop, San Francisco, Apr. 21, 2014, 27 pages.
Ogawa et al. (2002) "Dry Cleaning Technology for Removal of Silicon Native Oxide Employing Hot NH3/NF3 Exposure," The Japan Society of Applied Physics, Part I, No. 8, pp. 5349-5358.
Okamura et al. (2004) "Low Damage Via Formation with Low Resistance by NH3 Thermal Reduction for Cu / Ultra Low-k Interconnects," IEEE, pp. 42-44.
Park et al. (1996) "Low Damage In Situ Contact Cleaning Method by a Highly Dense and Directional ECR Plasma," Jpn J. Appl. Phys 35:1097-1101.

(56) References Cited

OTHER PUBLICATIONS

Park et al. (2005) "Atomic Layer Etching of Si(100) and Si(111) Using Cl2 and Ar Neutral Beam," Electrochemical and Solid-State Letters, 8(8) C106-C109.

Phan et al. (2006) "Integrated Clean Process Using NF3/NH3 Remote Plasma for Nickle Silicide Formation," SEMICON Korea STS 2006, pp. 159-163.

Singapore Notice of Allowance and Supplementary Examination Report dated Jul. 1, 2019 issued in Application No. SG 10201600021U.

Singapore Notice of Eligibility for Grant and Supplementary Examination Report SG application No. 10201606891S dated Jan. 9, 2020.

Taguwa et al. (2000) "ICP-Ar/H2 Precleaning and Plasma Damage-Free Ti-PECVD for Sub-Quarter Micron Contact of Logic with Embedded DRAM," Conference Proceedings USLI XV 2000, pp. 589-593.

Taiwan First Office Action dated dated Jun. 27, 2019 issued in Application No. TW 104143047.

Taiwan Notice of Allowance dated Oct. 1, 2019 issued in Application No. TW 104143047.

Taiwanese First Office Action at Re-exam dated May 13, 2021 issued in Application No. TW 105117488.

Taiwanese First Office Action dated Jan. 7, 2020 issued in Application No. TW 105117488.

Taiwanese First Office Action dated Jul. 23, 2020 issued in Application No. TW 106103603.

Taiwanese First Office Action dated Jun. 17, 2021 issued in Application No. TW 106144335.

Taiwanese First Office Action dated Oct. 24, 2017 issued in Application No. TW 103126076.

Taiwanese Second Office Action dated Jun. 23, 2020 issued in Application No. TW 105117488.

Taiwanese Second Office Action dated Oct. 8, 2018 issued in Application No. TW 103126076.

Torek et al. (1995) "Reduced pressure etching of thermal oxides in anhydrous HF/alcoholic gas mixtures" Journal of the Electrochemical Society, vol. 142, No. 4, Apr. 1995, pp. 1322-1326. ISSN:0013-4651.

TW Office Action dated Jan. 14, 2022, in Application No. TW106144335 with English translation.

TW Office Action dated Jul. 25, 2022 In Application No. TW110131208 With English translation.

U.S Advisory Action dated Sep. 14, 2022 in U.S. Appl. No. 17/250,326.

U.S. Corrected Notice of Allowance dated Jan. 5, 2023 in U.S. Appl. No. 17/250,326.

U.S. Advisory Action dated Feb. 11, 2022 in U.S. Appl. No. 17/103,519.

U.S. Final Office Action dated Dec. 2, 2021 in U.S. Appl. No. 17/103,519.

US Final Office Action, dated Dec. 23, 2010, issued in U.S. Appl. No. 12/341,943.

US Final Office Action, dated Jul. 17, 2007, issued in U.S. Appl. No. 11/479,812.

US Final Office Action, dated Jul. 2, 2014, issued in U.S. Appl. No. 13/244,032.

US Final Office Action dated Jul. 9, 2021 issued in U.S. Appl. No. 16/717,385.

US Final Office Action, dated Jun. 26, 2013, issued in U.S. Appl. No. 13/461,080.

US Final Office Action, dated May 21, 2019 issued in U.S. Appl. No. 15/216,257.

U.S. Final office Action dated May 31, 2022 in U.S. Appl. No. 17/250,326.

US Final Office Action, dated May 7, 2008, issued in U.S. Appl. No. 11/479,812.

US Final Office Action, dated Nov. 17, 2011, issued in U.S. Appl. No. 12/002,171.

US Final Office Action dated Sep. 16, 2019 issued in U.S. Appl. No. 15/841,205.

U.S. Non-Final Office Action dated Dec. 29, 2021, in U.S. Appl. No. 17/250,326.

US Notice of Allowance dated Apr. 10, 2018 issued in U.S. Appl. No. 15/173,358.

US Notice of Allowance dated Apr. 25, 2018 issued in U.S. Appl. No. 15/421,189.

US Notice of Allowance, dated Aug. 28, 2013, issued in U.S. Appl. No. 13/461,080.

US Notice of Allowance dated Dec. 2, 2019 issued in U.S. Appl. No. 15/841,205.

US Notice of Allowance dated Dec. 2, 2019 issued in U.S. Appl. No. 16/049,320.

U.S. Notice of Allowance dated Dec. 21, 2022 in U.S. Appl. No. 17/250,326.

U.S. Notice of Allowance dated Dec. 22, 2022 in U.S. Appl. No. 17/457,909.

US Notice of Allowance dated Feb. 10, 2020 issued in U.S. Appl. No. 15/216,257.

US Notice of Allowance, dated Feb. 3, 2012, issued in U.S. Appl. No. 12/002,085.

US Notice of Allowance dated Feb. 5, 2016 issued in U.S. Appl. No. 14/446,203.

US Notice of Allowance dated Jan. 29, 2018 issued in U.S. Appl. No. 15/173,358.

US Notice of Allowance, dated Jul. 1, 2008, issued in U.S. Appl. No. 11/479,812.

US Notice of Allowance, dated Jul. 12, 2016, issued in U.S. Appl. No. 14/590,801.

US Notice of Allowance, dated Jul. 13, 2011, issued in U.S. Appl. No. 12/174,402.

U.S Notice of Allowance dated Mar. 2, 2022, in U.S. Appl. No. 17/103,519.

US Notice of Allowance, dated Mar. 15, 2011, issued in U.S. Appl. No. 12/341,943.

US Notice of Allowance, dated Mar. 7, 2011, issued in U.S. Appl. No. 12/074,912.

US Notice of Allowance dated May 10, 2018 issued in U.S. Appl. No. 15/239,138.

US Notice of Allowance, dated May 2, 2016, issued in U.S. Appl. No. 14/589,610.

US Notice of Allowance, dated Sep. 14, 2011, issued in U.S. Appl. No. 12/343,102.

US Notice of Allowance dated Sep. 22, 2021 issued in U.S. Appl. No. 16/717,385.

US Office Action dated Apr. 10, 2019 issued in U.S. Appl. No. 15/841,205.

US Office Action, dated Apr. 12, 2011, issued in U.S. Appl. No. 12/002,085.

US Office Action, dated Apr. 21, 2011, issued in U.S. Appl. No. 12/343,102.

US Office Action, dated Apr. 9, 2015, issued in U.S. Appl. No. 14/531,483.

US Office Action dated Aug. 25, 2017 issued in U.S. Appl. No. 15/239,138.

US Office Action, dated Dec. 21, 2015, issued in U.S. Appl. No. 14/589,610.

US Office Action, dated Dec. 3, 2018, issued in U.S. Appl. No. 15/216,257.

US Office Action, dated Dec. 30, 2015, issued in U.S. Appl. No. 14/531,483.

US Office Action, dated Dec. 5, 2007, issued in U.S. Appl. No. 11/479,812.

US Office Action, dated Feb. 15, 2011, issued in U.S. Appl. No. 12/174,402.

US Office Action dated Feb. 26, 2021 issued in U.S. Appl. No. 16/717,385.

US Office Action, dated Feb. 3, 2011, issued in U.S. Appl. No. 12/244,241.

US Office Action, dated Jan. 17, 2013, issued in U.S. Appl. No. 13/461,080.

US Office Action, dated Jan. 29, 2010, issued in U.S. Appl. No. 12/144,518.

(56)          References Cited

OTHER PUBLICATIONS

US Office Action dated Jul. 21, 2015 issued in U.S. Appl. No. 14/446,203.

US Office Action, dated Jun. 11, 2010, issued in U.S. Appl. No. 12/341,943.

US Office Action, dated Jun. 14, 2010, issued in U.S. Appl. No. 12/144,518.

US Office Action dated Jun. 4, 2021 issued in U.S. Appl. No. 17/103,519.

US Office Action, dated Jun. 9, 2011, issued in U.S. Appl. No. 12/002,171.

US Office Action, dated Mar. 1, 2016, issued in U.S. Appl. No. 14/590,801.

US Office Action, dated May 2, 2007, issued in U.S. Appl. No. 11/479,812.

US Office Action dated May 23, 2017 issued in U.S. Appl. No. 15/173,358.

US Office Action, dated Nov. 22, 2013, issued in U.S. Appl. No. 13/244,032.

US Office Action dated Nov. 29, 2017 issued in U.S. Appl. No. 15/421,189.

US Office Action, dated Sep. 23, 2019 issued in U.S. Appl. No. 15/216,257.

US Office Action, dated Sep. 30, 2011, issued in U.S. Appl. No. 12/002,085.

US Office Action dated Sep. 6, 2019 issued in U.S. Appl. No. 16/049,320.

U.S. Appl. No. 12/002,171, Inventors Van Schravendijk et al., filed Dec. 14, 2007.

U.S. Appl. No. 12/144,518, Inventors Drewery et al., filed Jun. 23, 2008.

U.S. Appl. No. 12/244,241, Inventors Drewery et al., filed Oct. 2, 2008.

U.S. Appl. No. 13/244,032, Inventors Draeger et al., filed Sep. 23, 2011.

U.S. Appl. No. 18/003,246 inventors Fischer et al., filed Dec. 23, 2022.

Volatier, M., et al., "Extremely high aspect ratio GaAs and GaAs/AlGaAs nanowaveguides fabricated using chlorine ICP etching with N2-promoted passivation," Nanotechnology, vol. 21, Mar. 8, 2010, pp. 1-8. doi:10.1088/0957-4484/21/13/134014.

Wang et al. (1998) "Ultrahigh-selectivity silicon nitride etch process using an inductively coupled plasma source," J. Vac. Sci. Technol. A, 16(3):1582-1587.

Yun et al. (2007) "Large Etch Rate Enhancement by NO-Induced Surface Chemical Reaction during Chemical Dry Etching of Silicon Oxide in F2 Remote Plasmas" Journal of The Electrochemical Society, vol. 154, No. 4, pp. D267-D272.

CN Office Action dated May 29, 2025 in CN Application No. 201980046595.5, with English Translation.

EP Office Action dated Apr. 8, 2025 in EP Application No. 23861113.1.

JP Decision to Grant and Search Report dated Aug. 5, 2025 in JP Application No. 2023-540552, with English translation.

JP Decision to Grant and Search Report dated Mar. 18, 2025 in JP Application No. 2023-513308, with English translation.

KR Decision for Grant and Search Report dated Aug. 23, 2025 in KR Application No. 10-2024-0041161, with English translation.

KR Decision for Grant and Search Report dated Jul. 29, 2025 in KR Application No. 10-2021-7003963, with English translation.

KR Office Action dated Apr. 25, 2025 in KR Application No. 10-2024-0056777, with English Translation.

TW Office Action dated Apr. 14, 2025 in TW Application No. 110146284, with English Translation.

U.S. Corrected Notice of Allowance dated Mar. 27, 2025 in U.S. Appl. No. 18/003,246.

U.S. Final Office Action dated Sep. 5, 2025 in U.S. Appl. No. 17/805,081.

US Non-Final Office Action dated May 2, 2025 in U.S. Appl. No. 18/002,788.

KR Office Action dated Oct. 22, 2025 in KR Application No. 10-2022-7045273, with English Translation.

TW Office Action and Search Report dated Dec. 9, 2025 in TW Application No. 111109787, with English Translation.

U.S. Final Office Action dated Oct. 28, 2025 in U.S. Appl. No. 18/002,788.

* cited by examiner

101

Provide a wafer having a layer of indium gallium zinc oxide ("IGZO") to a processing chamber

103

Heat the wafer to a first temperature

105

Etch the IGZO by modifying a surface of the IGZO with a first chemical species and thereby creating a layer of indium gallium zinc oxyfluoride, and removing the layer of indium gallium zinc oxyfluoride with a second chemical species

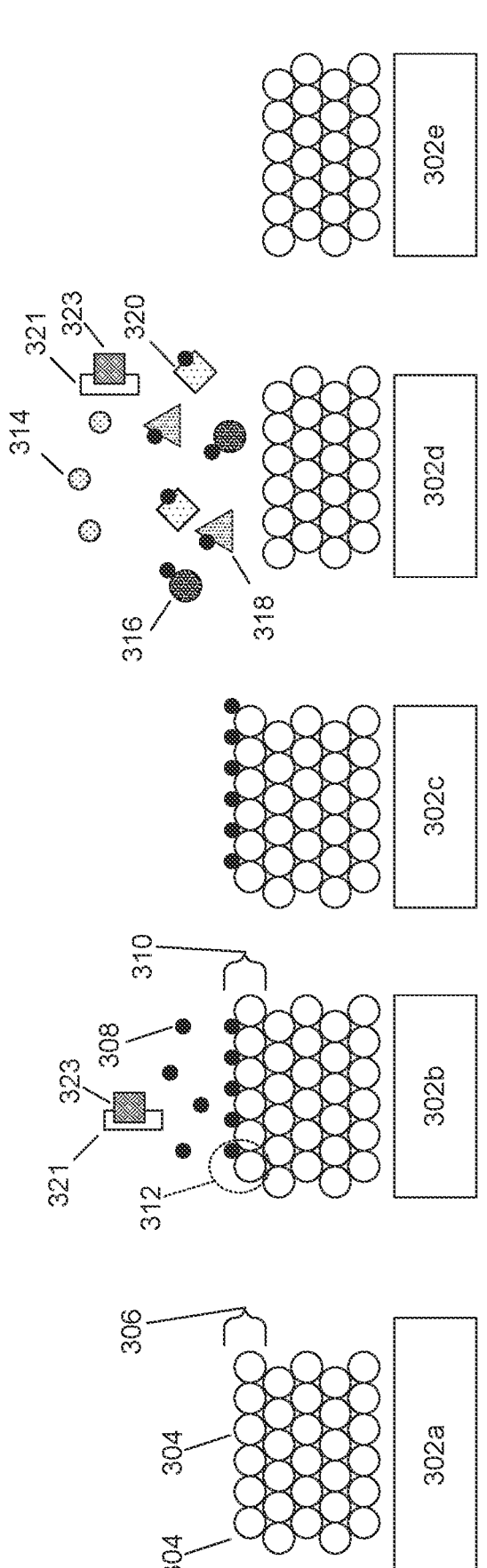
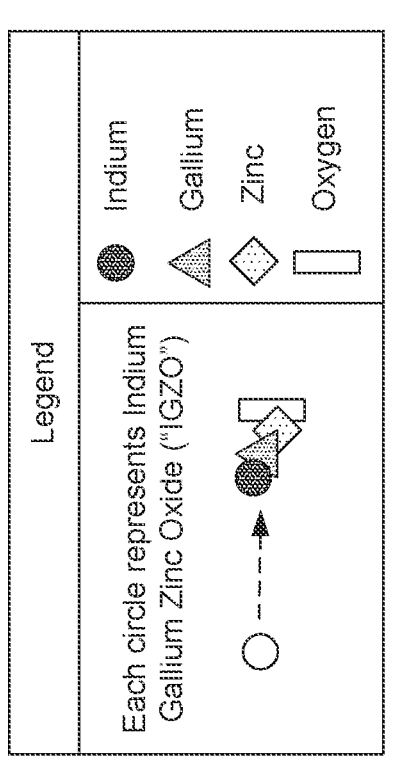
Figure 3

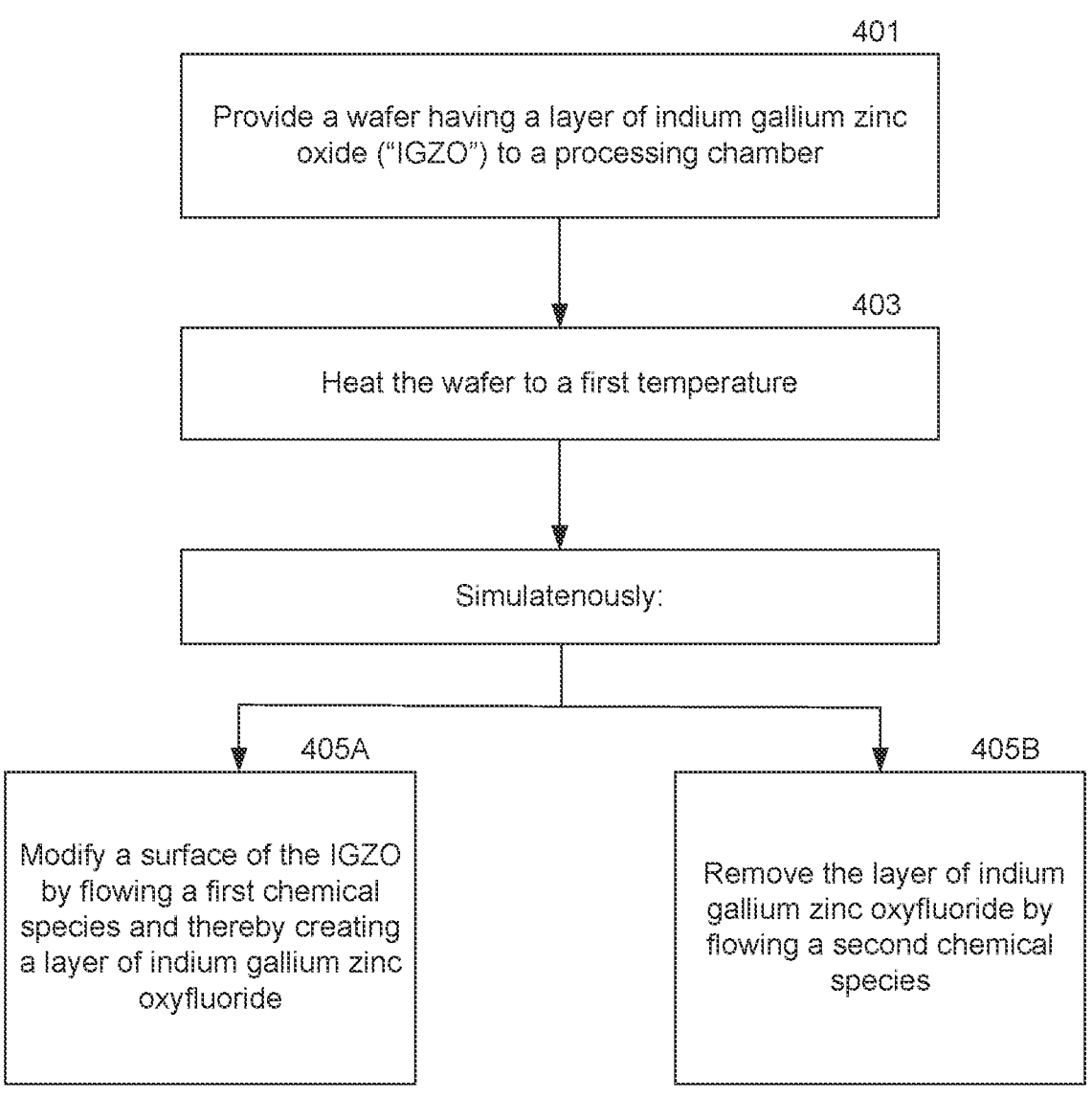

401

Provide a wafer having a layer of indium gallium zinc oxide ("IGZO") to a processing chamber

403

Heat the wafer to a first temperature

Simulatenously:

405A

Modify a surface of the IGZO by flowing a first chemical species and thereby creating a layer of indium gallium zinc oxyfluoride

405B

Remove the layer of indium gallium zinc oxyfluoride by flowing a second chemical species

Figure 4

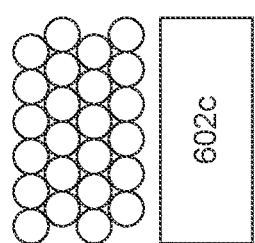
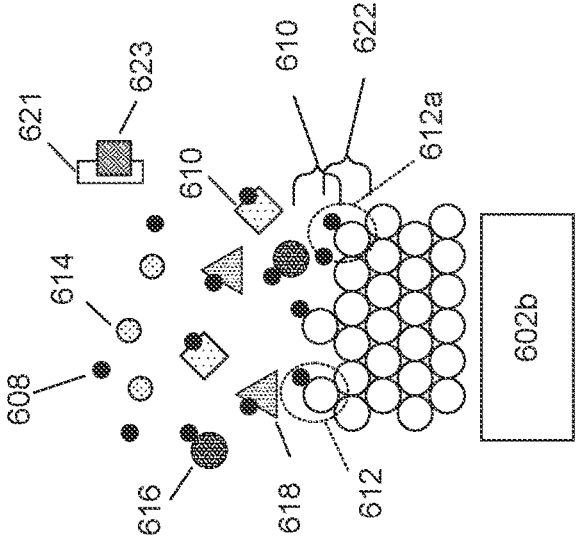
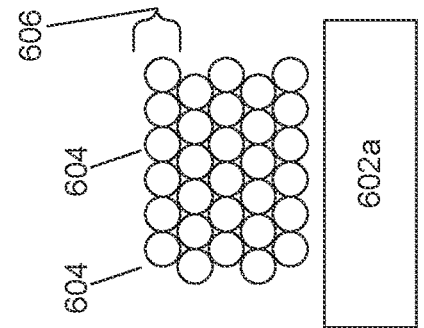
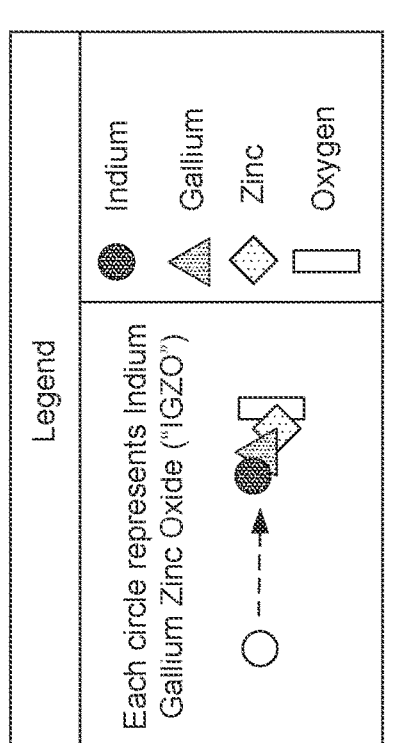
Figure 6

ETCHING OF INDIUM GALLIUM ZINC OXIDE

INCORPORATION BY REFERENCE

A PCT Request Form is filed concurrently with this specification as part of the present application. Each application that the present application claims benefit of or priority to as identified in the concurrently filed PCT Request From is incorporated by reference herein its entirety and for all purposes.

BACKGROUND

Semiconductor fabrication often involves patterning schemes and other processes whereby some materials are selectively etched to prevent etching of other exposed surfaces of a substrate. As device geometries become smaller and smaller, high etch selectivity processes are desirable to achieve effective etching of desired materials without etching of other materials.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

The systems, methods and devices of this disclosure each have several innovative aspects, no single one of which is solely responsible for the desirable attributes disclosed herein. Included among these aspects are at least the following implementations, although further implementations may be set forth in the detailed description or may be evident from the discussion provided herein.

BRIEF DESCRIPTION OF THE DRAWINGS

FIG. 3 depicts an example schematic illustration of atomic layer etching in accordance with disclosed embodiments.

FIG. 4 depicts a third example process flow diagram for performing operations in accordance with disclosed embodiments.

FIG. 6 depicts an example schematic illustration of etching in accordance with disclosed embodiments.

DETAILED DESCRIPTION

Figure 1:
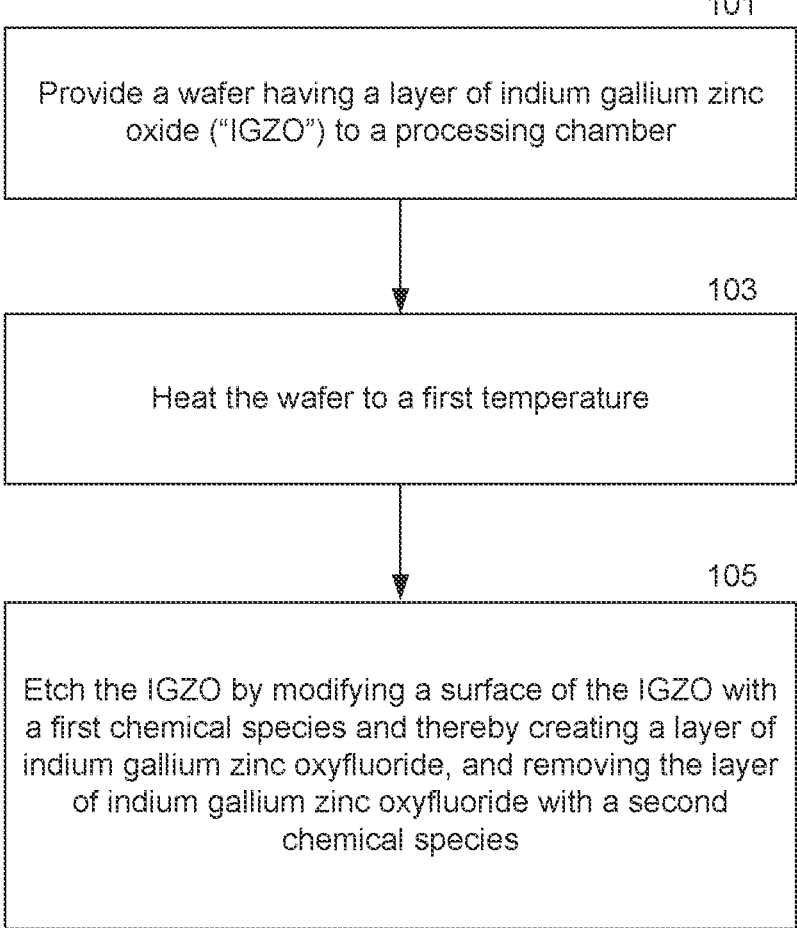
FIG. 1 depicts an example process flow diagram for performing operations in accordance with disclosed embodiments.

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically has a diameter of 200 mm, or 300 mm, or 450 mm. The following detailed description assumes the invention is implemented on a wafer. However, the invention is not so limited. The work piece may be of various shapes, sizes, and materials. In addition to semiconductor wafers, other work pieces that may take advantage of this invention include various articles such as printed circuit boards, magnetic recording media, magnetic recording sensors, mirrors, optical elements, micro-mechanical devices and the like.

Introduction and Context

Semiconductor fabrication processes often involve patterning and etching of various materials, including conductors, semiconductors, and dielectrics. Some examples include conductors, such as metals or carbon; semiconductors, such as silicon or germanium; and dielectrics, such as silicon oxide, aluminum oxide, zirconium dioxide, hafnium dioxide, silicon nitride, and titanium nitride. Atomic layer etching ("ALE") processes remove thin layers of material using sequential self-limiting reactions. Generally, an ALE cycle is the minimum set of operations used to perform an etch process one time, such as etching a monolayer. The result of one ALE cycle is that at least some of a film layer on a substrate surface is etched. Typically, an ALE cycle includes a modification operation to form a reactive layer, followed by a removal operation to remove or etch only this reactive layer. The cycle may include certain ancillary operations such as removing one of the reactants or byproducts, as well as a cleaning operation to remove residues that have built up on surfaces of the processing chamber. Generally, a cycle contains one instance of a unique sequence of operations.

As an example, an ALE cycle may include the following operations: (i) delivery of a first process gas that is a reactant gas, (ii) purging of the reactant gas from the chamber, (iii) delivery of a second process gas that is a removal gas and an optional plasma, and (iv) purging of the chamber. In some embodiments, etching may be performed nonconformally. In some instances, a cleaning operation may be performed after one or more cycles to remove residues that have built up on surfaces of the processing chamber. The modification operation (item (ii) above) generally forms a thin, reactive surface layer with a thickness less than the un-modified material, such as one, two, or three, atomic layers thick, for instance, or less than a whole atomic layer in one cycle.

Some implementations of the etching and/or ALE processes described herein may rely upon chemical reactions in conjunction maintaining the substrate at a particular temperature or temperature range to drive chemical reactions in the modification and/or the removal operations which may be considered "thermal ALE" or "thermal etching". In some embodiments, the thermal ALE may be considered an iso-tropic etch. In some embodiments, one or more layers of the substrate may be modified with chemical adsorption (here-inafter "chemisorption"), not with a plasma, while the substrate is maintained at a first temperature, after which the one or more modified layers of the substrate may be removed with desorption, not with a plasma, while the substrate is at a second temperature. In some embodiments, the first and second temperatures may be the same, while in some other embodiments they may be different than each other. Chemisorption and desorption are temperature depen-dent chemical reactions that may occur in separate tempera-ture regimes, may occur in partially overlapping temperature regimes, or may occur in the same temperature regime. Because of this, some of the thermal ALE techniques described herein maintain the temperature of the substrate at the same, or substantially the same (e.g., within about 10% or 5% of each other), temperature during the modification and removal operations. Some other embodiments modulate the temperature of the substrate between the modification and removal operations in order to enable and utilize chemisorption that occurs at one temperature for the modi-fication operation, and to enable and utilize desorption that occurs at a different temperature for the removal operation.

In some embodiments of thermal ALE, a plasma may be used during the modification operation and not during the removal operation.

In some thermal ALE processes, one or more surface layers of material are modified by chemisorption while the substrate is maintained at a first temperature; this may result in the creation of one or more modified surface layers of the substrate. The substrate includes layers of material and exposed surfaces that may be a uniform layer of material or may be a non-uniform layer that includes different mol-ecules and elements. A first process gas with modifying molecules may be flowed onto the substrate that is main-tained at the first temperature. In some embodiments, the modifying molecules may include a halogen, such as fluo-rine as described below, in order to halogenate exposed molecules on the substrate. The first process gas may also include a carrier gas, such as $N_2$, Ar, He, and Ne. This first temperature allows for chemisorption between the modify-ing molecules and at least some of the molecules in the exposed surface(s) of material.

In some of the embodiments in which the modification and removal operations are performed at different tempera-tures, after the modification operation, the temperature of the substrate may be brought to a second temperature, and an optional purge operation may be performed. This second temperature may be the temperature at which desorption occurs for the one or more modified surface layers. In some embodiments, the second temperature may be greater than the first temperature and the temperature of substrate may be raised from the first temperature to the second temperature. In some other embodiments, the second temperature may be less than the first temperature, and in these embodiments, the temperature of the substrate may be actively cooled from the first temperature to the second temperature. The substrate may be heated using radiant heating, convection heating, solid-to-solid heat transfer, or with a plasma. Additionally, the substrate top, bottom, or both, may be heated. The heating of the substrate may also occur in a non-linear fashion, in some embodiments, and the substrate may be actively cooled in various manners. As noted above, in some embodiments, the second temperature may be the same, or substantially the same (e.g., within about 10% or 5% of each other), as the first temperature such that the modification and removal operations are performed at the same, or substan-tially the same, temperature.

The one or more modified surface layers may be removed while the substrate is maintained at the second temperature. In some embodiments, the second temperature alone may enable and cause desorption of the modified molecules from the substrate thereby removing the modified molecules from the substrate. In some other embodiments, a second process gas with removal molecules may be flowed onto the sub-strate, including onto the exposed surfaces of the substrate. The second process gas may also include a carrier gas as described above. These removal molecules may react with the modified molecules to form a different volatile molecule, which may be considered a volatized molecule. This vola-tized molecule may in turn be removed from the substrate by desorption when the substrate is at the second temperature. In some embodiments, this flowing of the second process gas may be part of the removal operation or may be a separate operation that occurs before, after, or during the heating of the substrate.

In some other ALE processes, ionic energy, such as from a plasma, may be used to drive the modification and/or the removal operations. In an example modification operation, a substrate may be chlorinated by introducing chlorine into the chamber. Chlorine is used as an example etchant species or etching gas, but it will be understood that a different etching gas may be introduced into the chamber. The etching gas may be selected depending on the type and chemistry of the substrate to be etched. A plasma may be ignited and chlorine reacts with the substrate for the etching process; the chlorine may react with the substrate or may be adsorbed onto the surface of the substrate. The species generated from a plasma can be generated directly by forming a plasma in the process chamber housing the substrate or they can be generated remotely in a process chamber that does not house the substrate, and can be supplied into the process chamber housing the substrate.

In some embodiments, ALE may be isotropic and thus non-directional. In some other embodiments ALE is not isotropic when directional ions are used in the etching process, such as during the modification operation.

In some instances, prior to etching, the substrate may include a blanket layer of material, such as silicon or germanium. The substrate may include a patterned mask layer previously deposited and patterned on the substrate. For example, a mask layer may be deposited and patterned on a substrate including a blanket amorphous silicon layer. The layers on the substrate may also be patterned. Substrates may have "features" such as via or contact holes, which may be characterized by one or more of narrow and/or re-entrant openings, constrictions within the feature, and high aspect ratios One example of a feature is a hole or via in a semiconductor substrate or a layer on the substrate. Another example is a trench in a substrate or layer. In various instances, the feature may have an under-layer, such as a barrier layer or adhesion layer. Non-limiting examples of under-layers include dielectric layers and conducting layers, e.g., silicon oxides, silicon nitrides, silicon carbides, metal oxides, metal nitrides, metal carbides, and metal layers. Another example feature may include overhangs or shelves that may require an etch in a location that may not be accessible with directional ions.

Other etching may be performed in which the modifying and removal molecules are at least co-flowed onto the substrate, and thus the modification and removal operations at least partially overlap. One or more process gases containing both modifying molecules and removal molecules may be simultaneously flowed onto the wafer during such processing. In many implementations of this etching, the modifying molecules and the removal molecules have limited to no adverse reaction with each other, such that they may be co-flowed onto the substrate. In some instances, this co-flow may occur for all of the etching while in other instances, the co-flow may only occur for a part of the etching. In some examples having only partially overlapping flows, the modifying molecules may be flowed onto the substrate before the removal molecules are flowed onto the substrate, after which both the modifying molecules and the removal molecules may be simultaneously flowed onto the substrate. In some instances, the flow of both the modifying molecules and the removal molecules may stop at substantially the same time (e.g., within about 10% or 5% of each other) while in other instances, the flow of modifying molecules may stop and the removal molecules may be flowed onto the substrate.

Some semiconductor processes utilize the semiconductor indium gallium zinc oxide (used herein as "IGZO" or "InGaZnO") for various purposes in thin film structures, including as thin film transistors (or TFTs), which requires both depositing the IGZO and removing portions of the deposited IGZO from a wafer, such as removing some of the IGZO from within a trench or via, to create the desired structure. It is desirable to etch the IGZO within desirable nonuniformity tolerances, but without damaging and/or altering the composition of the IGZO material that is intended to remain on the wafer, as well as without adversely affecting other materials on the wafer.

However, removing IGZO from a wafer poses unique and difficult challenges and considerations, and conventional etching is unable to etch IGZO within desirable nonuniformity tolerances without damaging and/or altering the composition of the IGZO material and other materials on the wafer. For example, each element, indium, gallium, and zinc, has a different binding energy of the intermediate product that would detach from the surface, and thus a different removal point at a different energy amount, e.g., temperature, with respect to the various halides that are used to remove each of these IGZO elements. For example, each element, indium, gallium, and zinc, detaches at a different temperature than the other elements. This undesirably results in unequal and uneven removal of IGZO from a wafer, which can increase non-uniformity and decrease material performance, but also results in in-situ residue buildup of the IGZO elements that are removed slower and in smaller amounts. This residue can lead to defects on the wafer, defects on subsequently processed wafers due to particle contamination caused by flaking of the residue, as well as poisoning the etching process and leading to etch stop. Further, this preferential depletion of some IGZO elements can fundamentally change the composition of material remaining on the wafer, and thus fundamentally alter this material's physical properties and attributes different than IGZO.

In addition to these disadvantages, some of the conventional techniques for removing IGZO may also adversely affect the wafer. For example, reactive-ion etching ("RIE") that uses a plasma results in poor etching uniformity as well as unwanted implantation from the plasma that can change the IGZO's composition and diminish its properties. In some such instances, a halogen or hydrogen used in RIE etching of IGZO can be incorporated into the IGZO which undesirably diminishes its properties. The plasma in RIE etching is also directional, not isotropic, thereby limiting its ability to etch in a direction perpendicular to the substrate surface preventing it from etching under shelves or overhangs.

Techniques for Etching Indium Gallium Zinc Oxide

Provided herein are techniques and apparatuses for etching IGZO within desirable nonuniformity tolerances without damaging and/or altering the composition and make-up of the IGZO material and without adversely affecting other materials on the wafer. Some implementations may include isotropic etching of the IGZO, including thermal ALE. Some other implementations may include thermal ALE using plasma during at least some of the modifying operation. The etching described herein performs a modification operation by flowing a first chemical species containing fluorine, such as hydrogen fluoride, onto the wafer to modify the surface of a layer of IGZO and form a modified layer of the IGZO; the first chemical species having the fluoride may be considered the modifying molecules described herein. This modification converts a layer of the IGZO to a layer of indium gallium zinc oxyfluoride (i.e., the modified layer of IGZO) which is reactive to certain chemistries. The modified layer of IGZO, the indium gallium zinc oxyfluoride, is reactive and can be selectively removed by flowing a second chemical species containing an alkyl aluminum halide, silicon halide, silane, halogenated silane, or alkyl silicon halide onto the wafer; the second chemical species may be considered the removal molecules described herein. These alkyl aluminum halide, silicon halide, silane, halogenated silane, or alkyl silicon halide react with the indium gallium zinc oxyfluoride to form volatile molecules that desorb from the wafer. Some embodiments may use a second chemical species that contains an aluminum alkalide, an organoaluminium compound such as dimethylaluminum chloride (DMAC) as well as diethyl-aluminum chloride, trimethyl-aluminum (TMA), or a diketone, such as tin(II) acetylacetonate $(Sn(acac)_2)$, hexafluoroacetylacetone (Hhfac), and acetylacetone (Hacac) for example. Some embodiments may use a second chemical species that contains a silicon halide such as silicon tetrachloride $(SiCl_4)$, a halogenated silane such as dimethyldichlorosilane $(SiCl_2(CH_3)_2)$ or trimethylchlorosilane $(SiCl(CH_3)_3)$, or an alkyl silicon halide such as dichlorosilane $(SiH_2Cl_2)$ or dimethylchlorosilane $(SiHCl(CH_3)_2)$, silanes such as tetramethylsilane $(Si(CH_3)_4)$, or other combinations of Cl, H and $CH_3$ ligands bonded to Si.

FIG. 1 depicts an example process flow diagram for performing operations in accordance with disclosed embodiments. In block 101, a wafer is provided to a processing chamber configured to performing etching of the wafer. The wafer may have a layer of IGZO deposited thereon and in some instances, a surface of the layer of IGZO may be exposed to the processing chamber environment. On the wafer, this IGZO may also be positioned along the sidewalls and/or bottom of a hole, via, or trench, on the underside of shelves or features, and/or on the top surface of a feature. In some such implementations, isotropic thermal ALE is advantageous because it can perform non-directional, non-line-of-sight etching to reach areas with high aspect ratios and areas out of sight, such as under shelves or overhangs.

In block 103, the wafer is heated to a first temperature which may be, as provided herein, considered both a specific temperature, or may be a temperature range. In some embodiments, the first temperature may be between about 20° C. and 500° C., about 20° C. and 150° C., about 20° C. and 100° C., about 20° C. and 80° C., about 200° C. and 600° C., about 200° C. and 500° C., about 200° C. and 350° C., or about 350° C. and 500° C., for example. As discussed in more detail below, the wafer may be maintained at the first temperature during all, or substantially all (e.g., at least 80%, 90%, or 95%), of the etching, of the modification operation, and/or the removal operation.

In block 105, the layer of IGZO on the wafer is etched by modifying a surface of the layer of IGZO by flowing a first chemical species having a fluoride onto the wafer and to create a layer of indium gallium zinc oxyfluoride, and removing the layer of indium gallium zinc oxyfluoride by flowing a second chemical species having an alkyl aluminum halide, silicon halide, halogenated silane, or alkyl silicon halide onto the wafer. Some implementations may have separate modification and removal operations that may, in some instances, be separated by a purge operation. These implementations may be considered self-limited etching. Some other implementations may have at least partially overlapping modification and removal operations which may be performed, in some embodiments, by co-flowing the first species (i.e., the modifying molecules) and the second species (i.e., the removal molecules) onto the wafer.

The first chemical species having a fluoride may include one or more of the following non-limiting examples: a hydrogen fluoride, such as HF, a sulfur fluoride, such as sulfur tetrafluoride or sulfur hexafluoride, a nitrogen fluoride such as nitrogen trifluoride, and a xenon fluoride, such as xenon difluoride. The use of a fluorine species, as opposed to another halogen, for modifying the surface of the layer of IGZO results in a unique reactive compound, indium gallium zinc oxyfluoride, that enables and allows for the removal of all the IGZO's constituents, i.e., indium, gallium, and zinc, when in the presence of the removal molecules, such as the alkyl aluminum halides, silicon halide, silane, halogenated silane, or alkyl silicon halide. The first chemical species may be flowed in vapor form onto the wafer and may be flowed as a part of a process gas that may optionally include a carrier gas such as nitrogen, argon, helium, or neon, for instance.

The second chemical species having the alkyl aluminum halide may include, for instance, dimethylaluminum chloride (DMAC) or other alkyl aluminum halide substituents, such as from an ethyl group. In some embodiments, the second chemical species may also be another class of material, such as a metal precursor including alkyl aluminum halides, an aluminum alkalide, an organoaluminium compound, which includes TMA as well as DMAC and diethyl-aluminum chloride, or a diketone, such as tin(II) acetylacetonate ($Sn(acac)_2$), hexafluoroacetylacetone (Hhfac), and acetylacetone (Hacac) for example. A ketone is a molecule that binds carbon to oxygen via a double bond and a diketone has two of these bonds. In some embodiments, the second chemical species may include silicon halide, halogenated silane, or alkyl silicon halide, which include silicon tetrachloride ($SiCl_4$), dimethyldichlorosilane ($SiCl_2(CH_3)_2$), trimethylchlorosilane ($SiCl(CH_3)_3$), dichlorosilane ($SiH_2Cl_2$), dimethylchlorosilane ($SiHCl(CH_3)_2$), tetramethylsilane ($Si(CH_3)_4$), or other combinations of Cl, H and $CH_3$ ligands bonded to Si, for example. The techniques provided herein may use any of these second chemical species.

Referring back to alkyl aluminum halide embodiments, the alkyl aluminum halide reacts with the indium gallium zinc oxyfluoride to cause each of the metallic elements, the indium, gallium, and zinc, to become volatile and desorb from the wafer. Here, this exchange reaction is energetically favorable and therefore these alkyl aluminum halides are able to form volatile compounds with the indium gallium zinc oxyfluorides through, for example, transfer of a combination of the halide and alkyl groups to form volatile compounds, or through combining to form volatile metal compounds containing a combination of the alkyl alumina halide and the IGZO-fluoride. The oxygen may be removed during the modification, removal, or both. The second chemical species may also be flowed in vapor form onto the wafer and may be flowed as a part of a process gas that may be optionally include a carrier gas such as nitrogen, argon, helium, or neon, for instance.

In some embodiments, the etching of block 105 may be performed under various process conditions that enable such etching. In addition to the temperature ranges provided above, some implementations may maintain the substrate at a temperature between about 150° C. and about 400° C. during the etching. The etching may also be performed while the processing chamber is maintained at a pressure of between about 20 millitorr (mTorr) and 760 Torr (1 atm), including between about 20 mTorr and 600 mTorr, about 30 mTorr and 500 mTorr, and about 40 mTorr and 400 mTorr, as well as between about 3 Torr and 8 Torr, and about 4 Torr and 8 Torr, 2 Torr and 10 Torr, and 100 Torr and 760 Torr, for example. As discussed in more detail below, some implementations perform the etching of block 105 at substantially constant process conditions (e.g., with minor deviations, such as deviations of about 10% or 5% of the set conditions), while other implementations may vary one or more of the process conditions during the etching.

Figure 2:
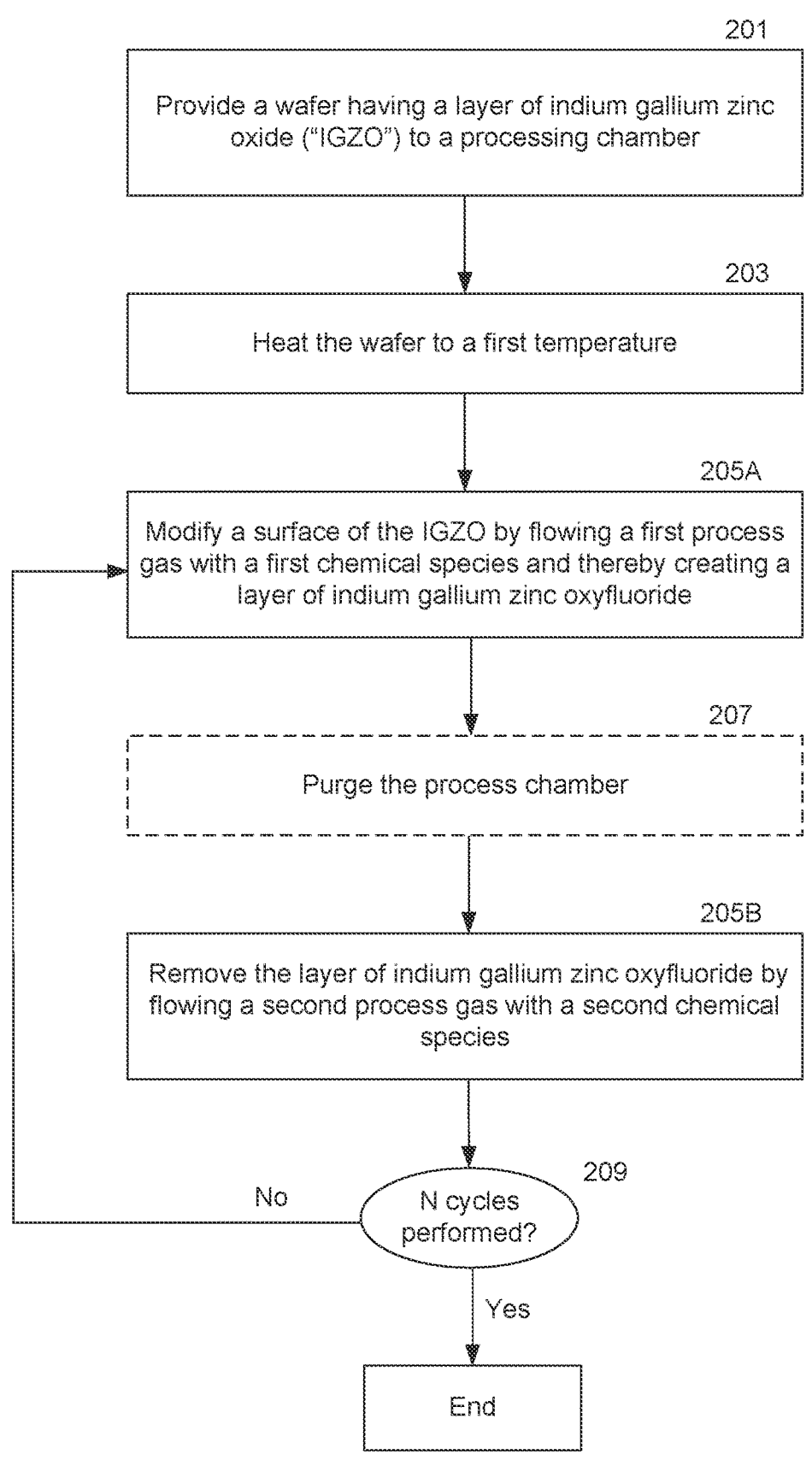
FIG. 2 depicts a second example process flow diagram for performing operations in accordance with disclosed embodiments.

Some implementations may etch IGZO using separate modification and removal operations. FIG. 2 depicts a second example process flow diagram for performing operations in accordance with disclosed embodiments. Here, block 201 and 203 are the same as blocks 101 and 103 in FIG. 1. In FIG. 2, the modification and removal operations of block 105 are performed as separate operations, blocks 205A and 205B, respectively. This may be considered self-limited etching as well as ALE or thermal ALE.

Following block 203, a surface of the layer of IGZO is modified in block 205A, i.e., this block represents the modification operation. The layer of IGZO is modified as described above with respect to block 105 of FIG. 1, except that here, block 205A includes flowing a first process gas that includes the first chemical species having a fluoride onto the wafer. As with block 105, flowing the first chemical species onto the wafer modifies the surface of the layer of IGZO and creates a layer of indium gallium zinc oxyfluoride that is capable of being removed by exposure to and reactions with the second chemical, e.g., the alkyl aluminum halide, silicon halides, silanes, halogenated silanes, and alkyl silicon halides. This first chemical species in the first process gas may be any of those provided herein, including one or more of the following non-limiting examples: a hydrogen fluoride, such as HF, a sulfur fluoride, such as sulfur tetrafluoride or sulfur hexafluoride, a nitrogen fluoride such as nitrogen trifluoride, and a xenon fluoride, such as xenon difluoride. The first process gas may also be flowed in vapor form onto the wafer and may be optionally include a carrier gas such as nitrogen, argon, helium, or neon, for instance. The modification operation of block 205A may be stopped by stopping the flow of the first process gas to the wafer.

In some embodiments, an activation energy may be provided to assist with overcoming the activation barrier for the modifying molecule to adsorb on the wafer. This activation energy may be provided with thermal energy, radical energy, and/or UV photons, in some instances, which may include heating the wafer and/or generating a plasma or photons. This adsorption of the modifying molecule onto the first material may be considered chemical adsorption or "chemisorption" which is an energy dependent (e.g., a temperature dependent) chemical reaction. For some thermal ALE techniques, this chemisorption during the modification operation may only occur at a particular temperature range that enables the activation barrier of the molecules in the layer of material and the incoming modifying molecules to be overcome which allows for dissociation and chemical bonding between these molecules and an adsorbate in the modifying molecule. Outside of this temperature range, the chemisorption may not occur, or may occur at undesirable (e.g., slow) rates.

Accordingly, some implementations of block 205A modify the surface layer of IGZO using only thermal activation energy, not a plasma. The first process gas is flowed onto the wafer that is maintained at the first temperature which provides the activation energy, and the IGZO is modified by chemisorption to from the modified layer of IGZO, the reactive indium gallium zinc oxyfluoride. The first temperature may be any temperature or temperature range provided herein, such as between about 20° C. and 500° C., about 20° C. and 150° C., about 20° C. and 100° C., about 20° C. and 80° C., about 100° C. and 500° C., about 100° C. and 450° C., about 150° C. and 500° C., about 150° C. and 450° C., or about 150° C. and 400° C., for example. Additionally, the wafer may be maintained at the first temperature during all, or substantially all (e.g., at least 80%, 90%, or 95%), of the modification operation. The duration of the modification operation may be the duration for which modification of substantially all (e.g., at least 80%, 90%, or 95%) of desired exposed molecules on the substrate occurs. This may range from about 0.5 seconds to about 600 seconds, about 0.5 seconds to about 400 seconds, about 0.5 seconds to about 300 seconds, about 0.5 seconds to about 10 seconds, about 0.5 seconds to about 5 seconds, about 1 second to about 5 seconds, or about 5 seconds to about 300 seconds, for example.

In some implementations, ionic energy, such as from a plasma, may be used to drive the modification operation of block 205A. In some instances, a plasma may be ignited and a fluorine may react with the wafer or may be adsorbed onto the surface of the wafer. The species generated from a plasma can be generated directly by forming a plasma in the process chamber housing the wafer or they can be generated remotely in a process chamber that does not house the wafer, and can be supplied into the process chamber housing the wafer.

After the modification operation of block 205A, the indium gallium zinc oxyfluoride is removed from the wafer in block 205B. This removal is performed as described above with respect to block 105 of FIG. 1, expect that here, block 205B includes flowing a second process gas that includes the second chemical species having an alkyl aluminum halide, silicon halide, halogenated silane, or alkyl silicon halide onto the wafer. As with block 105, the second species reacts with the indium gallium zinc oxyfluoride and causes at least the metallic constituents, the indium, gallium, and zinc to desorb from, and thus be removed from, the wafer. This second chemical species in the second process gas may be any of those provided herein, such as DMAC, TMA, another organoaluminium compound, diethyl-aluminum chloride, other alkyl aluminum halide substituents, such as from an ethyl group, or other metal precursor. In some embodiments, the second chemical species in the second process gas may be any of those provided herein, such as silicon tetrachloride ($SiCl_4$), dimethyldichlorosilane ($SiCl_2(CH_3)_2$), trimethylchlorosilane ($SiCl(CH_3)_3$), dichlorosilane ($SiH_2Cl_2$), dimethylchlorosilane ($SiHCl(CH_3)_2$), tetramethylsilane ($Si(CH_3)_4$), or other combinations of Cl, H and $CH_3$ ligands bonded to Si. The second process gas may also include a carrier gas such as nitrogen, argon, helium, or neon, for instance. The removal operation of block 205B may be stopped by stopping the flow of the second process gas to the wafer.

For desorption, a particular temperature range may enable the activation barrier of the modified molecule to be overcome which allows for the release of the modified layer from the wafer. In some examples, the temperature ranges at which chemisorption and desorption occur do not overlap while in others they may partially or fully overlap. Accordingly, in order to remove a molecule from a wafer using chemisorption and desorption, some implementations may maintain the wafer at the same, or substantially same (e.g., within about 10% or 5% of each other), temperature during the removal and modification operations. In order to remove a molecule from a wafer using chemisorption and desorption that occur in different temperature regimes, the modification operation of block 205A may occur in the first temperature range and the removal operation of block 205B may occur in the second different temperature range which may be higher or lower than the first temperature. Some such embodiments may perform multiple cycles to remove multiple layers of material by maintaining the wafer at the same, or substantially the same, temperature during the removal and modification operations, while other embodiments may repeatedly heat and cool the wafer between the two temperature regimes for chemisorption and desorption.

In some of the embodiments that use different temperature regimes, during or before block 205B, the temperature of the wafer may be brought to a second temperature that is different than the first temperature at which the wafer is maintained during the modification operation of block 205A. In some other embodiments, the second temperature is the same, or substantially the same (e.g., within about 10% or 5% of each other), temperature as the first temperature. This second temperature may be the temperature at which desorption occurs for the one or more modified surface layers. In some embodiments, the second temperature may be greater than the first temperature, and in these embodiments, block 205B may include heating the wafer from the first temperature to the second temperature. In some other embodiments, the second temperature may be less than the first temperature, and in these embodiments, the wafer may be actively cooled from the first temperature to the second temperature. The wafer may be heated using radiant heating, convection heating, solid-to-solid heat transfer, or with a plasma. Additionally, the wafer top, bottom, or both, may be heated. The heating of the wafer may also occur in a non-linear fashion, in some embodiments, as discussed further below. As also described below, the wafer may be actively cooled in various manners. In some instances, a wafer may be heated to two different temperatures by positioning the wafer onto two separate substrate supports, such as heated pedestals, that are each maintained at a different temperature than each other. The wafer may therefore be heated to two different temperatures by being transferred between and placed at these two different substrate supports.

In block 205B, the one or more modified surface layers may be removed while the wafer is maintained at the second temperature. In some embodiments, the second temperature alone may enable and cause desorption of the modified molecules from the wafer thereby removing the modified molecules from the wafer. In some other embodiments, a second process gas with removal molecules may be flowed onto the wafer, including onto the exposed surfaces of the wafer. The second process gas may also include a carrier gas as described above. These removal molecules may react with the modified molecules to form a different volatile molecule, e.g., a volatized molecule. This volatized molecule may in turn be removed from the wafer by desorption when the wafer is at the second temperature.

In some embodiments, the second temperature may be between about 20° C. and 500° C., about 20° C. and 150° C., about 20° C. and 100° C., about 20° C. and 80° C., about 100° C. and 500° C., about 100° C. and 450° C., about 150° C. and 500° C., about 150° C. and 450° C., or about 150° C. and 400° C., for example. Additionally, the wafer may be maintained at the temperature during all, or substantially all (e.g., at least 80%, 90%, or 95%), of the removal operation. The duration of the removal operation may be the duration for which desorption of substantially all (e.g., at least 80%, 90%, or 95%) of desired molecules on the wafer occurs. This may range from about 0.5 seconds to about 600 seconds, about 0.5 seconds to about 400 seconds, about 0.5 seconds to about 300 seconds, about 0.5 seconds to about 10 seconds, about 0.5 seconds to about 5 seconds, about 1 second to about 5 seconds, or about 5 seconds to about 300 seconds, for example.

The performance of blocks 205A and 205B may be considered a single ALE cycle. In some implementations, these blocks 205A and 205B may be repeated in order to perform multiple cycles and remove an atomic mono-layer as well as multiple layers of the IGZO. Some embodiments remove a fraction of a mono-layer in one cycle as some etch rates may be lower than the lattice constant of the material that is being etched. This may include performing, for example, about 1 to about 1,000 cycles, about 1 to about 500 cycles, about 1 to about 100 cycles, about 1 cycle to about 30 cycles, or about 1 to about 20 cycles. Any suitable number of ALE cycles may be included to etch a desired amount of IGZO film. In some embodiments, ALE is performed in cycles to etch about 1 Angstroms (Å) to about 50 Å of the surface of the layers on the wafer. In some embodiments, cycles of ALE etch between about 2 Å and about 50 Å of the surface of the layers on the wafer. In some embodiments, each ALE cycle may etch at least about 0.1 Å, 0.5 Å, 1 Å, 2 Å, or 3 Å. As further illustrated in FIG. 2, blocks 205A and 205B, and in some implementations an optional purge of block 207, may be repeated for N ALE, or etching, cycles. Once the decision step 209 determines that the N ALE cycles have been performed, the etching may be finished and thus it may end.

In some operations, an optional purge operation of block 207 may be performed after the modification operation of block 205A and before the removal operation of block 205B.

In a purge operation, non-surface-bound active modifying molecules, such as the fluorine species, and/or other residue or particulates, may be removed from the process chamber, the chamber walls, the chamber gas volume, and/or the substrate. This can be done by purging and/or evacuating the process chamber to remove the active species or other elements, without removing the adsorbed layer. The species generated in a plasma can be removed by stopping the plasma and allowing the remaining species to decay, optionally combined with purging and/or evacuation of the chamber. Purging can be done using any inert gas such as $N_2$, Ar, Ne, He and their combinations. Purging may also be done after any operation, block, or step provided herein, including after a modification operation, after a removal operation, or both. Since the purging is optional, some implementations may not have any purging.

Some implementations vary the process conditions of the modifying and removal operations of blocks 205A and 205B, respectively, such as the duration, temperatures, and pressures of each operation. In some embodiments, blocks 205A and 205B may be performed for substantially the same about of time (e.g., within about 10% or 5% of each other), while in other embodiments they may be performed for different times. For example, block 205A may be performed for a time period shorter or longer than block 205B. The various time periods of each block may range, from about 0.5 seconds to about 600 seconds, about 0.5 seconds to about 400 seconds, about 0.5 seconds to about 300 seconds, about 0.5 seconds to about 10 seconds, about 0.5 seconds to about 5 seconds, about 1 second to about 5 seconds, or about 5 seconds to about 300 seconds, for example.

In some implementations, the modification operation of block 205A and the removal operation of block 205B may be performed at different pressures. For example, the modification operation of block 205A may be performed at a first pressure, or first pressure range, and the removal operation of block 205B may be performed at a second pressure, or second pressure range, different than the modification operation of block 205A. Although not depicted in FIG. 2, some implementations may include a pressure adjustment operation that changes the pressure from the first pressure to the second pressure. This pressure adjustment may occur in between blocks 205A and 205B, for example. Similar to above, the first and second pressures may be, for instance, between about 20 millitorr (mTorr) and 760 Torr (1 atm), including between about 20 mTorr and 600 mTorr, about 30 mTorr and 500 mTorr, and about 40 mTorr and 400 mTorr, as well as between about 3 Torr and 8 Torr, and about 4 Torr and 8 Torr, 2 Torr and 10 Torr, and 100 Torr and 760 Torr, for example. In some other embodiments, both the modification operation of block 205A and the removal operation of block 205B may be performed at the substantially same pressure (e.g., within about 10% or 5% of each other), such as any pressure or pressure range described herein.

Some implementations of the described etching are further explained with FIG. 3 which depicts an example schematic illustration of atomic layer etching in accordance with disclosed embodiments. In diagrams 302*a*-302*e* a single layer of IGZO material is etched from a wafer. In 302*a*, the wafer is provided and it has one or more layers of IGZO, with each IGZO molecule represented as unshaded circles. As further noted in the legend of FIG. 3, each unshaded circle represents a single IGZO molecule that includes indium, represented by the shaded circle and identifier 316 in diagram 302*d*, gallium, represented by the shaded triangle and identifier 318 in diagram 302*d*, zinc, represented by the shaded diamond and identifier 320 in diagram 302*d*, and oxygen, represented by the unshaded rectangle and identifier 321 in diagram 302d. The top layer of the IGZO may be considered a surface layer 306.

In 302b, a first process gas with modifying molecules 308 (the solid black circles, some of which are identified with identifier 308) is introduced to the wafer which modifies the IGZO surface layer 306 to form indium gallium zinc oxyfluoride. The schematic in 302b shows that some of the modifying molecules 308 are adsorbed onto the IGZO molecules 304 of the surface layer 306 to create a modified surface layer 310 that includes modified molecules 312 (one modified molecule 312 is identified inside a dotted ellipse in 302b), e.g., the indium gallium zinc oxyfluoride. As stated above, the modifying molecules 308 may be a species having a fluorine, such as hydrogen fluoride. In some instances, the oxygen of the IGZO may be removed from the wafer during the modification operation by binding with the hydrogen originating from the modifying molecules that contain a hydrogen, such as hydrogen fluoride, as indicated by the oxygen rectangle 321 bonded with a hydrogen molecule 323 (a shaded square) that are being removed from the wafer in schematic 302b. For some thermal ALE techniques, this diagram 302b may occur while the wafer is maintained at the first temperature as described above, e.g., that enables chemisorption of the modifying molecule on the surface of the IGZO material. In some other implementations, this modification operation may be plasma assisted.

In 302c, after the modified molecules 312 (e.g., the indium gallium zinc oxyfluoride) and the modified surface layer 310 have been created in 302b, the first process gas may be optionally purged from the chamber, as described above and represented in block 207 in FIG. 2.

In 302d, removal molecules 314 are introduced into the process chamber and in some embodiments, this may occur by flowing a second process gas having the second species, i.e., having the removal molecules 314, onto the wafer and the second species may include an alkyl aluminum halide, an aluminum alkalide, an organoaluminium compound such as DMAC as well as diethyl-aluminum chloride, TMA, or a diketone, such as $Sn(acac)_2$, Hhfac, and Hacac, silicon halide, halogenated silane, or alkyl silicon halide such as silicon tetrachloride ($SiCl_4$), dimethyldichlorosilane ($SiCl_2(CH_3)_2$), trimethylchlorosilane ($SiCl(CH_3)_3$), dichlorosilane ($SiH_2Cl_2$), dimethylchlorosilane ($SiHCl(CH_3)_2$), tetramethylsilane ($Si(CH_3)_4$), or combinations of Cl, H and $CH_3$ ligands bonded to Si for example. Schematic 302d further illustrates that each of IGZO's metallic constituents are caused to desorb from, and thus be removed from, the wafer. The indium 316, the gallium 318, and the zinc 320 are seen desorbing from the wafer in response to the removal molecules 314, e.g., the second species having an alkyl aluminum halide, silicon halide, silane, halogenated silane, or alkyl silicon halide, flowing onto the wafer and reacting with the modified layer 310 of IGZO, e.g., the indium gallium zinc oxyfluoride 312. In some instances, some of the oxygen of the IGZO may desorb from the wafer during the removal operation, as indicated by the oxygen rectangle 321, after it is bonded with the hydrogen originating from the modifying molecules that contain a hydrogen, such as hydrogen fluoride, in the modifying operation, as indicated by the oxygen rectangle 321 bonded with the hydrogen molecule 323 (a shaded square) that are being removed from the wafer in schematic 302d.

In some thermal ALE embodiments, this removal operation may be performed at a second temperature where desorption of the modified molecules 312 of the modified surface layer 310 from the wafer occurs; no plasma may be utilized in some of these removal operations. In some embodiments, the second temperature is the same, or substantially the same (e.g., within about 10% or 5% of each other), as the first temperature. In other embodiments, the first and second temperatures may be different than each other and, in these embodiments, the temperature may be changed from the first temperature to the second temperature by either heating or cooling the substrate. In some instances, the temperature in one or more of the operations may be ramped up.

In 302e, the modified molecules 312, and therefore the modified surface layer 310, have been removed from the wafer.

As noted above, some implementations may have at least partially overlapping flows of the modifying species and the removal species, such as overlapping flows of HF and DMAC, for instance. FIG. 4 depicts a third example process flow diagram for performing operations in accordance with disclosed embodiments. Here, block 401 and 403 are the same as blocks 101 and 103 in FIG. 1. In FIG. 4, at least a portion of the modification and removal operations of block 105 are performed simultaneously as seen with blocks 405A and 405B occurring at the same time. The modification operation of block 405A and the removal operation of block 405B may be the same as described herein above, except for the noted differences, including the timing and overlapping of the first and second species flows onto the wafer. For example, the first species of block 405A has the fluoride which flows onto the surface of the layer of IGZO and modifies the IGZO surface to create a modified surface layer, such as the indium gallium zinc oxyfluoride. Additionally, the second species of block 405B has the alkyl aluminum halide, silicon halide, halogenated silane, and alkyl silicon halide that reacts with the modified surface layer of the IGZO to remove it from the wafer. Other process conditions and implementations are described below. Each process gas may also include a carrier gas as provided above.

In some embodiments, the modification operation of block 405A and the removal operation of block 405B overlap for only some of the etching. In other embodiments, these blocks 405A and 405B overlap for substantially all of the etching (e.g., within about 10% or 5% of each other); some of these implementations have the first and the second chemical species in the same process gas flowed onto the wafer, and some other implementations have these species in separate process gases that are co-flowed or simultaneously flowed onto the wafer.

Figure 5A:
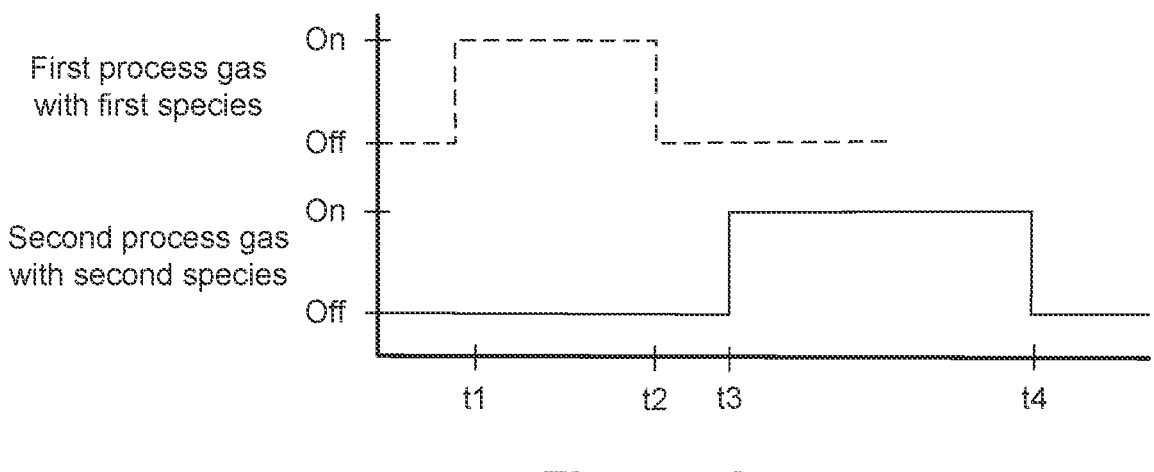
FIGS. 5A through 5C depict example gas flow sequences according to various embodiments.
Figure 5B:
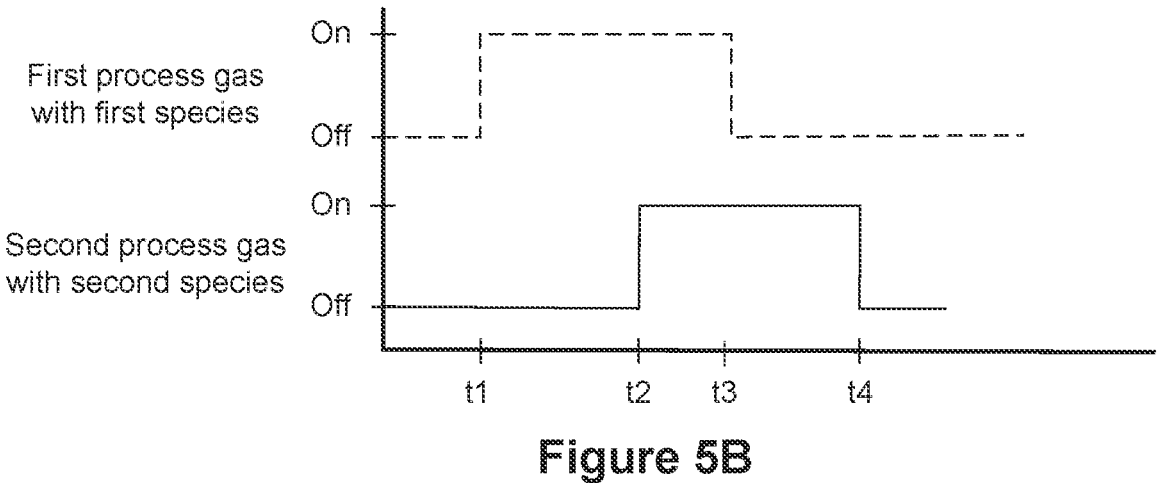
Figure 5C:
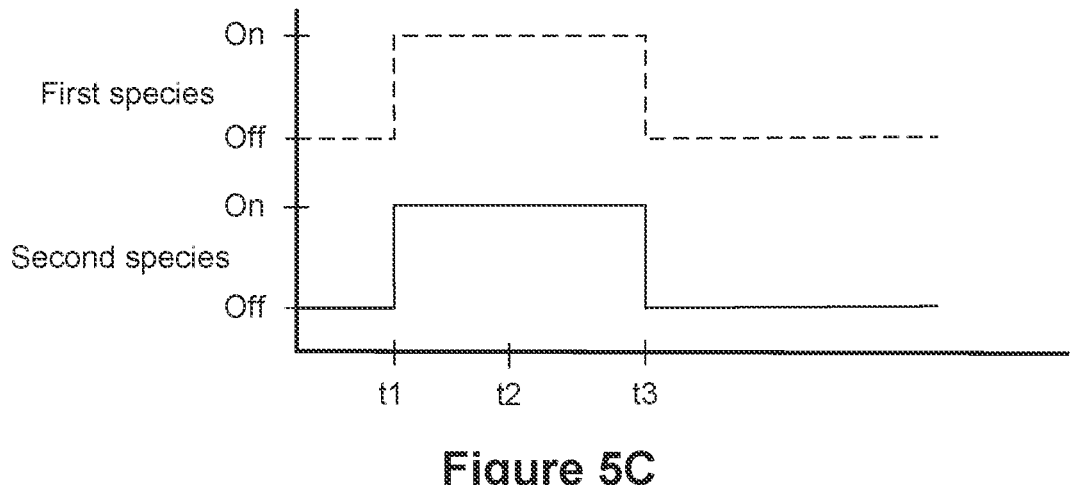

FIGS. 5A through 5C depict example gas flow sequences according to various embodiments. In FIG. 5A, the first process gas with the first species and the second process gas with the second species are flowed onto the wafer without any overlap and may be considered the gas flows described with respect to FIGS. 2 and 3. Here, the first process gas is flowed from time t1 to time t2 after which it is turned off; this may be considered the modification operation of block 205A and schematic 302b. In some instances, the optional purge operation may be performed between time t2 and time t3, such as optional block 207 and schematic 302c. At time t3, the second process gas is flowed onto the wafer until time t4 until it is stopped; this time period may be considered the removal operation of block 205B and schematic 302d.

In FIG. 5B, the first process gas and the second process gas overlap for only a portion of the etching. At time t1, the first process gas is flowed onto the wafer while the second process gas is not flowed onto the wafer, which proceeds until time t2. This may also be considered the modification operation of block 205A and schematic 302b. At time t2, the second process gas is flowed onto the wafer while the first process gas is simultaneously flowed onto the wafer. The first and second process gas both flow onto the wafer between time t2 and time t3; this may be considered the overlapping or co-flowing period of the first and second process gases. Referring back to FIG. 4, this overlapping period may be considered the simultaneous performance of blocks 405A and 405B. At time t3 of FIG. 5B, the first process gas flow is stopped, and the second process gas continues flowing until time t4 when it is stopped. This time may also be considered the removal operation of block 205B and schematic 302d.

In some embodiments, the temperature of the wafer may be adjusted during the etching illustrated in FIG. 5B. For example, the wafer may be maintained at a first temperature between times t1 and t2, adjusted to a second temperature at time t2 and maintained at that second temperature until times t3 or t4. In some such implementations, the temperature may be adjusted to a third temperature at time t3 until time t4. In some other embodiments, the temperature may be held at the first temperature from time t1 to time t3 and then adjusted to the second temperature. This may be considered, in some embodiments, temperature ramp up or ramp down sequence with the second temperature greater than or less than the first temperature, and when applicable, the third temperature greater than or less than the second temperature. These temperatures may be any of those provided herein above. Adjusting the temperatures during any of the etching provided herein may allow for additional control and use of chemisorption and desorption. In some other embodiments, the wafer may be maintained at a substantially constant temperature during the etching of FIG. 5B (e.g., within about 10% or 5% of the set temperature).

Similarly, the wafer temperature may be increased or decreased during the modifying, the removing, or both. Referring to FIG. 5A for instance, the wafer temperature may be increased from a first temperature to a greater second temperature, or decreased from a first temperature to a lower third temperature, during the modifying operation between time t1 and time t2. Alternatively or additionally to this, during the removing operation between time t3 and t4, the wafer temperature may also be increased or decreased.

Alternatively or additionally, the chamber pressure may be adjusted during the etching of FIG. 5B. For example, the chamber may be maintained at a first pressure between times t1 and t2, adjusted to a second pressure at time t2 and maintained at that second pressure until times t3 or t4. In some such implementations, the pressure may be adjusted to a third pressure at time t3 until time t4. In some other embodiments, the pressure may be held at the first pressure from time t1 to time t3 and then adjusted to the second pressure. This may be considered, in some embodiments, pressure ramp up or ramp down sequence with the second pressure greater than or less than the first pressure, and when applicable, the third pressure greater than or less than the second pressure. These pressures may be any of those provided herein above. Adjusting the pressure during any of the etching provided herein may allow for additional control and use of chemisorption and desorption, as well as reducing unwanted residue buildup in the chamber. In some other embodiments, the pressure may be substantially constant during the etching of FIG. 5B (e.g., within about 10% or 5% of the set pressure).

Similarly, the chamber pressure increase or decrease may be performed during the modifying, the removing, or both. Referring to FIG. 5A for instance, the chamber pressure may be increased from a first pressure to a greater second pressure, or decreased from a first pressure to a lower second pressure, during the modifying operation between time t1 and time t2. Alternatively or additionally to this, during the removing operation between time t3 and t4, the chamber pressure may also be increased or decreased.

In FIG. 5C, the first species and the second species are co-flowed, or simultaneously flowed, onto the wafer for substantially all of the etching. Due to imperfections in the design, implementation, tolerances, and operation of gas delivery systems, these gases may be intended to be co-flowed for the exactly the same time, but in practice it may not actually be exact. Here in FIG. 5C, the first species and the second species are simultaneously flowed onto the wafer from times t1 to t2 after which they are both stopped. In some implementations, the first and second species may be in the same process gas, along with an optional carrier gas, that is flowed onto the wafer. In some other implementations, the first species may be a part of a first process gas and the second species may be a part of a separate second process gas, as described above, and these first and second process gases are both co-flowed onto the wafer from time t1 to time t2.

In some implementations, it may be advantageous to keep the first and second species separate until they enter the process chamber. This may avoid a cross reaction between the first and second species. The first and second species may therefore be flowed in separate lines and through separate ports into the processing chamber, such as through a dual-plenum showerhead or through separate nozzles, for instance. This may allow the two chemistries to meet only on the wafer surface.

In some embodiments, the temperature of the wafer may be adjusted during the etching illustrated in FIG. 5C and FIG. 4. For example, the wafer may be maintained at a first temperature between times t1 and ta, adjusted to a second temperature at time ta and maintained at that second temperature until time t2. In some such implementations, the temperature may be adjusted to a third temperature or other temperatures throughout this etching. This may be considered, in some embodiments, temperature ramp up or ramp down sequence with, for example, the second temperature greater than or less than the first temperature, and when applicable, the third temperature greater than or less than the second temperature. These temperatures may be any of those provided herein above. In some other embodiments, the wafer may be maintained at a substantially constant temperature during the etching of FIG. 5C.

Alternatively or additionally, the chamber pressure may be adjusted during the etching of FIG. 5C. For example, the chamber may be maintained at a first pressure between times t1 and t2, adjusted to a second pressure at time t2 and maintained at that second pressure until time t3. This may be considered, in some embodiments, pressure ramp up or ramp down sequence with the second pressure greater than or less than the first pressure. These pressures may be any of those provided herein above. In some other embodiments, the pressure may be substantially constant during the etching of FIG. 5C.

The modification and removal operations with overlapping flows is further illustrated in FIG. 6 which depicts an example schematic illustration of etching in accordance with disclosed embodiments. Diagram 602a corresponds to diagram 302a above in which the wafer is provided and it has one or more layers of IGZO, with each IGZO molecule represented as unshaded circles. Each unshaded circle represents a single IGZO molecule that includes indium, represented by the shaded circle, gallium, represented by the shaded triangle, zinc, represented by the shaded diamond, and oxygen, represented by the unshaded rectangle. The top layer of the IGZO may be considered a surface layer 606.

In 602b, the first species, i.e., the modifying molecules 608 (the solid black circles, some of which are identified with identifier 608), and the second species, i.e., the removal molecules 614, are simultaneously introduced into the process chamber; this may represent the co-flows or simultaneous flows described above, such as with respect to FIGS. 4, 5B, and 5C. Here, some of the modifying molecules 608 are adsorbed onto the IGZO molecules 604 of the surface layer 606 to create a modified surface layer 610 that includes modified molecules 612 (one modified molecule 612 is identified inside a dotted ellipse in 602b), e.g., the indium gallium zinc oxyfluoride. As stated above, the modifying molecules 608 may include a fluorine, such as hydrogen fluoride. The removal molecules 614 are also co-flowed onto the wafer and the second species may include an alkyl aluminum halide, silicon halide, halogenated silane, or alkyl silicon halide, as provided above. These removal molecules 614 react with the modified molecules 612, e.g., the indium gallium zinc oxyfluoride, and cause each of IGZO's metallic constituents to desorb from, and thus be removed from, the wafer. The indium 616, the gallium 618, the zinc 620, and the oxygen 621 are seen desorbing from the wafer in response to the removal molecules 614, e.g., the second species having an alkyl aluminum halide, silicon halide, halogenated silane, or alkyl silicon halide, flowing onto the wafer and reacting with the modified layer 610 of IGZO, e.g., the indium gallium zinc oxyfluoride 612. As noted above, the oxygen 621 is removed by binding with the hydrogen originating from the modifying molecules that contain a hydrogen, such as hydrogen fluoride, as indicated by the oxygen rectangle 621 bonded with the hydrogen molecule 623 (a shaded square) that are being removed from the wafer in schematic 602b. In some embodiments, the first species and the second species may be flowed separately into the processing chamber via separate gas lines and/or separate ports (e.g., separate injection nozzles or ports within the same showerhead).

In some embodiments, as the first species and the second species, e.g., the modifying molecules and the removal molecules, are flowed onto the wafer, additional layers of IGZO may be etched. For instance, FIG. 602b illustrates that a second layer 622 of the IGZO may be similarly modified to form a modified molecule 612a which may also be removed from the wafer when exposed to and reacted with the removal molecules 614.

Diagram 602b may be considered an illustration of etching during simultaneous flows of the first and second species onto the wafer. As described above with respect to FIG. 5B, some modifying may occur before this diagram 602b, which may be represented by diagram 302b. Additionally, in some instances like in FIG. 58, after this co-flowing of diagram 602b, additional removing may occur without any simultaneous modifying; this may be represented by diagram 302d. In some such embodiments, the etching of FIG. 5B may be illustrated by the sequence of diagram 302b, 602b, and 302d.

Referring back to FIG. 4, the performance of blocks 405A and 405B together for a duration of time may be considered a single ALE cycle. In some implementations, blocks 405A and 405B may be stopped and then repeated in order to perform multiple cycles and remove multiple layers of the IGZO. This may include performing, for example, about 1 to 1,000 cycles, about 1 to about 500 cycles, about 1 to about 100 cycles, about 1 cycle to about 30 cycles, or about 1 to about 20 cycles. Any suitable number of ALE cycles may be included to etch a desired amount of IGZO film. In some embodiments, ALE is performed in cycles to etch about 1 Angstroms (Å) to about 50 Å of the surface of the layers on the wafer. In some embodiments, cycles of ALE etch between about 2 Å and about 50 Å of the surface of the layers on the wafer. In some embodiments, each ALE cycle may etch at least about 0.1 Å, 0.5 Å, 1 Å, 2 Å, or 3 Å.

In some of the embodiments provided here, the flow rate of the first process gas may remain constant and the flow rate of the second process gas may remain constant. In some other embodiments, the first and second process gases may be flowed at the same or different flow rates. In some other embodiments, it may be advantageous to vary the flow rate of the first and/or the second process gases. This may include, for instance, increasing the second process gas flowrate during the removal operation in order to provide more removal molecules as the removal operation progresses. Some example flow rates may include between about 50 sccm and 1000 sccm.

Some implementations of the etching described herein may include heating one or more surfaces or aspects of the processing chamber and/or the gas delivery system in order to reduce unwanted reactions or deposition on the chamber surfaces or within the delivery system. Elevating the temperature of these features prevents unwanted condensation of processing gases and vapors within the processing chamber. For example, some of the process gases use vapors, such as water and/or alcohol vapor, onto the substrate which adsorb onto the substrate, but they may also undesirably adsorb onto the chamber's interior surfaces. This can lead to unwanted deposition and etching on the chamber interior surfaces (e.g., chamber walls, the showerhead, or the pedestal or electrostatic chuck) which can damage the chamber surfaces and cause particulates to flake off onto the substrate thereby causing substrate defects. In order to reduce and prevent unwanted condensation on the chamber's interior surfaces, the temperature of chamber's walls, top, and bottom may be maintained at a temperature at which condensation of chemistries used in the processing operations does not occur. These surfaces may be heated to a temperature above ambient temperature, such as at least to at least about 40° C., at least about 60° C., at least about 80° C., at least about 90° C., at least about 120° C., at least about 130° C., or at least about 150° C., for example. Accordingly, the techniques provided herein may also include heating and maintaining one or more surface of the process chamber and/or one or more aspects of the gas delivery system to an elevated temperature, such as at least to at least about 40° C., at least about 60° C., at least about 80° C., at least about 90° C., at least about 120° C., at least about 130° C., or at least about 150° C. In some instances, temperatures above about 60° C. may be a safety hazard which may require insulating exterior portions of the chamber or apparatus.

Similarly, aspects of gas delivery system, such as gas lines and the gas distribution device such as the faceplate or showerhead, may also be heated to reduce unwanted deposition and reactions in this system and the process chamber. For example, the gas lines and mixing chamber may be heated to prevent unwanted condensation of the vapors and gases flowing within. These lines and gas delivery system may be heated to at least about 40° C., at least about 80° C., at least about 90° C., at least about 120° C., at least about 130° C., or at least about 150° C.

In some embodiments, the etching provided herein may use an additional preferential etch step to remove IGZO constituents that remain on a surface of the wafer after some of the etching. For example, some such etching described herein may remove zinc at a higher etch rate than the indium and gallium, which may result in more indium and gallium remaining on a surface of the wafer than zinc after an etching process. A preferential etching, or clean, operation may be performed which can removing these remaining IGZO constituents from the surface of the wafer. In some embodiments, this may be performed after one or more ALE cycles or performances of the modifying and removal operations described herein, such as blocks 105, 205A and 205B, and 405A and 405C.

ALE Apparatuses

Figure 7:
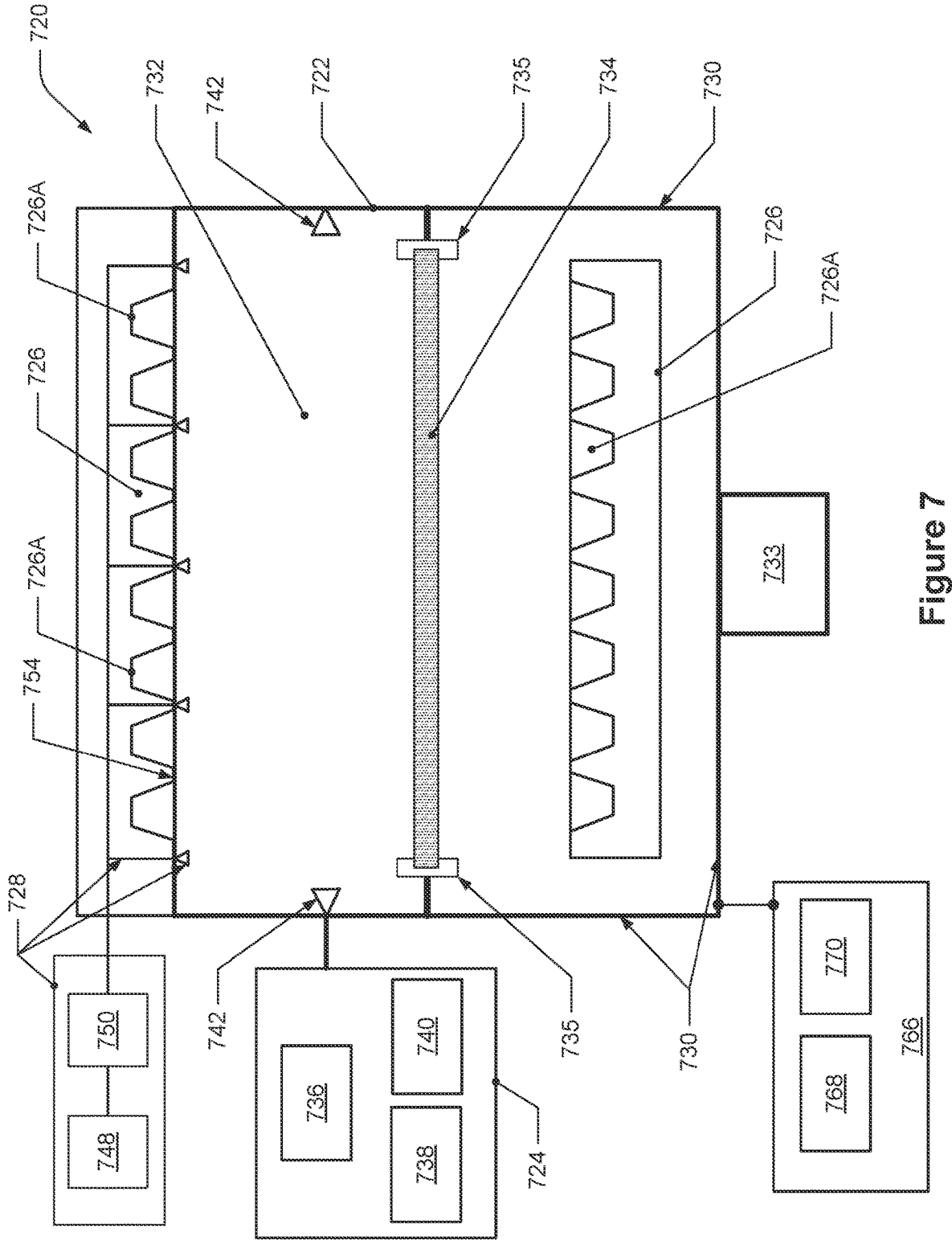
FIG. 7 depicts an example apparatus for semiconductor processing in accordance with disclosed embodiments.

Referring now to FIG. 7, an example of a substrate processing chamber for selectively etching materials according to the present disclosure is shown. While a specific substrate processing chamber is shown and described, the methods described herein may be implemented on other types of substrate processing systems. FIG. 7 depicts an example apparatus 720 for semiconductor processing in accordance with disclosed embodiments, including thermal atomic layer etching; this apparatus 720 includes a processing chamber 722, a process gas unit 724, a substrate heating unit 726, and a substrate cooling unit 728. The processing chamber 722 has chamber walls 730 that at least partially bound and define a chamber interior 732 (which may be considered a plenum volume). The process gas unit 724 is configured to flow process gases, which may include liquids and/or gases, such as a reactant, modifying molecules, converting molecules, or removal molecules, onto a substrate 734 in the chamber interior 732. The process gas unit 724 also includes one or more flow features 742 configured to flow the first process gas onto the substrate 734, such as a hole, a nozzle (two of which are depicted), or a shower-head. The one or more flow features 742 may be positioned above, below, on the side, or a combination of positions, within the chamber interior 732, such as on the processing chamber walls, top, and bottom, for instance. The process gas unit 724 may include a mixing vessel for blending and/or conditioning process gases for delivery to the chamber interior 732. One or more mixing vessel inlet valves may control introduction of process gases to the mixing vessel.

The process gas unit 724 may include a first process gas source 736, a first process liquid source 738, a vaporization point (not depicted) which may vaporize the first liquid into a gas, and a carrier gas source 740. Some reactants may be stored in liquid form prior to vaporization and subsequent to delivery to the process chamber 722. The first process gas may comprise an oxidizing gas, a halogenating gas, or another gas configured to modify one or more layers of material on the substrate, without using a plasma, in some embodiments. In some implementations, the vaporization point may be a heated liquid injection module. In some other implementations, the vaporization point may be a heated vaporizer. In some other embodiments, the vapor may be generated by drawing a vacuum above a container containing the liquid reagent. In yet other implementations, the vaporization point may be eliminated from the process station. In some implementations, a liquid flow controller (LFC) upstream of the vaporization point may be provided for controlling a mass flow of liquid for vaporization and delivery to the chamber interior 732. The carrier gas source 740 includes one or more carrier gases or liquids that may be flowed with the processing gas; these may be inert gases like N$_2$, Ar, Ne, He. The apparatus 720 may also include a vacuum pump 733 configured to pump the chamber interior to low pressures, such as a vacuum having a pressure of 1 mTorr or 10 Torr, for example.

The chamber interior 732 includes substrate support features 735 that are configured to support and thermally float a substrate 734 in the chamber. The substrate support features 735 may include clamps, horizontal pins or supports, vertical pins or supports, and semi-circular rings, for instance, that support the substrate 734 in the chamber interior 732. These features are configured to support the substrate 734 such that the thermal mass of the substrate 734 is reduced as much as possible to the thermal mass of just the substrate. Each substrate support feature 735 may therefore have minimal contact with the substrate 734 and may be the smallest number of features required to adequately support the substrate during processing (e.g., in order to support the weight of the substrate and prevent inelastic deformation of the substrate). For instance, the surface area of one substrate support feature 735 in contact with a substrate may be less than about 1%, 0.5%, 0.1%, 0.05%, or 0.01% of the overall surface area of the back side of the substrate; also, for instance, 2, 3, or 4 features may be utilized.

In one example, the support features 735 may include two or more vertical pins that have grooves wrapped or spiraled along the vertical, longitudinal axis and that are offset at varying distances from the longitudinal axis and configured to support a substrate. When the vertical pin rotates along its longitudinal axis and the edge of a substrate is positioned in the groove, the edge of the groove, and therefore the edge of the substrate, moves farther away from the longitudinal axis. When multiple vertical pins are used to support a substrate, the rotation of the vertical pins causes the grooves to apply a supporting force to the substrate in a direction perpendicular to the longitudinal axis.

In some embodiments, the chamber 722 may include a wafer support pedestal that includes substrate lift pins. During thermal ALE processing, the lift pins may support and position the substrate away from the pedestal such that there is substantially no transference of thermal energy between the pedestal and substrate (e.g., less than 10%, 5%, 1%, 0.5%, or 0.1% of energy transferred between the two). In some other embodiments, the chamber 722 may not have a pedestal. In some embodiments, an electrostatic chuck (ESC) may be used that contains substrate heating unit 726 configured to heat the substrate to temperatures provided herein, such as between about 20° C. and 500° C.

The substrate heating unit 726 is configured to heat the substrate to multiple temperatures and maintain such temperatures for at least 1 second, 5 seconds, 10 seconds, 30 seconds, 1 minute, 2 minutes, or 3 minutes, for example. In some embodiments, the substrate heating unit 726 is configured to heat the substrate between at least two temperature ranges, with the first range between about 20° C. and 150° C., and the second range between about 200° C. and 600° C., as well as configured to maintain the substrate at a temperature within these ranges for at least 1 second, 5 seconds, or 10 seconds, for example. Additionally, in some embodiments, the substrate heating unit 726 is configured to heat the substrate from the first temperature range to the second temperature range in less than about 250 milliseconds, 150 milliseconds, 100 milliseconds, or 50 milliseconds, for instance.

The substrate heating unit 726 may utilize radiant heating, convective heating, laser heating, plasma heating, solid-to-solid thermal transference (e.g., transferring heat generated by one or more heating elements in a heated electrostatic chuck or pedestal to a substrate supported by or on that chuck or pedestal), or a combination of these items. For radiant heating, the substrate heating unit 726 may be used for emitted light heating, ultraviolet heating, microwave heating, radio frequency heating, and induction heating. For example, the substrate heating unit 726 may include light emitting diodes (LEDs) that emit visible light with wavelengths that may include and range between 400 nanometers (nm) and 800 nm. This may also include, for instance, a heat lamp, light emitting diodes (e.g., LEDs), a ceramic heater, a quartz heater, or a plurality of Gradient Index (GRIN) Lenses connected to a light energy source. A GRIN lens is configured to deliver heat energy (thermal or light) from the light energy source to the substrate in a uniform manner; the light source may be a laser or high-intensity light source that transmits the heat energy through a conduit, such as a fiber optic cable, to the GRIN lenses. The heating elements utilized by the substrate heating unit 726 may be positioned above, below, on the side, or a combination of the positions, the substrate 734, and they may be positioned inside, outside, or both, the chamber interior 732. In FIG. 7, the heating elements utilized by the substrate heating unit 726 include a plurality of LEDs 726A that are positioned both above and below the substrate 734; the lower heating elements are positioned inside the chamber interior 732 and the upper heating elements are positioned outside the chamber interior 732. In some embodiments, for some of the heating elements that are positioned outside the chamber 722, the chamber 722 may have a window 754 that allows for the radiation to be transmitted into the chamber interior 732 and onto the substrate 734. In some embodiments, this window 754 may be an optical-grade quartz plate while in other embodiments it may be a transparent indium tin oxide (ITO) window. In some embodiments, the substrate heating unit 726 include a plurality of LEDs 726A may only be positioned underneath the substrate 734, which may include inside a pedestal or ESC that also may include a window through which the light emitted by the LEDs may reach the backside of the substrate.

For solid-to-solid thermal transference, the substrate heating unit 726 may have one or more heating surfaces that are configured to contact and heat the substrate in the chamber interior. In some embodiments, the substrate heating unit 726 may have a heating platen, such as a flat surface or a surface of a substrate pedestal, that is configured to contact the back surface of the substrate and heat the substrate. This heating platen may have heating elements such as a heating coil, heating fluid, or radiative heating discussed above, that may heat the surface of the heating platen. The substrate may be heated when the back of the substrate is in direct contact with, or is offset from the heating platen but close enough to receive thermal energy from, the heating platen. When using this solid-to-solid thermal transference to heat the substrate, the substrate is separated from the heating platen when it is cooled. While some conventional ALE apparatuses may have a substrate pedestal that includes both heating and cooling elements, these apparatuses are unable to quickly (e.g., under 250 milliseconds) cycle between the temperatures of thermal ALE because of the large thermal masses of the pedestal that are repeatedly heated and cooled. For instance, it may take multiple seconds or minutes to heat a pedestal from a first temperature range (e.g., 20° C. to 100° C.) to a second temperature range (e.g., 200° C. to 500° C.), as well as to cool the pedestal from the second temperature range to a lower temperature that can cool the substrate to the first temperature range. Accordingly, after using this solid-to-solid heating technique, the heating platen and the substrate are separated from each other which may be accomplished, for instance, by moving the substrate and/or the heating platen away from each other. Without this separation, cooling occurs of both the thermal mass of the substrate and the heating platen which increases the cooling time which decreases substrate throughput. In some embodiments, an ESC or pedestal having the substrate heating unit and a Peltier element for cooling may enable fast heating and cooling times (such as about 30 seconds to cool a substrate to a desired temperature). In some embodiments, this may be performed at low pressures, such as less then 1 Torr, including less than 50 mTorr, for example.

The substrate cooling unit 728 of FIG. 7 is configured to actively cool the substrate. In some embodiments, the substrate cooling unit 728 flows a cooling gas onto the substrate 734 which actively cools the substrate 734. The substrate cooling unit 728 may include a cooling fluid source 748 which may contain a cooling fluid (a gas or a liquid), and a cooler 750 configured to cool the cooling fluid to a desired temperature, such as less than or equal to 0° C., –50° C., –100° C., –150° C., –170° C., –200° C., and –250° C., for instance. The substrate cooling unit 728 includes piping and coolant flow features 752, e.g., nozzles or holes, that are configured to flow the coolant fluid into the chamber interior 732. In some embodiments, the fluid may be in liquid state when it is flowed to the chamber 722 and may turn to a vapor state when it reaches the chamber interior 732, for example if the chamber interior 732 is at a low pressure state, such as 1 Torr, for instance. The cooling fluid may be an inert element, such as nitrogen, argon, helium. In some embodiments, the flow rate of the cooling fluid into the chamber interior 732 may be at least 10 liters per second, 50 liters per second, 100 liters per second, 150 liters per second, 200 liters per second, 250 liters per second, and 300 liters per second, for example.

Various factors may increase the ability of the cooling fluid to cool the substrate. It has been discovered through various experiments that the higher the flow rate of the cooling fluid, the faster the substrate is cooled. In one example experiment, a cooling gas at about –196° C. flowed onto a substrate at a flow rate of 1 liter per second was found to reduce the temperature of a substrate from about 220° C. to about 215° C. in about 5,000 milliseconds, while the same cooling gas a flow rate of 10 liters per second reduced the temperature of a substrate from about 220° C. to about 195° C. in about 5,000 milliseconds. It was also discovered that a gap (1052 in FIG. 10) between the substrate and the top of the chamber may also affect the cooling of the substrate; the smaller the gap, the higher the cooling. In one instance, it was discovered that a substrate separated from the top of the chamber by a gap of about 50 micrometers was cooled from about 220° C. to about 215° C. in about 5,000 milliseconds using a cooling gas at about –196° C., while a substrate separated from the top of the chamber by a gap of about 5 millimeters was cooled from about 220° C. to about 209° C. in about 5,000 milliseconds using the same cooling gas. Accordingly, it was discovered that the higher the flow rate and the smaller the gap, the faster the substrate is cooled.

In some embodiments, the substrate cooling unit 728 may use solid-to-solid thermal transference to actively cool the substrate 734. In some of these embodiments, a cooling platen, such as a flat, cooled surface may be used to contact the bottom of the substrate and cool the substrate. This platen may be cooled by flowing a cooling fluid on, through, or underneath the platen. When using this solid-to-solid cooling, similar to the solid-to-solid heating discussed above, the substrate is separated from the cooling platen during heating of the substrate, such as by moving the substrate away from the cooling platen by, for instance, raising it up with lift pins. Without this separation, both the thermal masses of the substrate and cooling platen are cooled which requires more cooling that in turn increases process time and decreases throughput. In some embodiments, radiant heating of the top of the substrate or plasma heating of the bottom of the substrate may be used in conjunction with solid-to-solid cooling.

In some embodiments, the substrate cooling unit 728 may use laser cooling to cool the substrate. This may enable the cooling of a substrate that includes thulium molecules on at least the exposed surface of the substrate by utilizing a reverse Navier-Stokes reaction. For example, the temperature of the substrate manifests itself in phonons and the laser cooling emits photons to the substrate surface which interact with and pick-up phonons in the thulium, and then leave the substrate with the phonon from the thulium at a higher energy level. The removal of these phonons causes a decrease in the temperature of the substrate. The thulium may be doped onto the surface of the substrate in order to enable this laser cooling, and this doping may be incorporated into the techniques listed above, such as occurring after or before any operation, such as the removal operation.

As noted above, some embodiments of the apparatus may include a plasma source configured to generate a plasma within the chamber interior. These plasma sources may be a capacitively coupled plasma (CCP), an inductively coupled plasma (ICP), an upper remote plasma, and a lower remote plasma.

In some embodiments, the apparatuses described herein may include a controller that is configured to control various aspects of the apparatus in order to perform the techniques described herein. For example, in FIG. 7, apparatus 720 includes a controller 766 (which may include one or more physical or logical controllers) that is communicatively connected with and that controls some or all of the operations of a processing chamber. The system controller 766 may include one or more memory devices 768 and one or more processors 770. In some embodiments, the apparatus includes a switching system for controlling flow rates and durations, the substrate heating unit, the substrate cooling unit, the loading and unloading of a substrate in the chamber, the thermal floating of the substrate, and the process gas unit, for instance, when disclosed embodiments are performed. In some embodiments, the apparatus may have a switching time of up to about 500 ms, or up to about 750 ms. Switching time may depend on the flow chemistry, recipe chosen, reactor architecture, and other factors.

In some implementations, the controller 766 is part of an apparatus or a system, which may be part of the above-described examples. Such systems or apparatuses can include semiconductor processing equipment, including a processing tool or tools, chamber or chambers, a platform or platforms for processing, and/or specific processing components (a gas flow system, a substrate heating unit, a substrate cooling unit, etc.). These systems may be integrated with electronics for controlling their operation before, during, and after processing of a semiconductor wafer or substrate. The electronics may be referred to as the "controller," which may control various components or subparts of the system or systems. The controller 766, depending on the processing parameters and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller 766 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing operations during the fabrication of one or more layers, materials, metals, oxides, silicon, silicon dioxide, surfaces, circuits, and/or dies of a wafer.

The controller 766, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing operations to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller 766 receives instructions in the form of data, which specify parameters for each of the processing operations to be performed during one or more operations. It should be understood that the parameters may be specific to the type of process to be performed and the type of tool that the controller is configured to interface with or control. Thus as described above, the controller 766 may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

As noted above, depending on the process operation or operations to be performed by the apparatus, the controller 766 might communicate with one or more of other apparatus circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

As also stated above, the controller is configured to perform any technique described above. For instance, referring to apparatus 720 of FIG. 7 and technique of FIG. 1, in some embodiments the controller 766 is configured to cause the substrate heating unit 726 to bring (i.e., heat) the wafer 734 positioned on the substrate support features 735 to a first temperature, and cause the process gas unit 724 to flow the first process gas to the wafer 734. As noted above, the first process gas is configured to modify one or more surface layers of IGZO on the wafer 734 by chemical adsorption, without using a plasma in some embodiments, while the wafer 734 is maintained at the first temperature. The controller 766 may further be configured to cause the process gas unit 724 to flow the second process gas onto the substrate as described herein to remove the modified layer of IGZO.

Figure 8:
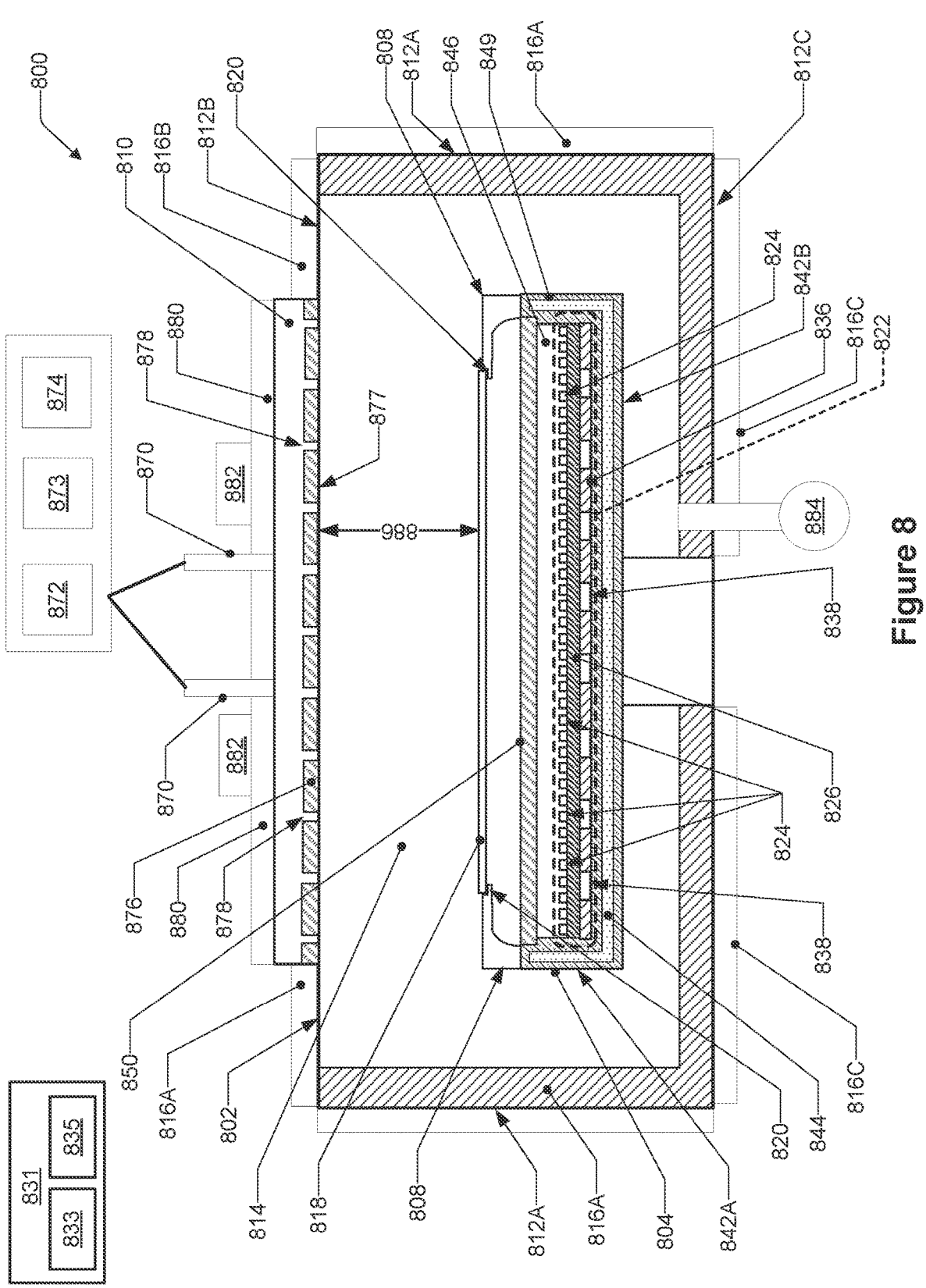
FIG. 8 depicts a cross-sectional side view of an example apparatus in accordance with disclosed embodiments.

As noted above, some etching performed herein may temperature controlled features of the processing chamber, such as its side walls, top, and/or bottom, as well as the showerhead and gas delivery system. FIG. 8 depicts a cross-sectional side view of an example apparatus in accordance with disclosed embodiments. As detailed below, this apparatus 800 is capable of rapidly and precisely controlling the temperature of a substrate, including performing thermal etching operations. The apparatus 800 includes a processing chamber 802, a pedestal 804 having a substrate heater 806 and a plurality of substrates supports 808 configured to support a substrate 818, and a gas distribution unit 810.

The processing chamber 802 includes sides walls 812A, a top 812B, and a bottom 812C, that at least partially define the chamber interior 814, which may be considered a plenum volume. As stated herein, it may be desirable in some embodiments to actively control the temperature of the processing chamber walls 812A, top 812B, and bottom 812C in order to prevent unwanted condensation on their surfaces. Some emerging semiconductor processing operations flow vapors, such as water and/or alcohol vapor, onto the substrate which adsorb onto the substrate, but they may also undesirably adsorb onto the chamber's interior surfaces. This can lead to unwanted deposition and etching on the chamber interior surfaces which can damage the chamber surfaces and cause particulates to flake off onto the substrate thereby causing substrate defects. In order to reduce and prevent unwanted condensation on the chamber's interior surfaces, the temperature of chamber's walls, top, and bottom may be maintained at a temperature at which condensation of chemistries used in the processing operations does not occur.

This active temperature control of the chamber's surfaces may be achieved by using heaters to heat the chamber walls 812A, the top 812B, and the bottom 812C. As illustrated in FIG. 8, chamber heaters 816A are positioned on and configured to heat the chamber walls 812A, chamber heaters 816B are positioned on and configured to heat the top 812B, and chamber heaters 816C are positioned on and configured to heat the bottom 812C. The chamber heaters 816A-816C may be resistive heaters that are configured to generate heat when an electrical current is flowed through a resistive element. Chamber heaters 816A-816C may also be fluid conduits through which a heat transfer fluid may be flowed, such as a heating fluid which may include heated water. In some instances, the chamber heaters 816A-816C may be a combination of both heating fluid and resistive heaters. The chamber heaters 816A-816C are configured to generate heat in order to cause the interior surfaces of each of the chamber walls 812A, the top 812B, and the bottom 812C to the desired temperature, which may range between about 40° C.

and about 150° C., including between about 80° C. and about 130° C., about 90° C. or about 120° C., for instance. It has been discovered that under some conditions, water and alcohol vapors do not condense on surfaces kept at about 90° C. or higher.

The chamber walls 812A, top 812B, and bottom 812C, may also be comprised of various materials that can withstand the chemistries used in the processing techniques. These chamber materials may include, for example, an aluminum, anodized aluminum, aluminum with a polymer, such as a plastic, a metal or metal alloy with a yttria coating, a metal or metal alloy with a zirconia coating, and a metal or metal alloy with aluminum oxide coating; in some instances the materials of the coatings may be blended or layers of differing material combinations, such as alternating layers of aluminum oxide and yttria, or aluminum oxide and zirconia. These materials are configured to withstand the chemistries used in the processing techniques, such as anhydrous HF, water vapor, methanol, isopropyl alcohol, chlorine, fluorine gases, nitrogen gas, hydrogen gas, helium gas, and the mixtures thereof.

The apparatus 800 may also be configured to perform processing operations at or near a vacuum, such as at a pressure of about 0.1 Torr to about 100 Torr, or about 20 Torr to about 200 Torr, or about 0.1 Torr to about 10 Torr. This may include a vacuum pump 884 configured to pump the chamber interior 814 to low pressures, such as a vacuum having a pressure of about 0.1 Torr to about 100 Torr, including about 0.1 Torr to about 10 Torr, and about 20 Torr to about 200 Torr, or about 0.1 Torr to about 10 Torr.

Various features of the pedestal 804 will now be discussed. The pedestal 804 includes a heater 822 (encompassed by the dashed rectangle in FIG. 8) that has a plurality of LEDs 824 that are configured to emit visible light having wavelengths including and between 400 nm to 800 nm, including 450 nm. The heater LEDs emit this visible light onto the backside of the substrate which heats the substrate. Visible light having wavelengths from about 400 nm to 800 nm is able to quickly and efficiently heat silicon wafers from ambient temperature, e.g., about 20° C., to about 600° C. because silicon absorbs light within this range. In contrast, radiant, including infrared radiant, heating may ineffectively heat silicon at temperatures up to about 400° C. because silicon tends to be transparent to infrared at temperatures lower than about 400° C. Traditional "hot plate" heaters that rely on solid-to-solid thermal transference between the substrate and a heating platen, such as a pedestal with a heating coil, have relatively slow to heating and cooling rates, and provide non-uniform heating which may be caused by substrate warping and inconsistent contact with the heating platen. For example, it may take multiple minutes to heat a traditional pedestal to a desired temperature, and from a first to a second higher temperature, as well as to cool the pedestal to a lower temperature.

The heater's plurality of LEDs may be arranged, electrically connected, and electrically controlled in various manners. Each LED may be configured to emit a visible blue light and/or a visible white light. In certain embodiments, white light (produced using a range of wavelengths in the visible portion of the EM spectrum) is used. In some semiconductor processing operations, white light can reduce or prevent unwanted thin film interference. For instance, some substrates have backside films that reflect different light wavelengths in various amounts, thereby creating an uneven and potentially inefficient heating. Using white light can reduce this unwanted reflection variation by averaging out the thin film interference over the broad visible spectrum provided by white light. In some instances, depending on the material on the back face of the substrate, it may be advantageous to use a visible non-white light, such as a blue light having a 450 nm wavelength, for example, in order to provide a single or narrow band of wavelength which may provide more efficient, powerful, and direct heating of some substrates that may absorb the narrow band wavelength better than white light.

Various types of LED may be employed. Examples include a chip on board (COB) LED or a surface mounted diode (SMD) LED. For SMD LEDs, the LED chip may be fused to a printed circuit board (PCB) that may have multiple electrical contacts allowing for the control of each diode on the chip. For example, a single SMD chip is typically limited to having three diodes (e.g., red, blue, or green) that can be individually controllable to create different colors, for instance. SMD LED chips may range in size, such as 2.8×2.5 mm, 3.0×3.0 mm, 3.5×2.8 mm, 5.0×5.0 mm, and 5.6×3.0 mm. For COB LEDs, each chip can have more than three diodes, such as nine, 12, tens, hundreds or more, printed on the same PCB. COB LED chips typically have one circuit and two contacts regardless of the number of diodes, thereby providing a simple design and efficient single color application. The ability and performance of LEDs to heat the substrate may be measured by the watts of heat emitted by each LED; these watts of heat may directly contribute to heating the substrate.

Figure 9:
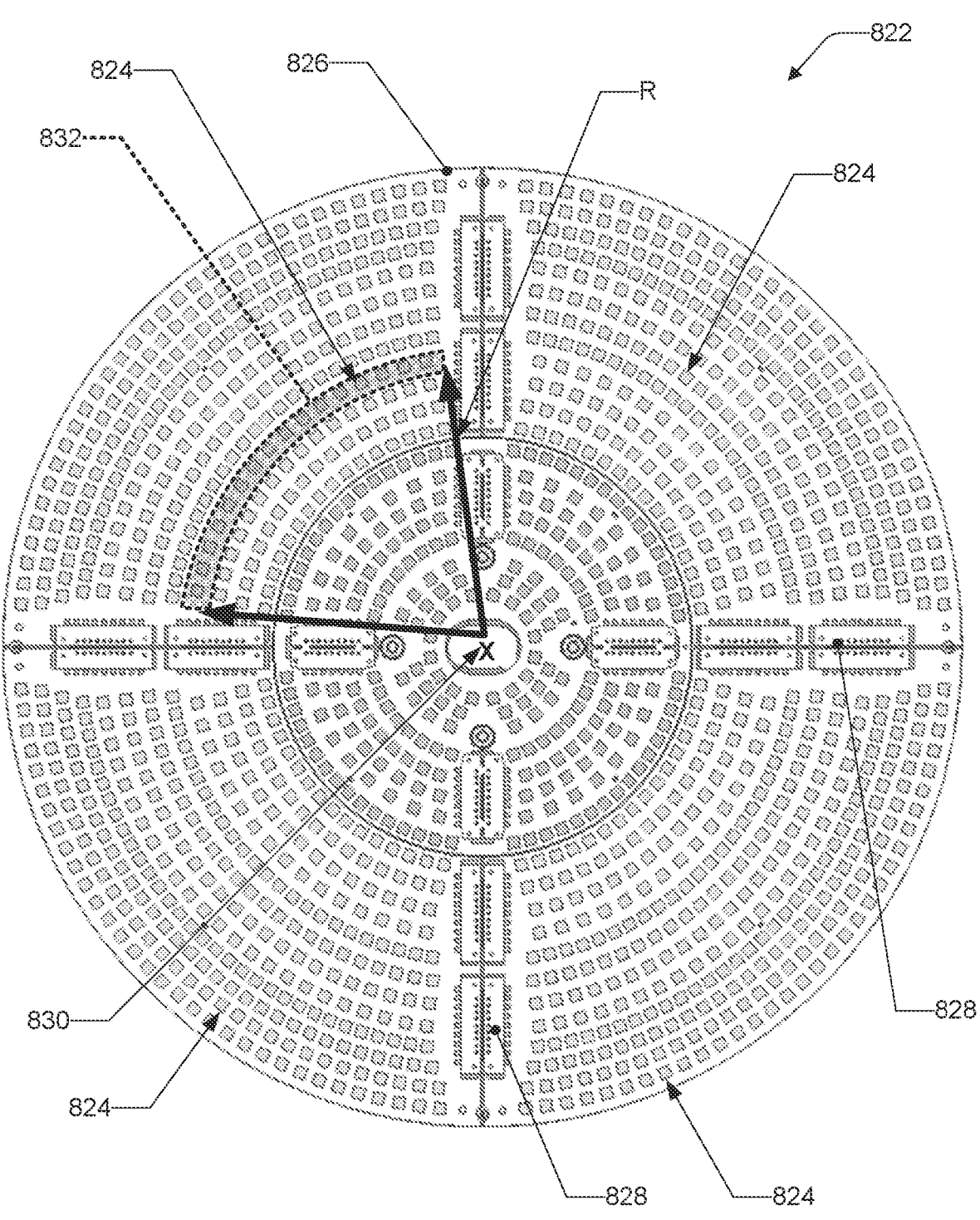
FIG. 9 depicts a top view of a substrate heater with a plurality LEDs.

FIG. 9 depicts a top view of a substrate heater with a plurality LEDs. This substrate heater 822 includes a printed circuit board 826 and the plurality of LEDs 824, some of which are labeled; this depicted plurality includes approximately 1,300 LEDs. External connections 828 are connected by traces to provide power to the plurality of LEDs 824. As illustrated in FIG. 9, the LEDs may be arranged along numerous arcs that are radially offset from the center 830 of the substrate heater 822 by different radiuses; in each arc, the LEDs may be equally spaced from each other. For example, one arc 832 is surrounded by a partially shaded dotted shape, includes 16 LEDs 824, and is a part of a circle with a radius R that extends around the center 830. The 16 LEDs 824 may be considered equally spaced from each other along this arc 832.

In some embodiments, the plurality of LEDs may include at least about 1,000 LEDs, including about 1,200, 1,500, 2,000, 3,000, 4,000, 5,000, or more than 6,000, for instance. Each LED may, in some instances, be configured to uses 4 watts or less at 100% power, including 3 watts at 100% power and 1 watt at 100% power. These LEDs may be arranged and electrically connected into individually controllable zones to enable temperature adjustment and fine tuning across the substrate. In some instances, the LEDs may be grouped into at least 20, for instance, independently controllable zones, including at least about 25, 50, 75, 80, 85 90, 95, or 100 zones, for instance. These zones may allow for temperature adjustments in the radial and azimuthal (i.e., angular) directions. These zones can be arranged in a defined pattern, such as a rectangular grid, a hexagonal grid, or other suitable pattern for generating a temperature profile as desired. The zones may also have varying shapes, such as square, trapezoidal, rectangular, triangular, obround, elliptical, circular, annular (e.g., a ring), partially annular (i.e., an annular sector), an arc, a segment, and a sector that may be centered on the center of the heater and have a radius less than or equal to the overall radius of the substrate heater's PCB. These zones are able to adjust the temperature at numerous locations across the wafer in order to create a more even temperature distribution as well as desired temperature profiles, such as higher temperatures around the edge of the substrate than in the center of the substrate. The independent control of these zones may also include the ability to control the power output of each zone. For example, each zone may have at least 15, 20, or 25 adjustable power outputs. In some instances, each zone may have one LED thereby enabling each LED to be individually controlled and adjusted which can lead to a more uniform heating profile on the substrate. Accordingly, in some embodiments, each LED of the plurality of LEDs in the substrate heater may be individually controllable.

In certain embodiments, the substrate heater 822 is configured to heat the substrate to multiple temperatures and maintain each such temperatures for various durations. These durations may include the following non-limiting examples of at least about 1 second, at least about 5 seconds, at least about 10 seconds, at least about 30 seconds, at least about 60 seconds, at least about 90 seconds, at least about 120 second, at least about 150 seconds, or at least about 180 seconds. The substrate heater may be configured to heat the substrate to between about 50° C. and 600° C., including between about 50° C. and 150° C., including about 130° C., or between about 150° C. and 350° C., for example. The substrate heater may be configured to maintain the substrate at a temperature within these ranges for various durations, including the following non-limiting examples: at least about 1 second, at least about 5 seconds, at least about 10 seconds, at least about 30 seconds, at least about 60 seconds, at least about 90 seconds, at least about 120 seconds, at least about 150 seconds, or at least about 180 seconds, for example. Additionally, in some embodiments, the substrate heater 822 is configured to heat the substrate to any temperature within these ranges in less than about 60 seconds, less than about 45 seconds, less than about 30 seconds, or less than about 15 seconds, for instance. In certain embodiments, the substrate heater 822 is configured to heat a substrate at one or more heating rates, such as between at least about 0.1° C./second and at least about 20° C./second, for example.

The substrate heater may increase the temperature of the substrate by causing the LEDs to emit the visible light at one or more power levels, including at least about 80%, at least about 90%, at least about 95%, or at least about 100% power. In some embodiments, the substrate heater is configured to emit between about 10 W and 4000 W, including at least about 10 W, at least about 30 W, at least about 0.3 kilowatt (KW), at least about 0.5 kW, at least about 2 kW, at least about 3 kW, or at least about 4 kw. The apparatus is configured to supply between about 0.1 kw and 9 kW of power to the pedestal; the power supply is connected to the substrate heater through the pedestal but is not depicted in the Figures. During temperature ramps, the substrate heater may operate at the high powers, and may operate at the lower power levels (e.g., include between about 5 W and about 0.5 kW) to maintain the temperature of a heated substrate.

In some embodiments, the substrate heater may also include a pedestal cooler that is thermally connected to the LEDs such that heat generated by the plurality of LEDs can be transferred from the LEDs to the pedestal cooler. This thermal connection is such that heat can be conducted from the plurality of LEDs to the pedestal cooler along one or more heat flow pathways between these components. In some instances, the pedestal cooler is in direct contact with one or more elements of the substrate heater, while in other instances other conductive elements, such as thermally conductive plates (e.g., that comprise a metal) are interposed between the substrate heater and the pedestal cooler. Referring back to FIG. 8, the substrate heater includes a pedestal cooler 836 in direct contact with the bottom of the PCB 826. Heat is configured to flow from the LEDs, to the PCB 826, and to the pedestal cooler 836. The pedestal cooler 836 also includes a plurality of fluid conduits 838 through which a heat transfer fluid, such as water, is configured to flow in order to receive the heat and thus cool the LEDs in the substrate heater 822. The fluid conduits 838 may be connected to a reservoir and pump, not pictured, located outside the chamber. In some instances, the pedestal cooler may be configured to flow water that is cooled, such as between about 5° C. and 20° C.

As provided herein, it may be advantageous to actively heat the exterior surfaces of the processing chamber 802. In some instances, it may similarly be advantageous to heat the exterior surfaces of the pedestal 804 in order to prevent unwanted condensation and deposition on its external surfaces. As illustrated in FIG. 8, the pedestal 804 may further include a pedestal heater 844 inside of the pedestal 804 that is configured to heat the exterior surfaces of the pedestal 804, including its sides 842A and bottom 842B. The pedestal heater 844 may include one or more heating elements, such as one or more resistive heating elements and fluid conduits in which a heating fluid is configured to flow. In some instances, the pedestal cooler and the pedestal heater may both have fluid conduits that are fluidically connected to each other such that the same heat transfer fluid may flow in both the pedestal cooler and the pedestal heater. In these embodiments, the fluid may be heated to between 50° C. and 130° C. including about 90° C. and 120° C.

The pedestal may also include a window to protect the substrate heater, including the plurality of LEDs, from damage caused by exposure to the processing chemistries and pressures used during processing operations. As illustrated in FIG. 8, the window 850 may be positioned above the substrate heater 822 and may be sealed to the sidewall 849 of the pedestal 804 in order to create a plenum volume within the pedestal that is fluidically isolated from the chamber interior. This plenum volume may also be considered the inside of the bowl 846. The window may be comprised of one or more materials that are optically transparent to the visible light emitted by LEDs, including light having wavelengths in the range of 400 nm to 800 nm. In some embodiments, this material may be quartz, sapphire, quartz with a sapphire coating, or calcium fluoride (CaF). The window may also not have any holes or openings within it. In some embodiments, the heater may have a thickness of 15 to 30 mm, including 20 mm and 25 mm.

As shown in FIG. 8, the pedestal's 804 substrate supports 808 are configured to support the substrate 818 above and offset from the window 850 and the substrate heater 822. In certain embodiments, the temperature of the substrate can be rapidly and precisely controlled by thermally floating, or thermally isolating, the substrate within the chamber. The heating and cooling of a substrate is directed at both the substrate's thermal mass and the thermal masses of other items in contact with the substrate. For instance, if the substrate is in thermal contact with a large body, such as the entirety of the substrate's back side resting on a large surface of a pedestal or electrostatic chuck as in many conventional etching apparatuses, this body acts as a heat sink for the substrate which affects the ability to accurately control the substrate temperature and reduces the quickness of substrate heating and cooling. It is therefore desirable to position the substrate so that the smallest thermal mass is heated and cooled. This thermal floating is configured to position the substrate so that it has minimal thermal contact (which includes direct and radiation) with other bodies in the chamber.

The pedestal 804 is therefore configured, in some embodiments, to support the substrate 818 by thermally floating, or thermally isolating, the substrate within the chamber interior 814. The pedestal's 804 plurality of substrate supports 808 are configured to support the substrate 818 such that the thermal mass of the substrate 818 is reduced as much as possible to the thermal mass of just the substrate 818. Each substrate support 808 may have a substrate support surface 820 that provides minimal contact with the substrate 818. The number of substrate supports 808 may range from at least 3 to, for example, at least 6 or more. The surface area of the support surfaces 820 may also be the minimum area required to adequately support the substrate during processing operations (e.g., in order to support the weight of the substrate and prevent inelastic deformation of the substrate). In some embodiments, the surface area of one support surface 820 may be less than about 0.1%, less than about 0.075%, less than about 0.05%, less than about 0.025%, or less than about 0.01%, for instance.

The substrate supports are also configured to prevent the substrate from being in contact with other elements of the pedestal, including the pedestal's surfaces and features underneath the substrate. The substrate 818 is also offset from the substrate heater 822 (as measured in some instances from a top surface of the substrate heater 822 which may be the top surface of the LEDs 824) by a distance which may affect numerous aspects of heating the substrate 818.

As stated, the substrate supports 808 are configured to support the substrate 818 above the window. In some embodiments, these substrate supports are stationary and fixed in position; they may not be lift pins or a support ring. In some embodiments, at least a part of each substrate support 808 that includes the support surface 820 may be comprised of a material that is transparent at least to light emitted by LEDs 824. This material may be, in some instances, quartz or sapphire. The transparency of these substrate supports 808 may enable the visible light emitted by the substrate heater's 822 LEDs to pass through the substrate support 808 and to the substrate 818 so that the substrate support 808 does not block this light and the substrate 818 can be heated in the areas where it is supported. This may provide a more uniform heating of the substrate 818 than with a substrate support comprising a material opaque to visible light. In some other embodiments, the substrate supports 808 may be comprised of a non-transparent material, such as zirconium dioxide ($ZrO_2$).

Referring back to FIG. 8, in some embodiments, the pedestal is also configured to move vertically. This may include moving the pedestal such that a gap 886 between a faceplate 876 of the gas distribution unit 810 and the substrate 818 is capable of being in a range of 2 mm and 70 mm. As provided in more detail below, moving the pedestal vertically may enable active cooling of the substrate as well as rapid cycling time of processing operations, including flowing gas and purging, due to a low volume created between the gas distribution unit 810 and the substrate 818. This movement may also enable the creation of a small process volume between the substrate and the gas distribution unit which can result in a smaller purge and process volume and thus reduce purge and gas movement times and increase throughput.

The gas distribution unit 810 is configured to flow process gases, which may include liquids and/or gases, such as a reactant, modifying molecules, converting molecules, or removal molecules, onto the substrate 818 in the chamber interior 814. As seen in FIG. 8, the gas distribution unit 810 includes one or more fluid inlets 870 that are fluidically connected to one or more gas sources 872 and/or one or more vapor sources 874. In some embodiments, the gas lines and mixing chamber may be heated to prevent unwanted condensation of the vapors and gases flowing within. These lines may be heated to at least about 40° C., at least about 80° C., at least about 90° C., at least about 120° C., at least about 130° C., or at least about 150° C. The one or more vapor sources may include one or more sources of gas and/or liquid which is vaporized. The vaporizing may be a direct inject vaporizer, a flow over vaporizer, or both. The gas distribution unit 810 also includes the faceplate 876 that includes a plurality of through-holes 878 that fluidically connect the gas distribution unit 810 with the chamber interior 814. These through-holes 878 are fluidically connected to the one or more fluid inlets 870 and also extend through a front surface 877 of the faceplate 876, with the front surface 877 configured to face the substrate 818. In some embodiments, the gas distribution unit 810 may be considered a top plate and in some other embodiments, it may be considered a showerhead.

The through-holes 878 may be configured in various ways in order to deliver uniform gas flow onto the substrate. In some embodiments, these through-holes may all have the same outer diameter, such as between about 0.03 inches and 0.05 inches, including about 0.04 inches (1.016 mm). These faceplate through-holes may also be arranged throughout the faceplate in order to create uniform flow out of the faceplate.

Referring back to FIG. 8, the gas distribution unit 810 may also include a unit heater 880 that is thermally connected to the faceplate 876 such that heat can be transferred between the faceplate 876 and the unit heater 880. The unit heater 880 may include fluid conduits in which a heat transfer fluid may be flowed. Similar to above, the heat transfer fluid may be heated to a temperature range of about 20° C. and 120° C., for example. In some instances, the unit heater 880 may be used to heat the gas distribution unit 810 to prevent unwanted condensation of vapors and gases; in some such instances, this temperature may be at least about 90° C. or 120° C.

In some embodiments, the gas distribution unit 810 may include a second unit heater 882 that is configured to heat the faceplate 876. This second unit heater 882 may include one or more resistive heating elements, fluid conduits for flowing a heating fluid, or both. Using two heaters 880 and 882 in the gas distribution unit 810 may enable various heat transfers within the gas distribution unit 810. This may include using the first and/or second unit heaters 880 and 882 to heat the faceplate 876 in order to provide a temperature-controlled chamber, as described above, in order to reduce or prevent unwanted condensation on elements of the gas distribution unit 810.

The apparatus 800 may also be configured to cool the substrate. This cooling may include flowing a cooling gas onto the substrate, moving the substrate close to the faceplate to allow heat transfer between the substrate and the faceplate, or both. Actively cooling the substrate enables more precise temperature control and faster transitions between temperatures which reduces processing time and improves throughput. In some embodiments, the first unit heater 880 that flows the heat transfer fluid through fluid conduits may be used to cool the substrate 818 by transferring heat away from the faceplate 876 that is transferred from the substrate 819. A substrate 818 may therefore be cooled by positioning it in close proximity to the faceplate 876, such as by a gap 886 of less than or equal to 5 mm or 2 mm, such that the heat in the substrate 818 is radiatively transferred to the faceplate 876, and transferred away from the faceplate 876 by the heat transfer fluid in the first unit heater 880. The faceplate 876 may therefore be considered a heat sink for the substrate 818 in order to cool the substrate 818.

In some embodiments, the apparatus 800 may further include a cooling fluid source 873 which may contain a cooling fluid (a gas or a liquid), and a cooler (not pictured) configured to cool the cooling fluid to a desired temperature, such as less than or equal to at least about 90° C., at least about 70° C., at least about 50° C., at least about 20° C., at least about 10° C., at least about 0° C., at least about −50° C., at least about −100° C., at least about −150° C., at least about −190° C., at least about −200° C., or at least about −250° C., for instance. The apparatus 800 includes piping to deliver the cooling fluid to the one or more fluid inlets 870, and the gas distribution unit 810 which is configured to flow the cooling fluid onto the substrate. In some embodiments, the fluid may be in liquid state when it is flowed to the chamber 802 and may turn to a vapor state when it reaches the chamber interior 814, for example if the chamber interior 814 is at a low pressure state, such as described above, e.g., between about 0.1 Torr and 10 Torr, or between about 0.1 Torr and 100 Torr, or between about 20 Torr and 200 Torr, for instance. The cooling fluid may be an inert element, such as nitrogen, argon, or helium. In some instances, the cooling fluid may include, or may only have, a non-inert element or mixture, such as hydrogen gas. In some embodiments, the flow rate of the cooling fluid into the chamber interior 814 may be at least about 0.25 liters per minute, at least about 0.5 liters per minute, at least about 1 liters per minute, at least about 5 liters per minute, at least about 10 liters per minute, at least about 50 liters per minute, or at least about 100 liters per minute, for example. In certain embodiments, the apparatus may be configured to cool a substrate at one or more cooling rates, such as at least about 5° C./second, at least about 10° C./second, at least about 15° C./second, at least about 20° C./second, at least about 30° C./second, or at least about 40° C./second.

In some embodiments, the apparatus 800 may actively cool the substrate by both moving the substrate close to the faceplate and flowing cooling gas onto the substrate. In some instances, the active cooling may be more effective by flowing the cooling gas while the substrate is in close proximity to the faceplate. The effectiveness of the cooling gas may also be dependent on the type of gas used.

Figure 10:
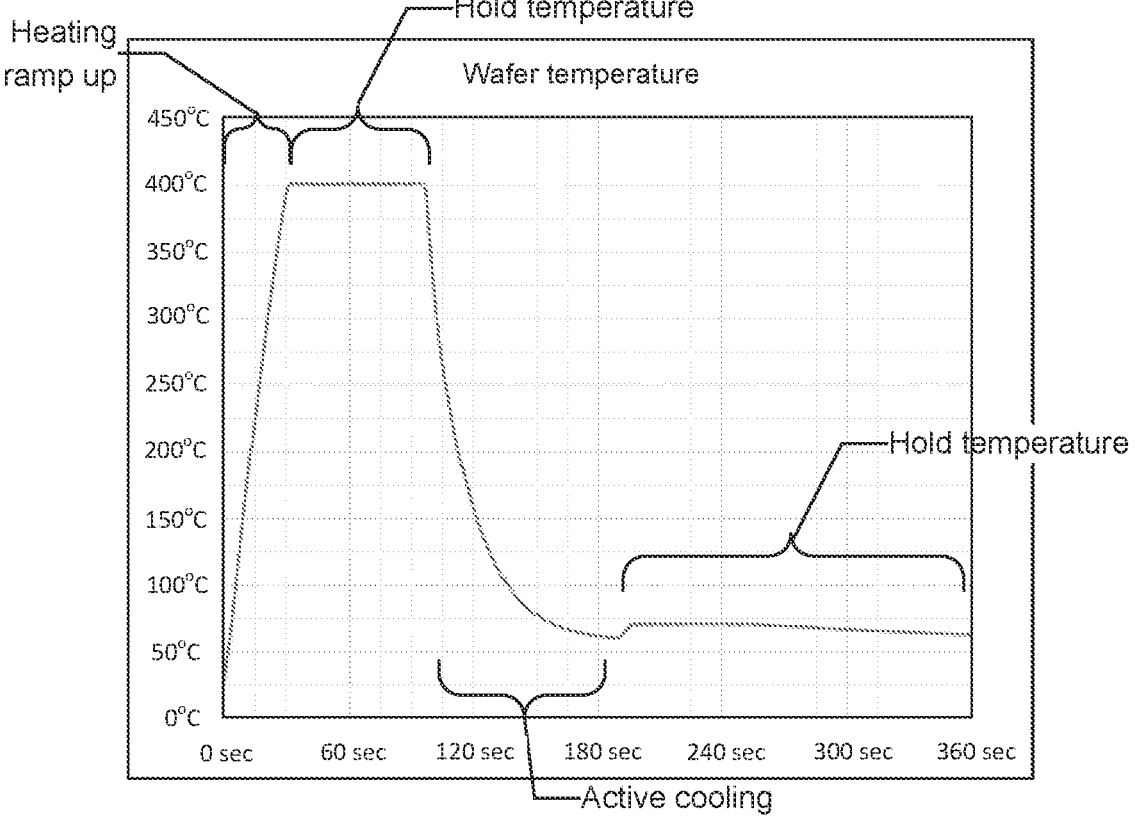
FIG. 10 provides an example temperature control sequence.

The apparatuses provided herein can therefore rapidly heat and cool a substrate. FIG. 10 provides an example temperature control sequence. At time 0, the substrate is at approximately 20 or 25° C., and the LEDs of the substrate heater provided herein emit the visible light having wavelengths between 400 nm and 800 nm and cause the substrate temperature to rise to about 400° C. in approximately 30 seconds. This heating was accomplished using between 1 kW and 2 kW of heating power that is provided by approximately 9 kW of supplied power to the substrate heater. From about 30 seconds to about 95 seconds, the substrate heater 822 held the substrate at 400° C. using less power, such as 0.3 to about 0.5 KW of heating power provided by approximately 2 kW of supplied power. For about 30 to 60 seconds, the substrate was actively cooled using both cooling gas flowed onto the substrate (e.g., hydrogen or helium) and heat transfer to the faceplate. Once cooled, the substrate heater heated the substrate to hold its temperature at approximately 70° C. using between about 10 and 30 W of heating power provided by about 100 W of supplied power. Various processing techniques may use this type of sequence, either once or repeatedly, for processing a substrate.

In some embodiments, the apparatus 800 may include a mixing plenum for blending and/or conditioning process gases for delivery before reaching the fluid inlets 870. One or more mixing plenum inlet valves may control introduction of process gases to the mixing plenum. In some other embodiments, the gas distribution unit 810 may include one or more mixing plenums within the gas distribution unit 810. The gas distribution unit 810 may also include one or more annular flow paths fluidically connected to the through-holes 878 which may equally distribute the received fluid to the through-holes 878 in order to provide uniform flow onto the substrate.

Apparatus 800 includes a controller 831 (which may include one or more physical or logical controllers) that is communicatively connected with and that controls some or all of the operations of a processing chamber, and is able to perform any of the processes described herein. The system controller 831 may include one or more memory devices 833 and one or more processors 835. In some embodiments, the apparatus includes a switching system for controlling flow rates and durations, the substrate heating unit, the substrate cooling unit, the loading and unloading of a substrate in the chamber, the thermal floating of the substrate, and the process gas unit, for instance, when disclosed embodiments are performed. In some embodiments, the apparatus may have a switching time of up to about 500 ms, or up to about 750 ms. Switching time may depend on the flow chemistry, recipe chosen, reactor architecture, and other factors.

Figure 11A:
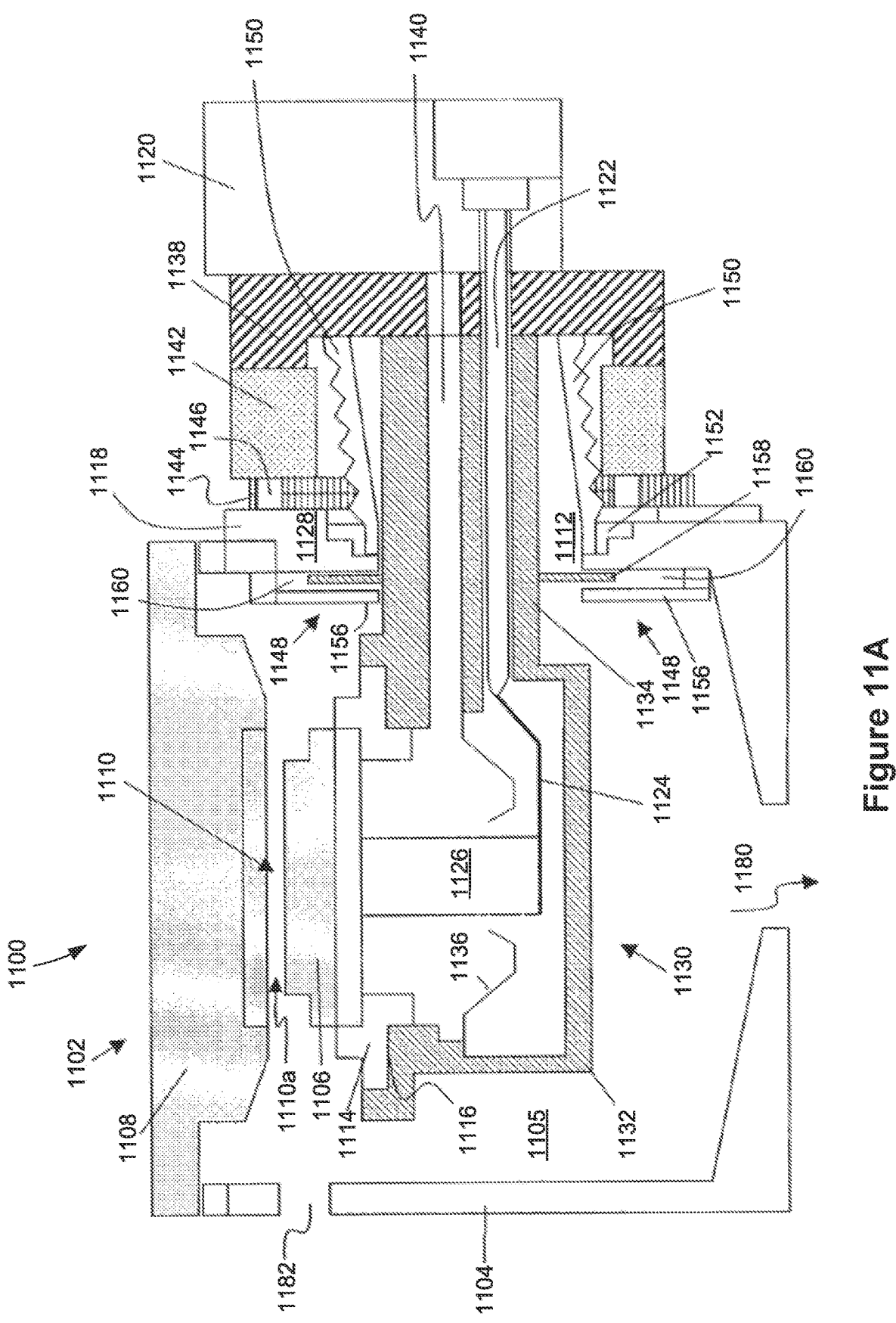
FIGS. 11A-11C illustrate an embodiment of an adjustable gap capacitively coupled confined RF plasma reactor that may be used for performing the etching operations described herein.
Figure 11B:
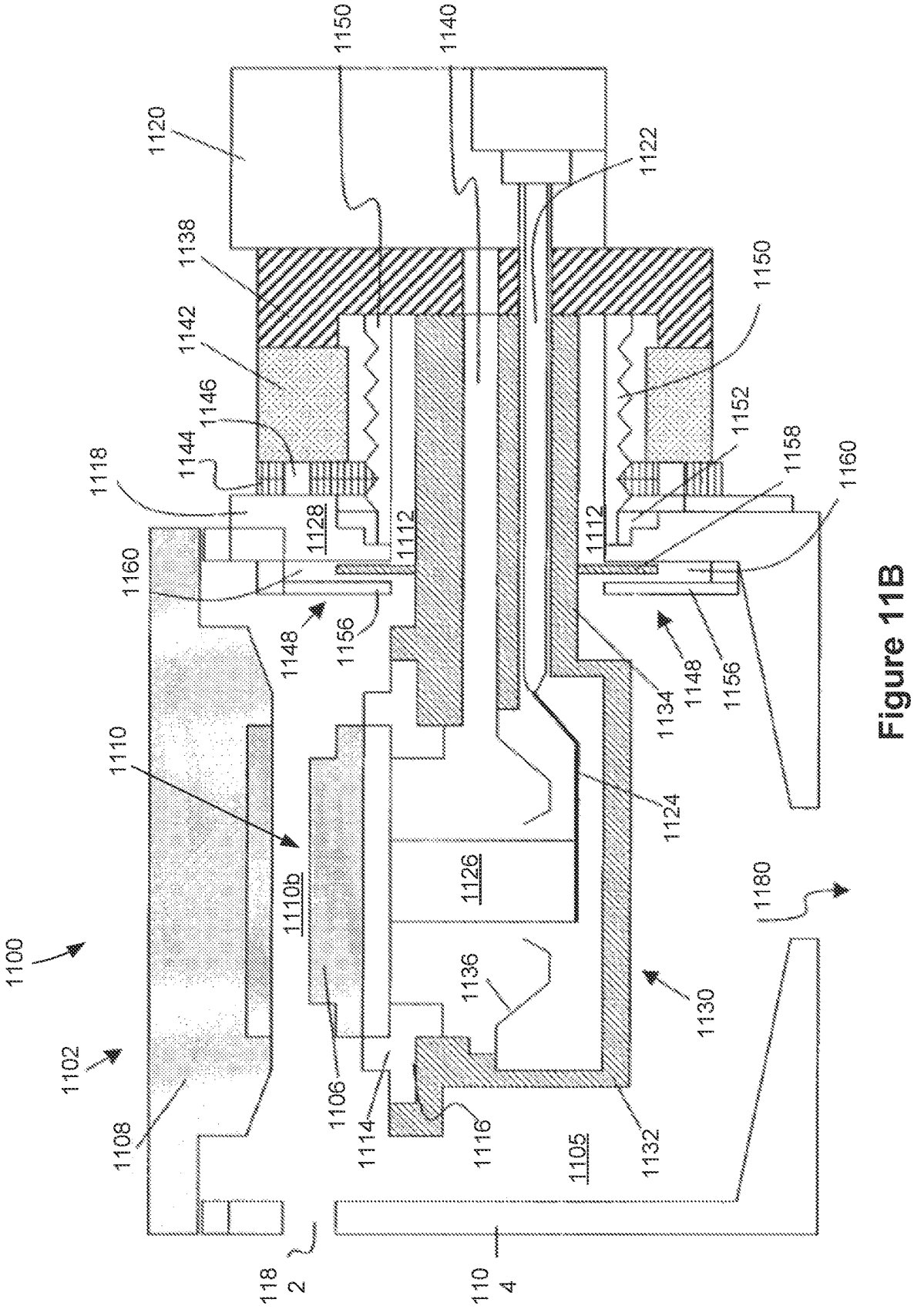
Figure 11C:
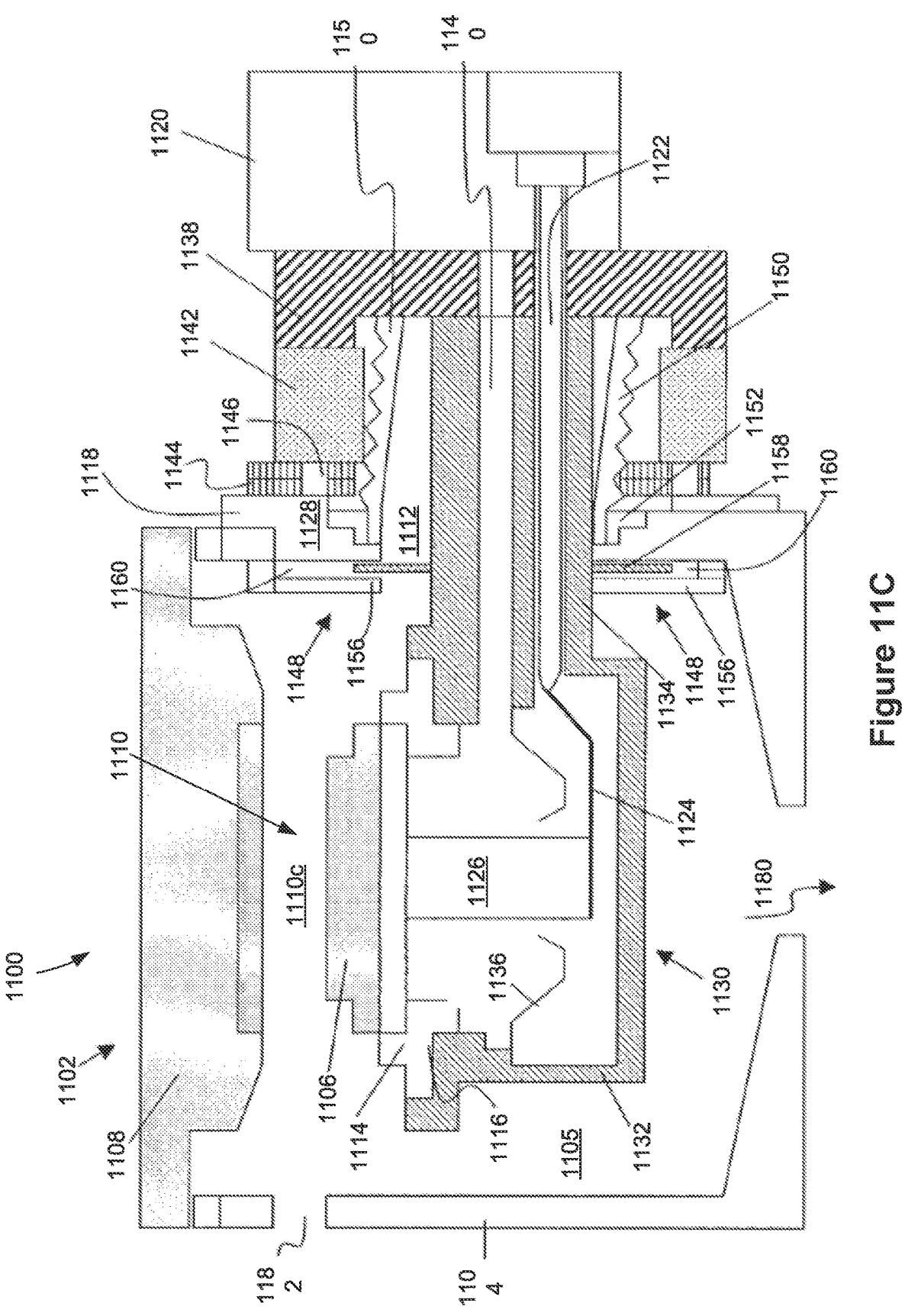

FIGS. 11A-11C illustrate an embodiment of an adjustable gap capacitively coupled confined RF plasma reactor 1100 that may be used for performing the etching operations described herein. As depicted, a vacuum chamber 1102 includes a chamber housing 1104, surrounding an interior space housing a lower electrode 1106. In an upper portion of the chamber 1102 an upper electrode 1108 is vertically spaced apart from the lower electrode 1106. Planar surfaces of the upper and lower electrodes 1108, 1106 are substantially parallel and orthogonal to the vertical direction between the electrodes. Preferably the upper and lower electrodes 1108, 1106 are circular and coaxial with respect to a vertical axis. A lower surface of the upper electrode 1108 faces an upper surface of the lower electrode 1106. The spaced apart facing electrode surfaces define an adjustable gap 1110 therebetween. During operation, the lower electrode 1106 is supplied RF power by an RF power supply (match) 1120. RF power is supplied to the lower electrode 1106 though an RF supply conduit 1122, an RF strap 1124 and an RF power member 1126. A grounding shield 1136 may surround the RF power member 1126 to provide a more uniform RF field to the lower electrode 1106. As described in commonly-owned U.S. Pat. No. 7,732,728, the entire contents of which are herein incorporated by reference, a wafer is inserted through wafer port 1182 and supported in the gap 1110 on the lower electrode 1106 for processing, a process gas is supplied to the gap 1110 and excited into plasma state by the RF power. The upper electrode 1108 can be powered or grounded.

In the embodiment shown in FIGS. 11A-11C, the lower electrode 1106 is supported on a lower electrode support plate 1116. An insulator ring 1114 interposed between the lower electrode 1106 and the lower electrode support plate 1116 insulates the lower electrode 1106 from the support plate 1116.

An RF bias housing 1130 supports the lower electrode 1106 on an RF bias housing bowl 1132. The bowl 1132 is connected through an opening in a chamber wall plate 1118 to a conduit support plate 1138 by an arm 1134 of the RF bias housing 1130. In a preferred embodiment, the RF bias housing bowl 1132 and RF bias housing arm 1134 are integrally formed as one component, however, the arm 1134 and bowl 1132 can also be two separate components bolted or joined together.

The RF bias housing arm 1134 includes one or more hollow passages for passing RF power and facilities, such as gas coolant, liquid coolant, RF energy, cables for lift pin control, electrical monitoring and actuating signals from outside the vacuum chamber 1102 to inside the vacuum chamber 1102 at a space on the backside of the lower electrode 1106. The RF supply conduit 1122 is insulated from the RF bias housing arm 1134, the RF bias housing arm 1134 providing a return path for RF power to the RF power supply 1120. A facilities conduit 1140 provides a passageway for facility components. Further details of the facility components are described in U.S. Pat. Nos. 5,948,704 and 7,732,728 and are not shown here for simplicity of description. The gap 1110 is preferably surrounded by a confinement ring assembly or shroud (not shown), details of which can be found in commonly owned published U.S. Pat. No. 7,740,736 herein incorporated by reference. The interior of the vacuum chamber 1102 is maintained at a low pressure by connection to a vacuum pump through vacuum portal 1180.

The conduit support plate 1138 is attached to an actuation mechanism 1142. The actuation mechanism 1142, such as a servo mechanical motor, stepper motor or the like is attached to a vertical linear bearing 1144, for example, by a screw gear 1146 such as a ball screw and motor for rotating the ball screw. During operation to adjust the size of the gap 1110, the actuation mechanism 1142 travels along the vertical linear bearing 1144. FIG. 11A illustrates the arrangement when the actuation mechanism 1142 is at a high position on the linear bearing 1144 resulting in a small gap 1110 *a*. FIG. 11B illustrates the arrangement when the actuation mechanism 1142 is at a mid position on the linear bearing 1144. As shown, the lower electrode 1106, the RF bias housing 1130, the conduit support plate 1138, the RF power supply 1120 have all moved lower with respect to the chamber housing 1104 and the upper electrode 1108, resulting in a medium size gap 1110 *b*.

FIG. 11C illustrates a large gap 1110 *c* when the actuation mechanism 1142 is at a low position on the linear bearing. Preferably, the upper and lower electrodes 1108, 1106 remain co-axial during the gap adjustment and the facing surfaces of the upper and lower electrodes across the gap remain parallel.

This embodiment allows the gap 1110 between the lower and upper electrodes 1106, 1108 in the CCP chamber 1102 during multi-step process recipes (BARC, HARC, and STRIP etc.) to be adjusted, for example, in order to maintain uniform etch across a large diameter substrate such as 300 mm wafers or flat panel displays. In particular, this chamber pertains to a mechanical arrangement that permits the linear motion necessary to provide the adjustable gap between lower and upper electrodes 1106, 1108.

FIG. 11A illustrates laterally deflected bellows 1150 sealed at a proximate end to the conduit support plate 1138 and at a distal end to a stepped flange 1128 of chamber wall plate 1118. The inner diameter of the stepped flange defines an opening 1112 in the chamber wall plate 1118 through which the RF bias housing arm 1134 passes. The distal end of the bellows 1150 is clamped by a clamp ring 1152.

The laterally deflected bellows 1150 provides a vacuum seal while allowing vertical movement of the RF bias housing 1130, conduit support plate 1138 and actuation mechanism 1142. The RF bias housing 1130, conduit support plate 1138 and actuation mechanism 1142 can be referred to as a cantilever assembly. Preferably, the RF power supply 1120 moves with the cantilever assembly and can be attached to the conduit support plate 1138. FIG. 11B shows the bellows 1150 in a neutral position when the cantilever assembly is at a mid position. FIG. 11C shows the bellows 1150 laterally deflected when the cantilever assembly is at a low position.

A labyrinth seal 1148 provides a particle barrier between the bellows 1150 and the interior of the plasma processing chamber housing 1104. A fixed shield 1156 is immovably attached to the inside inner wall of the chamber housing 1104 at the chamber wall plate 1118 so as to provide a labyrinth groove 1160 (slot) in which a movable shield plate 1158 moves vertically to accommodate vertical movement of the cantilever assembly. The outer portion of the movable shield plate 1158 remains in the slot at all vertical positions of the lower electrode 1106.

In the embodiment shown, the labyrinth seal 1148 includes a fixed shield 1156 attached to an inner surface of the chamber wall plate 1118 at a periphery of the opening 1112 in the chamber wall plate 1118 defining a labyrinth groove 1160. The movable shield plate 1158 is attached and extends radially from the RF bias housing arm 1134 where the arm 1134 passes through the opening 1112 in the chamber wall plate 1118. The movable shield plate 1158 extends into the labyrinth groove 1160 while spaced apart from the fixed shield 1156 by a first gap and spaced apart from the interior surface of the chamber wall plate 1118 by a second gap allowing the cantilevered assembly to move vertically. The labyrinth seal 1148 blocks migration of particles spalled from the bellows 1150 from entering the vacuum chamber interior 1105 and blocks radicals from process gas plasma from migrating to the bellows 1150 where the radicals can form deposits which are subsequently spalled.

FIG. 11A shows the movable shield plate 1158 at a higher position in the labyrinth groove 1160 above the RF bias housing arm 1134 when the cantilevered assembly is in a high position (small gap 1110 *a*). FIG. 11C shows the movable shield plate 1158 at a lower position in the labyrinth groove 1160 above the RF bias housing arm 1134 when the cantilevered assembly is in a low position (large gap 1110 *c*). FIG. 11B shows the movable shield plate 1158 in a neutral or mid position within the labyrinth groove 1160 when the cantilevered assembly is in a mid position (medium gap 1110 *b*). While the labyrinth seal 1148 is shown as symmetrical about the RF bias housing arm 1134, in other embodiments the labyrinth seal 1148 may be asymmetrical about the RF bias arm 1134.

Figure 12:
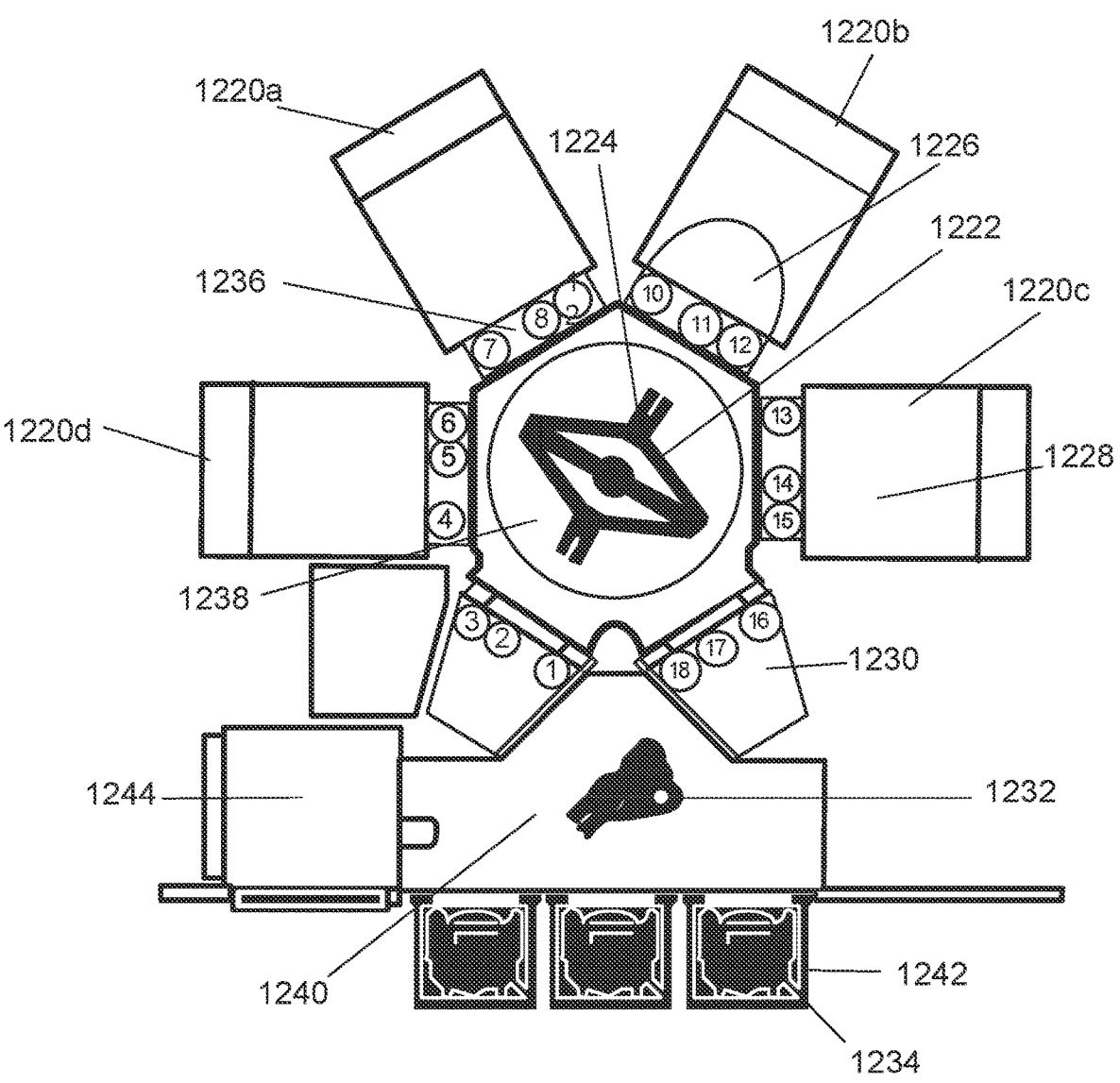
FIG. 12 depicts a semiconductor process cluster architecture with various modules that interface with a vacuum transfer module.

FIG. 12 depicts a semiconductor process cluster architecture with various modules that interface with a vacuum transfer module 1238 (VTM). The arrangement of transfer modules to "transfer" substrates among multiple storage facilities and processing modules may be referred to as a "cluster tool architecture" system. Airlock 1230, also known as a loadlock or transfer module, is shown in VTM 1238 with four processing modules 1220a-1220d, which may be individually optimized to perform various fabrication processes. By way of example, processing modules 1220a-

1220*d* may be implemented to perform substrate etching, deposition, ion implantation, substrate cleaning, sputtering, and/or other semiconductor processes as well as laser metrology and other defect detection and defect identification methods. One or more of the processing modules (any of 1220a-1220d) may be implemented as disclosed herein, i.e., for etching recessed features into substrates. Airlock 1230 and process modules 1220a-1220d may be referred to as "stations." Each station has a facet 1236 that interfaces the station to VTM 1238. Inside the facets, sensors 1-18 are used to detect the passing of substrate 1226 when moved between respective stations.

Robot 1222 transfers substrates between stations. In one implementation, the robot may have one arm, and in another implementation, the robot may have two arms, where each arm has an end effector 1224 to pick substrates for transport. Front-end robot 1232, in atmospheric transfer module (ATM) 1240, may be used to transfer substrates from cassette or Front Opening Unified Pod (FOUP) 1234 in Load Port Module (LPM) 1242 to airlock 1230. Module center 1228 inside process modules 1220a-1220d may be one location for placing the substrate. Aligner 1244 in ATM 1240 may be used to align substrates.

In an exemplary processing method, a substrate is placed in one of the FOUPs 1234 in the LPM 1242. Front-end robot 1232 transfers the substrate from the FOUP 1234 to the aligner 1244, which allows the substrate 1226 to be properly centered before it is etched, or deposited upon, or otherwise processed. After being aligned, the substrate is moved by the front-end robot 1232 into an airlock 1230. Because airlock modules have the ability to match the environment between an ATM and a VTM, the substrate is able to move between the two pressure environments without being damaged. From the airlock module 1230, the substrate is moved by robot 1222 through VTM 1238 and into one of the process modules 1220a-1220d, for example process module 1220a. In order to achieve this substrate movement, the robot 1222 uses end effectors 1224 on each of its arms. In process module 1220a, the substrate undergoes etching as described. Next, the robot 1222 moves the substrate out of processing module 1220a to its next desired position.

It should be noted that the computer controlling the substrate movement can be local to the cluster architecture, or can be located external to the cluster architecture in the manufacturing floor, or in a remote location and connected to the cluster architecture via a network.

Figure 15:
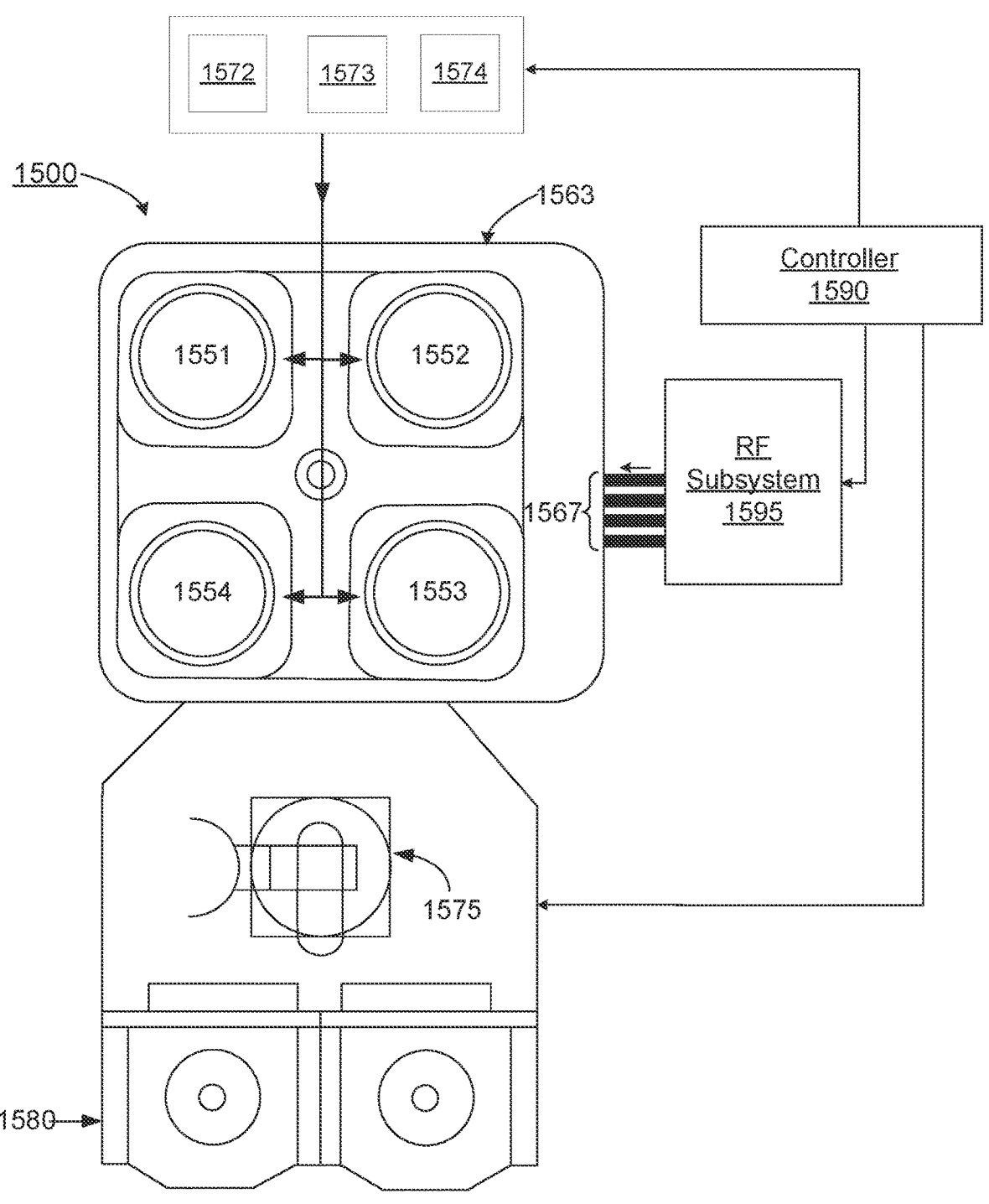
FIG. 15 depicts a schematic view of an embodiment of a multi-station processing tool.

It may be appreciated that a plurality of process stations may be included in a multi-station processing tool environment, such as shown in FIG. 15, which depicts a schematic view of an embodiment of a multi-station processing tool. Processing apparatus 1500 employs an integrated circuit fabrication chamber 1563 that includes multiple fabrication process stations, each of which may be used to perform processing operations on a substrate held in a wafer holder, such as a pedestal, at a particular process station. These processing operations include any of the etching described herein. In the embodiment of FIG. 15, the integrated circuit fabrication chamber 1563 is shown having four process stations 1551, 1552, 1553, and 1554. Each process station may be one of the processing stations described above, including with respect to FIGS. 7-10 configured to perform the etching described herein. Other similar multi-station processing apparatuses may have more or fewer process stations depending on the implementation and, for example, a desired level of parallel wafer processing, size/space constraints, cost constraints, etc. It will be appreciated that any suitable wafer handling system may be employed.

Non-limiting examples include wafer carousels and wafer handling robots. Shown in FIG. 15 is substrate handler robot 1575, which may operate under the control of system controller 1590, configured to move substrates from a wafer cassette (not shown in FIG. 15) from loading port 1580 and into integrated circuit fabrication chamber 1563, and onto one of process stations 1551, 1552, 1553, and 1554. The system controller 1590 may be any of the controller described herein and may be configured to implement any of the techniques provided herein.

Apparatus 1500 also may include RF subsystem 1595 that may generate and convey RF power to integrated circuit fabrication chamber 1563 via radio frequency input ports 1567. In particular embodiments, integrated circuit fabrication chamber 1563 may comprise input ports in addition to radio frequency input ports 1567 (additional input ports not shown in FIG. 15). Accordingly, integrated circuit fabrication chamber 1563 may utilize 8 RF input ports. In particular embodiments, process stations 1551-1554 of integrated circuit fabrication chamber 1563 may each utilize first and second input ports in which a first input port may convey a signal having a first frequency and in which a second input port may convey a signal having a second frequency. Use of dual frequencies may bring about enhanced plasma characteristics.

Apparatus 1500 also includes one or more gas sources 1572, one or more vapor sources 1574, and/or one or more cooling gas sources 1573 that are fluidically connected to each of the process stations 1551, 1552, 1553, and 1554. Each station also may have a heated pedestal, and gas line inlets; each station may also be configured to heat a wafer at that station as described herein. It will be appreciated that in some embodiments, each process station may have different or multiple purposes. For example, in some embodiments, a process station may be switchable between a plasma-assisted etching process and a thermal etching process. Additionally or alternatively, in some embodiments, processing chamber 1563 may include one or more matched pairs of ALE process stations.

Results

Figures 13, 14:
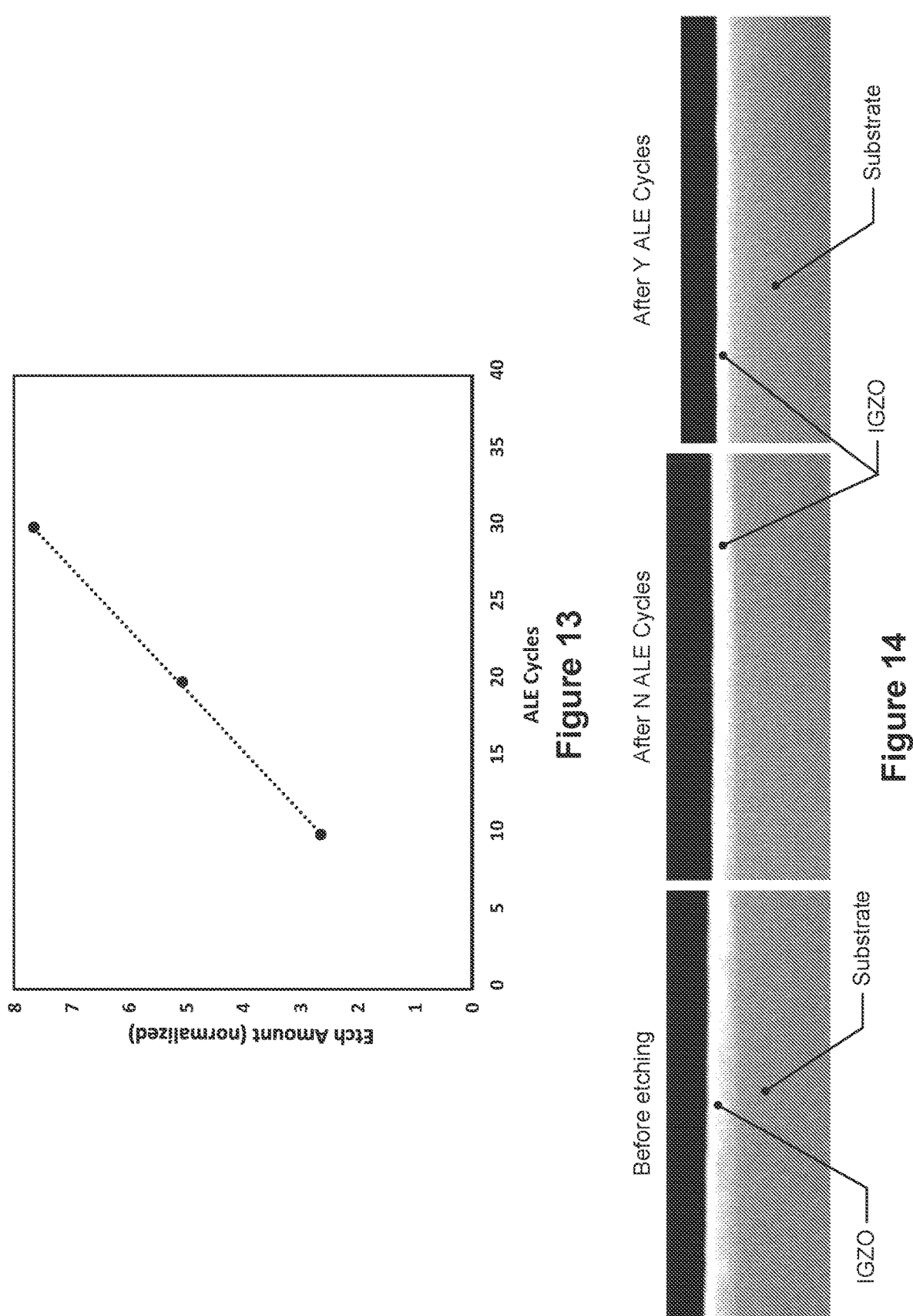
FIG. 13 depicts a graph of experimental results for etching indium gallium zinc oxide.
FIG. 14 depicts cross-sectional side views of a substrate after two ALE etching procedures of indium gallium zinc oxide according to the disclosed embodiments.

Using the techniques provided herein results in etching IGZO with low nonuniformity and in some instances, a linear relationship between numbers of ALE cyclers performed and amount of IGZO etched, among other advantages. FIG. 13 depicts a graph of experimental results for etching IGZO. Here, the IGZO thickness was measured (and is normalized on the γ-axis) after performing 10 ALE cycles, 20 ALE cycles, and 30 ALE cycles (on the x-axis). Each ALE cycle was performed according to FIGS. 2 and 3 with the modification and removal operations as separate operations. As can be seen, etching IGZO according to the ALE etching provided here in results in a linear relationship between number of cycles and amount of IGZO removed. This linear relationship is advantageous because the IGZO is removed in a uniform and thus easily predictable manner.

FIG. 14 depicts cross-sectional side views of a substrate after two ALE etching procedures of IGZO according to the disclosed embodiments. Here, similar to FIG. 13, the IGZO thickness was imaged measured after performing N ALE cycles and Y ALE cycles according to FIGS. 2 and 3 with the modification and removal operations as separate operations. The substrate is the gray material and the IGZO deposited thereon is the white material. In the first image on the left, no etching has been performed. The middle image is the IGZO material after N ALE cycles, and the image on the right is the IGZO material after Y ALE cycles. As can be seen, the IGZO material advantageously remains uniform, i.e., with a low nonuniformity, after performing both N ALE cycles and Y ALE cycles.

While the subject matter disclosed herein has been particularly described with respect to the illustrated embodiments, it will be appreciated that various alterations, modifications and adaptations may be made based on the present disclosure, and are intended to be within the scope of the present invention. It is to be understood that the description is not limited to the disclosed embodiments but, on the contrary, is intended to cover various modifications and equivalent arrangements included within the scope of the claims.

What is claimed is:

1. A method comprising:
   providing a wafer to a processing chamber, the wafer having a layer of indium gallium zinc oxide;
   heating the wafer to a first temperature; and
   etching the layer of indium gallium zinc oxide by modifying a surface of the layer of indium gallium zinc oxide by flowing a first chemical species comprising a fluoride onto the wafer to create a layer of indium gallium zinc oxyfluoride while the wafer is at the first temperature, and removing the layer of indium gallium zinc oxyfluoride by flowing a second chemical species comprising an alkyl aluminum halide, an aluminum alkalide, an organoaluminium compound, a diketone, silicon halide, silane, halogenated silane, or alkyl silicon halide, onto the wafer,
   wherein the modifying includes using a plasma and the removing does not use plasma,
   wherein the plasma is a remote plasma,
   wherein the modifying occurs while the wafer is maintained at the first temperature, and
   wherein the removing occurs while the wafer is maintained at a second temperature different than the first temperature.

2. The method of claim 1, wherein:
   the modifying includes flowing a first process gas comprising the first chemical species, and
   the removing includes flowing a second process gas comprising the second chemical species.

3. The method of claim 2, wherein flowing the first process gas onto the wafer at least partially overlaps with flowing the second process gas onto the wafer.

4. The method of claim 2, wherein flowing the first process gas does not overlap with flowing the second process gas onto the wafer.

5. The method of claim 4, wherein the etching further includes:
   stopping the flow of the first process gas,
   flowing, after stopping the flow of the first process gas, a purge gas onto the onto the wafer, and
   starting the flow of the second process gas during or after the flowing of the purge gas.

6. The method of claim 5, wherein the etching further includes starting the flow of the purge gas before, during, or after the stopping of the first process gas.

7. The method of claim 2, wherein flowing the first process gas and flowing the second process gas are both performed for substantially the same time period.

8. The method of claim 1, wherein the etching includes flowing a process gas comprising both the first chemical species and the second chemical species onto the wafer.

9. The method of claim 1, wherein the modifying and the removing occur while the wafer is maintained at substantially the same temperature.

10. The method of claim 1, further comprising heating, after the modifying, the wafer from the first temperature to the second temperature that is greater than the first temperature.

11. The method of claim 1, further comprising cooling, after the modifying, the wafer from the first temperature to the second temperature that is less than the first temperature.

12. The method of claim 1, wherein the modifying occurs while the wafer is changed from the first temperature to a second temperature different than the first temperature.

13. The method of claim 1, wherein the removing occurs while the wafer is changed from the first temperature to a second temperature different than the first temperature.

14. The method of claim 1, wherein the modifying and the removing occur while the processing chamber is maintained at substantially the same pressure.

15. The method of claim 1, wherein the modifying occurs while the processing chamber pressure is changed from a first pressure to a second pressure different than the first pressure.

16. The method of claim 1, wherein the removing occurs while the processing chamber pressure is changed from a first pressure to a second pressure different than the first pressure.

17. The method of claim 1, wherein the first chemical species comprises one of: a hydrogen fluoride, a sulfur fluoride, a nitrogen fluoride, and a xenon fluoride.

18. The method of claim 1, wherein the second chemical species is selected from the group consisting of: dimethyl-aluminum chloride, trimethylaluminum, diethyl-aluminum chloride, Tin(II) acetylacetonate, hexafluoroacetylacetone, and acetylacetone.

19. The method of claim 1, wherein the second chemical species is selected from the group consisting of: silicon tetrachloride ($SiCl_4$), dimethyldichlorosilane ($SiCl_2(CH_3)_2$), trimethylchlorosilane ($SiCl(CH_3)_3$), dichlorosilane ($SiH_2Cl_2$), dimethylchlorosilane ($SiHCl(CH_3)_2$), and tetramethylsilane ($Si(CH_3)_4$), and other combinations of Cl, H and $CH_3$ ligands bonded to Si.

20. The method of claim 1, wherein:
   after the etching, indium and gallium remain on a surface of the wafer, and
   the method further comprises preferentially removing, after the etching, the indium and gallium that remain on the surface of the wafer.

21. The method of claim 1, further comprising heating, during the etching, one or more of: sidewalls of the processing chamber, a gas dispersion device in the processing chamber, or gas delivery lines fluidically connected to the gas dispersion device to a second temperature above at least about 40° C.

22. A method comprising:
   providing a wafer to a processing chamber, the wafer having a layer of indium gallium zinc oxide;
   heating the wafer to a first temperature; and
   etching the layer of indium gallium zinc oxide by modifying a surface of the layer of indium gallium zinc oxide by flowing a first chemical species comprising a fluoride onto the wafer to create a layer of indium gallium zinc oxyfluoride while the wafer is at the first temperature, and removing the layer of indium gallium zinc oxyfluoride by flowing a second chemical species comprising an alkyl aluminum halide, an aluminum alkalide, an organoaluminium compound, a diketone, silicon halide, silane, halogenated silane, or alkyl silicon halide, onto the wafer, wherein:
   the modifying includes flowing a first process gas comprising the first chemical species,
   the removing includes flowing a second process gas comprising the second chemical species,
   flowing the first process gas is performed for a first time period, and
   flowing the second process gas is performed for a second time period different than the first time period.

23. A method comprising:
   providing a wafer to a processing chamber, the wafer having a layer of indium gallium zinc oxide;
   heating the wafer to a first temperature; and
   etching the layer of indium gallium zinc oxide by modifying a surface of the layer of indium gallium zinc oxide by flowing a first chemical species comprising a fluoride onto the wafer to create a layer of indium gallium zinc oxyfluoride while the wafer is at the first temperature, and removing the layer of indium gallium zinc oxyfluoride by flowing a second chemical species comprising an alkyl aluminum halide, an aluminum alkalide, an organoaluminium compound, a diketone, silicon halide, silane, halogenated silane, or alkyl silicon halide, onto the wafer, wherein:
   the modifying occurs while the processing chamber is maintained at a first pressure, and
   the removing occurs while the processing chamber is maintained at a second pressure different than the first pressure.

* * * * *